(12) United States Patent
Shimizu

(10) Patent No.: US 8,129,494 B2
(45) Date of Patent: Mar. 6, 2012

(54) RESIN COMPOSITION FOR PRINTING PLATE

(75) Inventor: Katsuya Shimizu, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 60 days.

(21) Appl. No.: 12/521,277

(22) PCT Filed: Dec. 21, 2007

(86) PCT No.: PCT/JP2007/074709
§ 371 (c)(1),
(2), (4) Date: Jun. 25, 2009

(87) PCT Pub. No.: WO2008/078699
PCT Pub. Date: Jul. 3, 2008

(65) Prior Publication Data
US 2010/0093119 A1    Apr. 15, 2010

(30) Foreign Application Priority Data

| Dec. 26, 2006 | (JP) | 2006-350348 |
| Mar. 5, 2007 | (JP) | 2007-054844 |
| May 15, 2007 | (JP) | 2007-129382 |
| May 15, 2007 | (JP) | 2007-129387 |
| May 15, 2007 | (JP) | 2007-129691 |
| May 15, 2007 | (JP) | 2007-129698 |
| Sep. 10, 2007 | (JP) | 2007-234510 |

(51) Int. Cl.
*C08G 64/00* (2006.01)
*C08G 63/02* (2006.01)

(52) U.S. Cl. ............ 528/196; 257/E21.09; 257/51.027; 438/39; 528/198

(58) Field of Classification Search ............. 257/E21.09, 257/E51.027; 438/39; 528/196, 198
See application file for complete search history.

(56) References Cited

U.S. PATENT DOCUMENTS

| 4,123,269 A | 10/1978 | Von Hoene et al. |
| 4,141,729 A | 2/1979 | Okazaki et al. |
| 4,297,426 A | 10/1981 | Sakai et al. |
| 4,338,388 A | 7/1982 | Sakai et al. |
| 4,387,147 A | 6/1983 | Sakai |
| 4,451,545 A | 5/1984 | Hashimoto et al. |
| 4,806,443 A | 2/1989 | Yamus et al. |
| 4,855,377 A | 8/1989 | Yokota et al. |
| 4,859,556 A | 8/1989 | Sasaki |
| 4,927,803 A | 5/1990 | Bailey et al. |
| 5,137,935 A | 8/1992 | Bott et al. |
| 5,219,692 A | 6/1993 | Shimada et al. |
| 5,276,132 A | 1/1994 | Nishikawa et al. |
| 5,288,839 A | 2/1994 | Greco |
| 5,428,090 A | 6/1995 | Ogawa et al. |
| 5,486,439 A | 1/1996 | Sakakibara et al. |
| 5,506,331 A | 4/1996 | Nagao et al. |
| 5,639,581 A | 6/1997 | Iwasaki et al. |
| 5,654,119 A | 8/1997 | Ishii et al. |
| 5,716,757 A | 2/1998 | Sakata |
| 5,723,243 A | 3/1998 | Sasaki et al. |
| 5,759,725 A | 6/1998 | Hirao et al. |
| 5,789,128 A | 8/1998 | Adachi et al. |
| 5,798,019 A | 8/1998 | Cushner et al. |
| 5,880,799 A | 3/1999 | Inoue et al. |
| 5,936,259 A | 8/1999 | Katz |
| 6,018,014 A | 1/2000 | Nagai et al. |
| 6,180,956 B1 | 1/2001 | Chondroudis et al. |
| 6,191,249 B1 | 2/2001 | Tanaka et al. |
| 6,316,577 B1 | 11/2001 | Shimada et al. |
| 6,383,769 B1 | 5/2002 | Tsusaki et al. |
| 6,582,504 B1 | 6/2003 | Fujita |
| 7,029,825 B2 * | 4/2006 | Yokota et al. ............. 430/281.1 |
| 2004/0152799 A1 | 8/2004 | Miller et al. |
| 2004/0157162 A1 | 8/2004 | Yokota et al. |
| 2006/0154082 A1 | 7/2006 | Miller et al. |
| 2007/0031587 A1 | 2/2007 | Takeshita et al. |
| 2008/0146766 A1 | 6/2008 | Masubuchi et al. |

FOREIGN PATENT DOCUMENTS

| CN | 1522203 A | 8/2004 |
| EP | 0 921 579 A2 | 6/1999 |
| EP | 1 424 210 A1 | 6/2004 |
| EP | 1 801 145 A1 | 6/2007 |
| GB | 2 055 803 A | 3/1981 |
| JP | S 51-094829 A | 8/1976 |

(Continued)

OTHER PUBLICATIONS

J. Nakamura et al, Organic. Thin-Film Solar Cell-Utilization of Donor-Acceptor Interaction-, Material Stage, vol. 2, No. 9, pp. 37-42 (2002). A. Konno, "Present and Future of Organic Solar Cell," Oyo Buturi (a monthly publication of the Japan Society of Applied Physics), vol. 71, No. 4, pp. 425-428 (202).

(Continued)

*Primary Examiner* — Terressa M Boykin
(74) *Attorney, Agent, or Firm* — Finnegan, Henderson, Farabow, Garrett & Dunner, LLP

(57) ABSTRACT

Disclosed is a polymer having excellent solvent resistance which can be produced by using a polycarbonate diol having a repeating unit represented by the formula (1) and/or (2), having a hydroxyl group at both termini, and having a number average molecular weight of from 300 to 50,000:

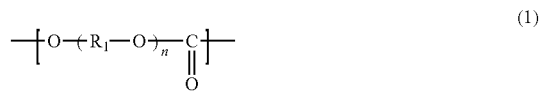

(1)

wherein $R_1$ represents a linear or branched hydrocarbon group having 2 to 50 carbon atoms; and n represents an integer of 2 to 50,

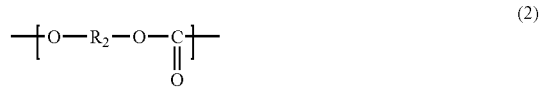

(2)

wherein $R_2$ represents a linear or branched hydrocarbon group having 10 to 50 carbon atoms.

29 Claims, No Drawings

FOREIGN PATENT DOCUMENTS

| | | |
|---|---|---|
| JP | 52-139065 A | 11/1977 |
| JP | S 52-139065 A | 11/1977 |
| JP | S 52-139066 A | 11/1977 |
| JP | S 55-052063 A | 4/1980 |
| JP | S 55-134807 A | 10/1980 |
| JP | S 55-154955 A | 12/1980 |
| JP | S 55-156954 A | 12/1980 |
| JP | S 56-029245 A | 3/1981 |
| JP | S 56-081850 A | 7/1981 |
| JP | S 58-058552 A | 4/1983 |
| JP | S 58-032372 B | 7/1983 |
| JP | S 58-198043 A | 11/1983 |
| JP | S60-081246 A | 5/1985 |
| JP | S 60-129707 A | 7/1985 |
| JP | S 60-237441 A | 11/1985 |
| JP | S 61-105505 A | 5/1986 |
| JP | S 64-009964 A | 1/1989 |
| JP | 2-301487 | 12/1990 |
| JP | H 03-285960 A | 12/1991 |
| JP | H 04-011627 A | 1/1992 |
| JP | 4-239023 A1 | 8/1992 |
| JP | H 04-214720 A | 8/1992 |
| JP | H 04-316543 A | 11/1992 |
| JP | H 05-021823 A | 1/1993 |
| JP | H 05-029648 B | 5/1993 |
| JP | H 05-203953 A | 8/1993 |
| JP | H 05-216044 A | 8/1993 |
| JP | H 05-060565 B | 9/1993 |
| JP | H 05-239202 A | 9/1993 |
| JP | H 05-310904 A | 11/1993 |
| JP | H 06-123922 A | 5/1994 |
| JP | H06-123992 A | 5/1994 |
| JP | H 06-186551 A | 7/1994 |
| JP | H 07-056374 A | 3/1995 |
| JP | H 07-199503 A | 8/1995 |
| JP | H 08-062864 A | 3/1996 |
| JP | 8-92342 A1 | 4/1996 |
| JP | H 08-176293 A | 7/1996 |
| JP | H 08-190209 A | 7/1996 |
| JP | 2552391 B | 8/1996 |
| JP | H 08-208820 A | 8/1996 |
| JP | H 07-239548 A | 9/1996 |
| JP | H 08-328249 A | 12/1996 |
| JP | 2600338 B | 1/1997 |
| JP | H 09-080223 A | 3/1997 |
| JP | H 09-080772 A | 3/1997 |
| JP | H 09-080783 A | 3/1997 |
| JP | H 09-080784 A | 3/1997 |
| JP | H 09-127713 A | 5/1997 |
| JP | H 09-169060 A | 6/1997 |
| JP | H 09-211877 A | 8/1997 |
| JP | H 09-222740 A | 8/1997 |
| JP | H 09-265197 A | 10/1997 |
| JP | H 09-265201 A | 10/1997 |
| JP | H 09-297419 A | 11/1997 |
| JP | H 09-304956 A | 11/1997 |
| JP | H -09-304957 A | 11/1997 |
| JP | H 09-329907 A | 12/1997 |
| JP | H 10-012377 A | 1/1998 |
| JP | H 10-183120 A | 7/1998 |
| JP | 2861391 B | 12/1998 |
| JP | 2893671 B | 3/1999 |
| JP | H 11-072808 A | 3/1999 |
| JP | H 11-087062 A | 3/1999 |
| JP | H 11-195790 A | 7/1999 |
| JP | H 11-251601 A | 9/1999 |
| JP | 2000-143985 A | 5/2000 |
| JP | 2000-147240 A | 5/2000 |
| JP | 2000-260999 A | 9/2000 |
| JP | 3146296 B | 1/2001 |
| JP | 2001-083315 A | 3/2001 |
| JP | 2001-091918 A | 4/2001 |
| JP | 2001-093668 A | 4/2001 |
| JP | 2001-109139 A | 4/2001 |
| JP | 2001-155858 A | 6/2001 |
| JP | 3206401 B | 7/2001 |
| JP | 3221661 B | 8/2001 |
| JP | 2003-113237 A | 4/2003 |
| JP | 2003-223626 A | 8/2003 |
| JP | 2003-249656 A | 9/2003 |
| JP | 2004-277688 A | 10/2004 |
| JP | 2005-075965 A | 3/2005 |
| JP | 2005-093572 A | 4/2005 |
| JP | 2005-116617 A | 4/2005 |
| JP | 2006-518781 A1 | 8/2006 |
| JP | 2006-245073 A | 9/2006 |
| JP | 2006-252787 A | 9/2006 |
| TW | 200639197 | 11/2006 |
| WO | WO 03/022594 A1 | 3/2003 |

OTHER PUBLICATIONS

C. W. Tang, "Two-layer organic photovoltaic cell," Appl. Phys. Lett (48(2), pp. 183-185 (1986).

"Polymer Data handbook—Basic Edition" (published by Baifukan Co., Ltd.), ed. By The Society of Polymer Science, Japan (1986).

European Search Report for Corresponding EP Application No. 07851061.7 dated Dec. 23, 2010.

Taiwan Office Action in Counterpart TW Application No. 096150413 dated Dec. 6, 2011.

\* cited by examiner

RESIN COMPOSITION FOR PRINTING PLATE

TECHNICAL FIELD

The present invention relates to a novel polymer excellent in solvent resistance and also relates to polycarbonate diol excellent in solvent resistance and suitable particularly for producing a printing plate or a blank printing plate, a polymer suitable particularly for producing a printing plate or a blank printing plate, which is produced from the polycarbonate diol, and a photosensitive resin composition and a blank printing plate or a printing plate comprising this polymer.

Particularly, the present invention relates to polycarbonate diol that has excellent resistance to various solvents contained in inks for flexographic printing or the like and contributes to significant improvement in printing precision and printing durability, a polymer produced from the polycarbonate diol, and a photosensitive resin composition and a blank printing plate or a printing plate comprising this polymer.

Moreover, the present invention relates to methods for producing a conductive layer, an organic light-emitting layer, a liquid crystal orientation film, a black matrix, a colored layer for a color filter, a photoelectric conversion layer for an organic thin-film solar cells, a patterned thin-film semiconductor layer, a photosensitive layer of an electrophotographic photoreceptor, electron-accepting and/or electron-donating organic layers constituting a photovoltaic element for a photosensor, a polysilane thin film of an optical switching element, a bank, and an organic light-emitting layer for illumination, a display, display backlight, interior, exterior, or surface-emitting light source, using the printing plate according to the present invention excellent in solvent resistance.

BACKGROUND ART

In recent years, printing plates made of a resin have often been used in the printing field. Particularly, flexographic printing, which is characterized by using flexible printing plates and is increasingly important among various printing techniques, mainly employs printing plates made of the resin.

In printing inks, various organic solvents are used according to applications. When printing plates are made of the resin, they often have insufficient resistance to organic solvents and present problems such as insufficient printing precision and insufficient durability of the printing plates themselves. Therefore, printing plates or blank printing plates made of the resin are demanded to have excellent resistance to various solvents.

Meanwhile, it has been already known that a polymer produced from polycarbonate diol is applicable to a photosensitive resin composition for production of a blank printing plate. For example, Patent Document 1 discloses a resin composition for a laser-engravable blank printing plate and a blank printing plate comprising a resin produced from polycarbonate diol and inorganic fine particles.

Patent Document 2 discloses polycarbonate diol comprising a repeating unit which corresponds to the formula (2) of the present application wherein $R_2$ is a hydrocarbon group having 2 to 14 carbon atoms.

Patent Document 3 discloses polycarbonate having an ether structure having 3 to 20 carbon atoms.

Patent Document 4 discloses polyether polycarbonate diol comprising a polyoxytetramethylene glycol unit as a component.

Patent Document 5 discloses polycarbonate comprising aliphatic diol and/or polyether diol having 3 to 200 carbon atoms.

Patent Document 6 discloses a technique wherein a polymer comprising polycarbonate diol is used as a photosensitive layer of a planographic blank printing plate.

Patent Document 7 discloses a technique wherein urethane-modified polycarbonate containing an oxyethylene group as a repeating unit is used as a water-soluble photosensitive resin composition for a printing plate.

[Regarding Method for Producing Conductive Layer]

A radio-frequency identification (RFID) tag is used for tracking inventories or confirming the validity of commodities and also used for the purpose of tracking and authenticating other products. The RFID tag needs an antenna for transmitting/receiving data by radio waves. This antenna is formed by an approach such as a method for embedding an embeddable winding, a printing method using a conductive ink, a method for etching a conductive thin film, and a plating technique.

The RFID tag formed by the printing method requires lower cost than that of its counterparts for production. Furthermore, it can provide a visually beautiful aspect. This is particularly important for taking into consideration the use of an antenna printed in ink for tracking retail goods. This is because general retail goods trackers employ large obtrusive tags, compared to more decorative tags produced by using the antenna printed in ink.

Patent Document 8 describes a method for producing an RFID tag using a screen method.

Moreover, in electromagnetic shielding applications, for example, Patent Document 9 discloses an electromagnetic shielding member which is formed by printing an electromagnetic shielding pattern onto a transparent substrate by a gravure printing or gravure offset printing method using a conductive ink containing silver particles.

[Regarding Method for Producing Organic Light-emitting Layer]

An organic electroluminescence (hereinafter, abbreviated to "organic EL") element comprises an organic light-emitting layer made of an organic light-emitting material formed between two electrodes facing each other and emits light when electric current is applied to the organic light-emitting layer. The film thickness of the light-emitting layer is important for efficiently emitting light and must be as thin as approximately 100 nm. Furthermore, display production using this element requires highly defined patterning.

The organic light-emitting materials are classified into low-molecular-weight materials and high-molecular-weight (or polymer) materials. The low-molecular-weight materials are generally made into a thin film by a resistance heating deposition method or the like, and this film is patterned via a fine pattern mask. This method has the problem that the use of a larger substrate offers lower patterning precision.

Thus, a currently attempted method employs the high-molecular-weight (or polymer) material as an organic light-emitting material and comprises dissolving the organic light-emitting material in a solvent to prepare a coating solution, which is in turn used to form a thin film by a wet coating method. The wet coating method for thin film formation includes spin coating, bar coating, discharge coating, and dip coating methods. These wet coating methods have difficulty in highly defined pattering and color-coding with three colors RGB. A printing method which excels at color-coding and patterning is probably most effective for thin film formation.

However, a method using a hard printing plate made of metal, such as a gravure printing method, is unsuitable for a glass or resin substrate serving as an organic EL display substrate, since the hard printing plate causes large damage to the substrate. Thus, an offset printing method using an elastic rubber blanket or a letterpress printing method (flexographic printing method) also using an elastic rubber plate or photosensitive resin plate is preferable. Actually, as attempts using these printing methods, Patent Document 10 proposes a method based on offset printing, and Patent Document 11 proposes a method based on letterpress printing.

On the other hand, the high-molecular-weight (or polymer) organic light-emitting materials are poorly soluble in water and alcoholic solvents and must be dissolved or dispersed in organic solvents for preparing a coating solution. Among them, aromatic organic solvents such as toluene and xylene are preferable. Therefore, an aromatic organic solvent-containing ink is often used as an ink made of an organic light-emitting material (hereinafter, referred to as an "organic light-emitting ink").

However, a rubber blanket used in offset printing has the problem that it easily swells or deforms due to aromatic organic solvents such as toluene and xylene. Offset printing is a printing technique comprising: applying a coating solution to a patterned plate; transferring the coating solution to an elastic blanket; and further transferring the coating solution from the blanket to a substrate to be printed. The blanket that mediates the transfer of the coating solution must have elasticity, and blankets made of a rubber are generally used. The types of rubbers used are diversified from olefin-based rubbers to silicone-based rubbers. All of these rubbers easily swell or deform due to aromatic organic solvents such as toluene and xylene. Plates made of a rubber, photosensitive resin, or the like used in flexographic printing also generally had the problem of poor resistance to organic solvents.

Patent Document 12 discloses that in a letterpress printing method, the use of a water-developable letterpress plate comprising a photosensitive resin produces a plate that is highly resistant to organic solvents and less prone to mass change or deformation even using organic light-emitting inks, since the polyamide-based photosensitive resin is made of a material rich in a hydrophilic resin.

In recent years, a so-called flexo CTP (computer to plate) technique has been developed which comprises: placing a thin light-absorbing layer called a black layer onto the surface of a photosensitive resin; directly forming a mask pattern on the photosensitive resin plate by laser light irradiation; then causing crosslinking reaction by light irradiation via the mask; and then washing off the unexposed (uncrosslinked) portion by use of a developing solution. This technique has been increasingly adopted in terms of the effect of improving the efficiency of printing plate making.

Alternatively, examples of a method that eliminates the need of development may include a method for directly laser-engraving a blank printing plate. The preparation of letterpress printing plates or stamps by this method has already been performed, and materials used therein have also been known. By way of an example, Patent Document 13 describes a method for extruding a heat-melted photosensitive resin onto a cylindrical support using an extrusion molding apparatus and then forming a photosensitive member using a calendering apparatus.

[Regarding Method for Producing Liquid Crystal Orientation Film]

The utilization of liquid crystal materials as devices generally requires allowing liquid crystal to align in a fixed sequence (orientation). This molecular orientation is changed depending on the influence of an external field such as an electric field, magnetic field, shear force, or interface. By using optical properties changed thereby, liquid crystal is utilized in various electronic fields.

The orientational control of liquid crystal is generally achieved by forming an orientation film on substrate surface with which the liquid crystal comes into contact. The orientation film are broadly classified into homeotropic alignment membranes in which liquid crystal is oriented in a homeotropic direction or a direction slightly tilted from the homeotropic direction, relative to a substrate, and into homogeneous alignment membranes in which liquid crystal is oriented in a homogenous direction or a direction slightly tilted from the homogenous direction, relative to a substrate. These membranes are properly used according to display modes. Of them, homogeneous alignment membranes used in twisted nematic (TN) or super twisted nematic (STN) modes conventionally widely used are particularly important from an industrial standpoint. Polyimide membranes that have undergone a rubbing process are excellent in uniform orientation or reliability and are widely used as the homogenous alignment membranes.

A method for printing a liquid crystal orientation film often uses a glass substrate as a substrate. Therefore, a method using a hard printing plate made of metal, such as a gravure printing method, is unsuitable. A letterpress printing method (flexographic printing method) using an elastic rubber plate or photosensitive resin plate is proper and is therefore generally used.

Actually, offset printing methods for this purpose are described in, for example, Patent Documents 14 and 15. Moreover, Patent Document 16 describes a method for producing a resin letterpress plate having a relatively large dimension in response to market demands involved in the upsizing of liquid crystal displays.

Plates used in letterpress printing generally used or offset printing are prepared by the following method: a negative film is placed on the surface of a photosensitive resin applied to a substrate; and the photosensitive resin is irradiated through the negative film with light rays such as UV rays. By this method, the photosensitive resin is cured in a site where light rays pass through the negative film, whereas the photosensitive resin is uncured in a site where light rays are blocked by the negative film. Thus, after irradiation with light rays, the uncured photosensitive resin is washed off by development to obtain a resin letterpress plate having a relief composed of the site containing the cured photosensitive resin.

In recent years, a so-called flexo CTP (computer to plate) technique has been developed which comprises: placing a thin light-absorbing layer called a black layer onto the surface of a photosensitive resin; directly forming a mask pattern on the photosensitive resin plate by laser light irradiation; then causing crosslinking reaction by light irradiation via the mask; and then washing off the unexposed (uncrosslinked) portion by use of a developing solution. This technique has been increasingly adopted in terms of the effect of improving the efficiency of printing plate making.

[Regarding Method for Producing Black Matrix]

A resin black matrix comprising a light-shielding material, a resin, and a solvent has been used as a black matrix for a liquid crystal display color filter. A composition comprising a resin and a light-shielding material is dispersed in an appropriate solvent to prepare a paint, which is then applied to a liquid crystal substrate and patterned to form a resin black matrix.

Patent Document 17 discloses a resin black matrix which comprises a light-shielding material and a resin and which is additionally supplemented with pigments of blue color, purple color, and the like as complementary colors.

Patent Document 18 proposes a resin black matrix comprising: an organic pigment system comprising an organic black pigment and/or a pseudo-black mixed organic pigment which is obtained by mixing at least two or more organic pigments of colors selected from red, blue, green, purple, yellow, cyanine, and magenta; at least one or more light-shielding materials selected from carbon black, chromium oxide, iron oxide, titanium black, and aniline black; and a photosensitive resin.

Moreover, Patent Document 19 proposes a material for forming a black matrix, comprising a photopolymerizable compound, a photopolymerization initiator, an alkali-soluble resin, and a black pigment characterized by being a mixture of at least two members including resin-coated carbon black and metal oxide.

Furthermore, Patent Document 20 describes a resin black matrix comprising a titanium oxynitride and a resin.

Furthermore, Patent Document 21 discloses a resin black matrix comprising insulating film-surface-coated titanium oxynitride particles and a resin.

Furthermore, Patent Document 22 describes a resin black matrix comprising a polyimide or acrylic resin as a resin and carbon black and titanium oxynitride as light-shielding materials.

[Regarding Method for Producing Colored Layer for color Filter]

In recent years, demands have been ever increasing, such as higher definition, weight reduction, and lower cost of input/output elements such as color filter imaging elements or color image displays. In response to the demands, the development of various elemental technologies essential to these apparatuses is proceeding. Particularly, for image displays, basic techniques are changing. Liquid crystal displays, which are light in weight, space-saving, and portable, have been prevailed rapidly instead of conventionally dominating CTR.

Although the liquid crystal displays are getting easier to use, displays having a large area are still not sufficiently low in cost. Thus, various methods have been attempted to reduce cost. Examples of such methods may include: modification from an active matrix liquid crystal mode having individual TFT pixels to a ferroelectric liquid crystal mode in which the liquid crystal itself has switching properties; and improvement of a simple matrix mode typified by STN liquid crystal.

A color filter indispensable to color image display partly occupies the large proportion of cost required for liquid crystal displays. This color filter generally comprises a large number of fine pixels dividing a full screen, each of which has three sub-pixels each comprising a fine optical filter element (approximately 100 μm or smaller) that passes red (R), green (G), or blue (B) light therethrough. A method has been prevailed which comprises providing an opaque grid-pattern mask (black matrix), each zone of which surrounds each fine filter element such that a black color is distinctively defined or the color mixture between adjacent colors is prevented to improve color reproducibility. Thus, the color filter has a complicated and fine structure and therefore posed a challenge to the production with high precision and at low cost.

A conventionally known method for producing a color filter is a so-called staining method which involves repeating, for three colors, red, green, and blue, the steps of: placing, on a substrate, a mordant layer comprising a hydrophilic polymer such as gelatin, casein, glue, or polyvinyl alcohol; and staining the mordant layer with a dye to form a colored layer. This method relatively easily responds to spectral characteristics required for filters, by virtue of many available dyes. The step of staining the mordant layer adopts a difficultly controllable wet step of dipping the mordant layer in a staining bath containing the dye dissolved therein. Moreover, this method requires forming an intermediate layer for resist printing after the formation of the colored layer made of each color and has a complicated photolithography step for each color in the patterning of the mordant layer or for resist printing. Therefore, the method disadvantageously has a long takt time and poor yields. Moreover, the dye used in the staining has low heat resistance and light resistance. Therefore, the resulting color filter had a durability problem.

On the other hand, methods disclosed in, for example, Patent Documents 23 to 26 are so-called pigment dispersion methods wherein a colored resin membrane comprising a photosensitive resin mixed with a coloring material such as a pigment is used as a color filter layer. These methods eliminate the need of the staining step after color filter layer formation, since the colored resin comprises the coloring material such as a pigment from the first. Thus, the formation of an intermediate layer for resist printing is also unnecessary. Therefore, the methods have a simpler step than that of the staining method.

Moreover, a printing method forms fine pixels by a highly precise printing technique such as planographic offset printing or screen printing. For example, Patent Document 27 proposes a color filter characterized by comprising: a light-shielding membrane having a large number of openings formed at positions to be provided with pixel portions; and the same number of colored layers as the number of a plurality of different colors of the pixel portions, the colored layers being formed with a material transparent to visible light and each having colored portions of the same color at positions corresponding to the openings of the light-shielding membrane, wherein the colored layers are stacked such that the colored portions of the same color do not overlap with the other colored portions of colors different therefrom, and wherein the colored portions form, through the openings of the light-shielding membrane, the alignment of pixel portions of a plurality of different colors.

Furthermore, Patent Document 28 proposes a method comprising: applying, to preformed openings of a black matrix, a coloring paste prepared by adding a heat-resistant pigment to a polyimide precursor; and after pattern formation, curing the polyimide precursor by heating to form a colored layer of each color of red (R), green (G), and blue (B).

[Regarding Method for Producing Photoelectric Conversion Layer for Organic Thin-film Solar Cells]

Inorganic thin-film solar cells comprising an Si, GaAs, or CuInGaSe thin film or the like have been developed as thin-film solar cells. However, their production requires an expensive semiconductor production facility, resulting in high production cost. Thus, these solar cells had the problem that they have difficulty in achieving electric generation cost equal to or lower than general electricity expense in terms of total cost.

Thus, to solve the problem, the development of organic thin-film solar cells which do not require an expensive semiconductor production facility and can achieve low production cost has been actively proceeding in recent years.

The general structures of such organic thin-film solar cells are disclosed in Non-Patent Documents 1 and 2.

The organic thin-film solar cell is a solar cell comprising an organic thin-film photoelectric conversion layer disposed between two dissimilar electrodes, wherein the photoelectric conversion layer has electron-donating and electron-accepting functions. The organic thin-film solar cell may be produced in a simpler step than that of inorganic thin-film solar cell production using an Si, GaAs, or CuInGaSe thin film or the like and may be adaptable to a larger area at low cost.

Patent Document 29 discloses a photoelectric conversion element having a simple structure and high photoelectric conversion efficiency. A method for producing a photoelectric conversion layer used therein is a spin coating method.

Patent Document 30 discloses methods such as die coating, roll coating, and spray coating as methods for producing a photoelectric conversion layer.

[Regarding Method for Producing Patterned Thin-film Semiconductor Layer]

In recent years, electronic paper, RFID tags, and so on have received attention. They need a semiconductor. However, current transistor production processes require a vacuum process and a photo process, resulting in high production cost. Therefore, the realization thereof requires more inexpensive and larger-scale production than that of conventional transistors. Moreover, it is also desired that a transistor should be formed on a flexible substrate.

Therefore, transistors, particularly, organic transistors, produced using a printing method have received attention (Patent Document 31).

In organic transistor production, a resin film can be used as a substrate to be printed, since a semiconductor can be processed at a low temperature. Moreover, the semiconductor is made of organic matter. Therefore, a solution containing this organic matter dissolved in a solvent may be processed in the same way as in a printing ink by a printing method.

[Regarding Method for Producing Photosensitive Layer of Electrophotographic Photoreceptor]

Electrophotography used in a copier, printer, or the like comprises: electrically charging the whole surface of a photosensitive layer on a photoreceptor drum; then forming a latent charge image of a document or the like in a latent image-forming portion; subsequently developing this latent image into a visible image in a development portion by use of charged toner; then transferring the image to a recording medium such as plain paper in a transfer portion; and thermally fixing the image thereon in a fuser portion to obtain a hard copy. In this technique, the photoreceptor is usually grounded via a conductive layer for improving the amount of an electric charge in charging, providing a light attenuation effect in light exposure, and using it as a bias electrode in development.

Conventionally, photosensitive materials comprising inorganic photoconductive substances such as selenium, selenium-tellurium alloys, cadmium sulfide, and zinc oxide have been used widely in a photosensitive layer of an electrophotographic photoreceptor. In recent years, the study of organic photoconductive substances has been proceeding which are easily synthesized and are characterized in that, for example, they exhibit photoconductivity in an appropriate wavelength region.

For example, Patent Document 32 discloses an electrophotographic photoreceptor which is obtained by: applying a coating solution for a charge generation layer by dipping onto an aluminum drum used as a photoreceptor drum; then applying a coating solution for a charge transport layer thereonto by dipping; and further providing a protective layer for the photosensitive layer as means for improving durability.

Moreover, Patent Document 33 discloses an electrophotographic photoreceptor comprising a flexible nonmetallic conductive support and a photosensitive layer formed on the conductive support, wherein the photosensitive layer comprises a plurality of thin films including a charge generation layer. A thin film formation method disclosed therein includes application methods such as deposition, codeposition, spray coating, blade coating, casting, spinner coating, bead coating, wire bar coating, roller coating, and curtain coating methods.

Furthermore, Patent Document 34 also discloses thin film formation methods using a photoconductive composition in an electrophotographic photoreceptor or the like, including application methods such as spin coating, casting, dipping, bar coating, and roll coating methods.

[Regarding Method for Producing Electron-accepting and/or Electron-donating Organic Layers Constituting Photovoltaic Element for Photosensor]

Conventionally, monocrystalline, polycrystalline, or amorphous Si has been used in the production of photovoltaic elements. The development of photovoltaic elements using organic materials has been proceeding for developing inexpensive and low toxic photovoltaic elements.

Photovoltaic elements that utilize an internal electric field generated by a Schottky junction, MIS junction, or p-n heterojunction based on an n-type inorganic semiconductor/p-type organic semiconductor junction are known as the photovoltaic elements produced using organic materials. The photovoltaic element is desired to have high energy conversion efficiency, since it is an element that converts light energy to electric energy (voltage×electric current). The photovoltaic elements based on the junctions could not be expected to have high conversion efficiency.

To solve such problems of the photovoltaic elements, a photovoltaic element has been developed using an organic/organic p-n heterojunction (Non-Patent Document 3). This photovoltaic element utilizes an electric field generated by a junction between an electron-accepting organic layer and an electron-donating organic layer. Light irradiation through a transparent electrode and photocharge generation caused by two organic materials can be achieved. Therefore, this photovoltaic element has been known to have an advantage such as wider spectral sensitivity than that of the photovoltaic elements described above.

A method using a vacuum deposition process (Patent Documents 35 and 36) and a spin coating method as a wet film formation method (Patent Document 36) have been used as methods for producing the electron-accepting and electron-donating organic layers constituting the photovoltaic element that utilizes an organic/organic p-n heterojunction.

[Regarding Method for Producing Polysilane Thin Film of Optical Switching Element]

Conventionally, optical switching elements have been produced by an LB method. However, the optical switching element production by an LB method requires a very long time and has difficulty in achieving high degree of integration of an element having a fine pattern. Therefore, this approach has been known to present a problem in terms of the practical production of elements.

Thus, to solve the problem, Patent Document 37 discloses an optical switching element which comprises an optical switching portion selectively formed on a portion of a polysilane thin film formed on a substrate and which is made of polysiloxane and photochromic materials, wherein the optical switching element is produced in a simpler step and operated using a usual light source. In this context, a process for producing the polysilane thin film disclosed therein adopts a spin coating method.

[Regarding Processes for Producing Bank, etc.]

Organic EL displays have been expected as display devices in place of liquid crystal displays, along with higher-quality pictures and lower power consumption of cellular phones, personal digital assistants, or the like. An organic EL element used as a display element in this organic EL display has a structure comprising a lower electrode (also referred to as a pixel electrode), an organic EL layer, and an upper electrode sequentially stacked on a substrate made of glass or the like and emits light when electric current is applied to between the upper and lower electrodes. The organic EL layer may have, for example, a structure consisting of a light-emitting layer or may have, for example, a structure comprising a light-emitting layer in combination with one or both of hole transport and electron transport layers.

When low-molecular-weight materials are used, a vacuum deposition method or the like is known as a method for forming a light-emitting layer and a hole transport layer on the substrate contained in the organic EL element. When high-molecular-weight (or polymer) materials are used, methods are known, such as spin coating, dipping, roll coating, doctor blade, and various printing methods.

In recent years, an inkjet method has received attention which has the advantage that it can efficiently form an organic EL layer for each organic EL element portion forming a pixel (hereinafter, abbreviated to a "pixel-forming portion") and easily achieves arrangement (color coding) of each organic material to emit light of each color of RGB (Patent Document 38). In this context, when this inkjet method is used, a liquid substance containing the organic material as an ink discharged from the nozzle of an inkjet head may be leaked from a target pixel-forming portion to be landed on to a pixel-forming portion adjacent thereto. Such leakage is caused because a gap (spacing) for forming drops is formed to some extent between the inkjet head and the substrate. Specifically, when an ink is discharged from the nozzle of the inkjet head, the ink is discharged in varying directions (angles) due to soil or the like attached to the tip of the nozzle or exhibits stray fly due to influence such as air flow. As a result, a position on which ink drops are landed through the gap may deviate from the desired target position.

Moreover, in organic EL element preparation, the element is placed on a movable X-Y table, and substrate position is mechanically controlled by driving this X-Y table in most cases. Therefore, the leakage may occur due to mechanical alignment errors. In general, landing position precision determined depending on the discharge precision of the inkjet head and the alignment precision of the table is a value on the order of ±15 to 30 μm. Due to this deviation of landing position, the organic EL element is difficult to precisely form at a desired position, when the inkjet method is used without particular constitution that prevents the leakage.

Thus, a method has been proposed which comprises surrounding each pixel-forming portion by water-repellent/oil-repellent (hereinafter, abbreviated to "liquid-repellent") banks in the organic EL element preparation (Patent Document 39). This method is a method comprising: forming a predetermined pattern onto electrodes formed on a transparent substrate to form a plurality of pixel electrodes; then forming banks which function as barriers between the formed pixel electrodes adjacent to each other; further forming a liquid-phase organic EL layer (e.g., charge injection/transport layer and/or light-emitting layer) in a region surrounded by the banks; and further forming an upper electrode thereon.

In this context, the thickness of the bank is generally approximately 1 to 3 μm. Moreover, an organic resin material such as a polyimide-based resin, polymethacrylate, or novolac-based resin is usually used as a material for the bank. Photosensitivity is often imparted to this material for facilitating patterning. Moreover, the bank surface must have low surface free energy relative to inks for imparting liquid repellency thereto. For imparting such liquid repellency to the bank surface, methods have been adopted, for example: a method comprising allowing an organic resin as a bank material to contain in advance a fluorine-containing functional group or silicon-containing additive; and a method comprising using fluorine-based gas typified by carbon tetrafluoride after patterning to plasma-treat the bank surface.

Moreover, a hydrophilic/lipophilic (hereinafter, abbreviated to "lyophilic") property, which is opposite to the liquid repellency imparted to the bank surface, is imparted to the pixel electrode surface. ITO (indium tin oxide) for forming a transparent electrode is often used as a material for the pixel electrode. For example, organic (hydrocarbon-containing) impurities are removed by subjecting the pixel electrode surface to $UV/O_3$ treatment or oxygen plasma treatment, which is a washing method known in the art. As a result, the lyophilicity of the pixel electrode surface can also be enhanced. For organic EL elements, the ionization potential (work function) of the ITO surface is increased by the treatment, and thus, the effect of improving hole injection efficiency can also be expected.

Thus, the liquid repellency imparted to the bank surface and the lyophilicity imparted to the pixel electrode surface can accept (compensate for) the deviation of landing position to some extent, since some ink drops, if any, landing on a portion of the bank surface are attracted by the lyophilic pixel electrode surface and uniformly patterned on the pixel electrode surface. Such an approach prevents the adjacent pixel-forming portions from being contaminated with undesired inks of the other types and therefore reduces the color mixture of inks within the pixel-forming portions, unless the inks land on the adjacent pixel electrode surfaces.

As described above, when high-molecular-weight (or polymer) materials are used, a method for producing a light-emitting layer and a hole transport layer by various printing methods is known as a method for forming a light-emitting layer and a hole transport layer on the substrate contained in the organic EL element. Patent Document 40 discloses a method based on an offset printing method. Patent Documents 41 and 42 disclose a method based on a letterpress printing method. Patent Document 42 also discloses that in a letterpress printing method, the use of a water-developable letterpress plate comprising a photosensitive resin produces a plate that is highly resistant to organic solvents and less prone to mass change or deformation even using organic light-emitting inks, since the polyamide-based photosensitive resin is made of a material rich in a hydrophilic resin.

When the organic light-emitting layer is produced by a printing method using a high-molecular-weight (or polymer) material, for example, an aromatic organic solvent such as toluene or xylene must be used as a solvent in an organic light-emitting ink containing the high-molecular-weight (or polymer) material.

Patent Document 1: Pamphlet of WO 03/022594
Patent Document 2: Japanese Patent Laid-Open No. 5-239202
Patent Document 3: Japanese Patent Laid-Open No. 2003-113237
Patent Document 4: Japanese Patent Laid-Open No. 4-214720
Patent Document 5: Japanese Patent Laid-Open No. 60-81246
Patent Document 6: Japanese Patent Laid-Open No. 2001-109139
Patent Document 7: Japanese Patent Laid-Open No. 8-328249
Patent Document 8: Japanese Patent Laid-Open No. 2003-223626
Patent Document 9: Japanese Patent Laid-Open No. 2004-277688
Patent Document 10: Japanese Patent Laid-Open No. 2001-93668

Patent Document 11: Japanese Patent Laid-Open No. 2001-155858
Patent Document 12: Japanese Patent Laid-Open No. 2006-252787
Patent Document 13: Japanese Patent Laid-Open No. 9-169060
Patent Document 14: Japanese Patent Laid-Open No. 2001-91918
Patent Document 15: Japanese Patent Laid-Open No. 6-186551
Patent Document 16: Japanese Patent No. 3221661
Patent Document 17: Japanese Patent No. 2861391
Patent Document 18: Japanese Patent No. 2552391
Patent Document 19: Japanese Patent Laid-Open No. 2000-147240
Patent Document 20: Japanese Patent Laid-Open No. 2000-143985
Patent Document 21: Japanese Patent Laid-Open No. 2001-83315
Patent Document 22: Japanese Patent Laid-Open No. 2005-75965
Patent Document 23: Japanese Patent Laid-Open No. 55-134807
Patent Document 24: Japanese Patent Laid-Open No. 60-129707
Patent Document 25: Japanese Patent Laid-Open No. 60-237441
Patent Document 26: Japanese Patent Laid-Open No. 61-105505
Patent Document 27: Japanese Patent Laid-Open No. 9-80223
Patent Document 28: Japanese Patent Laid-Open No. 2005-75965
Patent Document 29: Japanese Patent Laid-Open No. 2005-116617
Patent Document 30: Japanese Patent Laid-Open No. 2006-245073
Patent Document 31: Japanese Patent Laid-Open No. 2003-249656
Patent Document 32: Japanese Patent Laid-Open No. 6-123992
Patent Document 33: Japanese Patent Laid-Open No. 8-190209
Patent Document 34: Japanese Patent No. 3146296
Patent Document 35: Japanese Patent Laid-Open No. 5-21823
Patent Document 36: Japanese Patent Laid-Open No. 2005-93572
Patent Document 37: Japanese Patent Laid-Open No. 11-72808
Patent Document 38: Japanese Patent Laid-Open No. 10-12377
Patent Document 39: Japanese Patent Laid-Open No. 11-87062
Patent Document 40: Japanese Patent Laid-Open No. 2001-93668
Patent Document 41: Japanese Patent Laid-Open No. 2001-155858
Patent Document 42: Japanese Patent Laid-Open No. 2006-252787
Non-Patent Document 1: MATERIAL STAGE, vol. 2, No. 9, 2002, p. 37-42, J. Nakamura et al., "Organic Thin-Film Solar Cell-Utilization of Donor-Acceptor Interaction-"
Non-Patent Document 2: OYO BUTURI (a monthly publication of The Japan Society of Applied Physics), vol. 71, No. 4, 2002, p. 425-428, A. Konno "Present and Future of Organic Solar Cell"
Non-Patent Document 3: C. Tang: Appl. Phys. Lett., 48, 183 (1986)

DISCLOSURE OF THE INVENTION

Problems to be Solved by the Invention

However, a technique disclosed in Patent Document 1 is intended for solving the problem of laser engraving, and the document neither describes nor suggests the solvent resistance of the blank printing plate.

Furthermore, all polycarbonate diols used in Examples therein comprise a repeating unit which corresponds to the formula (2) of the present application wherein $R_2$ is a hydrocarbon group having 4 or 6 carbon atoms. Their solvent resistance is not sufficiently excellent.

A technique disclosed in Patent Document 2 is intended for improving the hydrolyzability or heat resistance of adhesives or sealing agents, and the document does not describe solvent resistance.

A technique disclosed in Patent Document 3 is intended for improving low-temperature characteristics in applications such as paints, adhesives, polyurethane, and polyamide elastomers, and the document does not describe solvent resistance.

A technique disclosed in Patent Document 4 is intended for producing thermoplastic polyurethane, polyether ester, polyetheramide, foamed polyurethane elastomers, and so on, and the document does not describe solvent resistance.

A technique disclosed in Patent Document 5 is intended for improving the mechanical properties or flowability of a polyamide composition for molding, and the document does not describe solvent resistance.

A technique disclosed in Patent Document 6 is intended for improving the sensitivity of the photosensitive layer and improving the mechanical properties of the printing plate, and the document does not make any mention about the solvent resistance of a printing plate. Moreover, polycarbonate diol shown in Examples therein is only aliphatic polycarbonate having 6 carbon atoms, and the document does not specifically illustrate the polycarbonate diol of the present invention comprising a repeating unit represented by the formulas (1) and/or (2) of the present application.

A technique disclosed in Patent Document 7 is intended for providing the water-soluble (water-developable) photosensitive resin composition, and the document does not make any mention about the solvent resistance of a plate. Moreover, urethane-modified polycarbonate shown in Examples therein comprises a repeating unit which corresponds to the formula (2) of the present application wherein $R_2$ is a hydrocarbon group having 6 carbon atoms. Its solvent resistance is not sufficiently excellent.

Thus, the conventional techniques as disclosed in Patent Documents 1 to 7 neither make discussion of the relationship between a polycarbonate diol structure and solvent resistance regarding the printing plate or the blank printing plate produced using polycarbonate diol nor achieve improvement in solvent resistance. In addition, the conventional techniques do not achieve compatibility between the solvent resistance and laser engraving of the printing plate.

[Regarding Method for Producing Conductive Layer]

Patent Document 8 does not make any mention about a general solution of problems of the screen printing method. Specifically, when the conductive ink is printed onto the substrate by the screen printing method currently performed as the mainstream, the method had the problem of generation of ink bleed that establishes a short-circuit in a conductive pathway. A long seamless conductive pathway is advantageous for making the most of RFID antenna ability. However, such a long conductive pathway had the problem of easy generation of ink bleed. Thus, the solution of the problem has been demanded.

An intaglio plate used in gravure printing or gravure offset printing disclosed in Patent Document 9 is prepared by plate making on the surface of a cylinder or flat plate made of copper, 42 alloy, glass, or the like by use of an approach such as the photomechanical process or laser and is excellent in plate durability and suitable for large-lot printing. However, the plate processing requires the highly advanced technology. Furthermore, the intaglio plate was not suitable for small-lot printing and had constraints on substrates to be printed upon.

Thus, the methods disclosed in Patent Documents 8 and 9 required printing technique skills, and their application to electronic devices were confined to specific printing companies under these circumstances.

[Regarding Method for Producing Organic Light-emitting Layer]

Plates produced from the polyamide-based photosensitive resin disclosed in Patent Document 12 are generally hard and have the problem of large damage to a substrate. Moreover, this technique is also a method using photolithography in which the pattern is formed through light exposure and development steps. Therefore, it has a problem in terms of the efficiency of printing plate making. Furthermore, this method has the problem that a nonuniform plate thickness or plate warpage (curled plate edge) is caused by cupping in which the central portion of the photo-cured pattern has a smaller thickness than that of the other portion due to shrinkage on curing in the light exposure step or the extraction of uncured components into a developing solution in the development step. The use of the printing plate with low thickness precision gives nonuniform film thickness of the pattern obtained in printing and nonuniform performance of the obtained organic light-emitting layer and an organic EL element or display comprising the organic light-emitting layer.

The technique called flexo CTP also has the limited effect of improving efficiency, since it still involves a development step. Thus, the development of the technique has been demanded which directly forms the relief pattern onto a blank printing plate by use of a laser and eliminates the need of development.

A technique disclosed in Patent Document 13 required at least a temperature of 100° C. or higher for heat-melting a photosensitive resin comprising a thermoplastic elastomer used in the flexographic printing field and also required an exceedingly massive apparatus such as a load of an extruder. Moreover, it also had the problem that the film thickness of a melted resin extruded from a die attached to the end of an extruder is difficult to freely control.

[Regarding Method for Producing Liquid Crystal Orientation Film]

General techniques as disclosed in Patent Documents 14 to 16 are methods using photolithography in which the pattern is formed through light exposure and development steps. Therefore, they had a problem in terms of the efficiency of printing plate making. Furthermore, this method had the problem that a nonuniform plate thickness or plate warpage (curled plate edge) is caused by cupping in which the central portion of the photo-cured pattern has a smaller thickness than that of the other portion due to shrinkage on curing in the light exposure step or the extraction of uncured components into a developing solution in the development step. The use of the printing plate with low thickness precision disadvantageously gave nonuniform film thickness of the pattern obtained in printing and nonuniform performance of the obtained liquid crystal orientation film and the liquid crystal display comprising this membrane.

The technique called flexo CTP also has the limited effect of improving efficiency, since it still involves a development step. Thus, the development of the technique has been demanded which directly forms the relief pattern onto the blank printing plate by use of a laser and eliminates the need of development. Examples of the technique include a method comprising directly laser-engraving the blank printing plate. The preparation of letterpress printing plates or stamps by this method has already been performed, and materials used therein have also been known. However, laser-engravable materials for conventional printing plates do not have sufficient resistance depending on the type of a printing solution used, such as an orientation film solution. The problem has been pointed out that the patterned cured resin layer on the printing plate absorbs components contained in the printing solution and swells with repetitive printing processes.

[Regarding Method for Producing Black Matrix]

In Patent Documents 17 to 22, methods for forming the black matrix comprise patterning, by a method such as photolithography, a coating membrane obtained by applying a coating composition for a black matrix. Specifically, these methods involve performing light exposure, development, and washing after photoresist coating formation on a resin (when the resin is a nonphotosensitive resin) or either directly on a resin or after oxygen barrier membrane formation (when the resin is a photosensitive resin) to obtain the desired pattern. Therefore, the methods still had a problem in terms of production efficiency.

On the other hand, an attempt has also been made to directly form the black matrix by a printing method using a coating composition for the black matrix. The method is capable of forming the black matrix with high efficiency. However, the substrate to be printed for black matrix formation is often made of a material vulnerable to damage, such as glass. Thus, a hard printing plate made of, for example, metal is basically impossible to use. In this regard, the flexographic printing plate characterized by being flexible is preferable. However, materials for conventional flexographic printing plates do not have sufficient resistance to a solvent used in the coating composition for a black matrix. Therefore, this method had the problem that it fails to form an accurate black matrix due to swelling with repetitive printing processes. A solution of the problem has been demanded strongly.

[Regarding Method for Producing Colored Layer for color Filter]

The patterning of colored layers disclosed in, for example, Patent Documents 23 to 26 still requires using the photolithography step for each of three colors. These methods disadvantageously had the complicated step and wasted materials due to low use efficiency of expensive resist materials for the photolithography.

Various methods have been proposed for forming the color filter by the simpler method, not by such complicated formation methods. One example thereof may include an electrodeposition method, an application of electrodeposition coating. The electrodeposition method still had challenges to cost reduction and higher definition, such as the need of a transparent electrode only for electrodeposition of a coloring material and constraints on the shape of filter pixels due to use of electrodes.

A method for producing red (R), green (G), and blue (B) color filters disclosed in Patent Document 27 comprises the steps of:

(1) applying a first colored layer comprising a material transparent to visible light onto a light-shielding membrane on a transparent substrate;
(2) curing regions other than a region constituting a pixel of a first color (e.g., R) of the colored layer to form color protection regions;
(3) supplying, by printing, a coloring agent of the first color (R) to the region constituting the pixel of the first color (R) to form a colored portion; and
(4) curing the first colored layer with the first color (R); and involves forming second and third colored layers in the same way as above. Thus, this method had a large number of steps and required improvement in efficiency.

A method disclosed in Patent Document 28 also achieves pattern formation by photolithography and involves forming a desired pattern by performing light exposure, development, and washing after the application of the photosensitive resin. Therefore, this method still had a large problem in terms of production efficiency.

On the other hand, an attempt has also been made to directly form the color filter by the printing method. This method is capable of forming the color filter with high efficiency. However, the substrate to be printed for color filter formation is often made of a material vulnerable to damage, such as glass. Thus, a hard printing plate made of, for example, metal is basically impossible to use. In this regard, the flexographic printing plate characterized by being flexible is preferable. However, materials for conventional flexographic printing plates do not have sufficient resistance to a solvent used in the ink for color filter formation. Therefore, this method had the problem that it fails to form an accurate pattern due to swelling with repetitive printing processes. A solution of the problem has been demanded strongly.

[Regarding Method for Producing Photoelectric Conversion Layer for Organic Thin-film Solar Cells]

For the method for producing the photoelectric conversion layer disclosed in Patent Document 29, highly efficient production based on the continuous process (roll-to-roll process) is impossible, and production using pattern formation is also impossible. Thus, this method cannot be expected to produce a highly precise photoelectric conversion layer for the organic thin-film solar cells.

Moreover, all methods for producing the photoelectric conversion layer disclosed in Patent Document 30 have difficulty in production using pattern formation. Patent Document 30 illustrates an inkjet method, one type of printing method. However, the inkjet method has difficulty in producing the photoelectric conversion layer with high efficiency due to a limited production rate and cannot thus be expected to produce a highly precise photoelectric conversion layer for the organic thin-film solar cells with high efficiency.

Thus, a method for efficiently producing the photoelectric conversion layer for the organic thin-film solar cells with high precision has been unknown among the conventional techniques.

[Regarding Method for Producing Patterned Thin-film Semiconductor Layer]

Patent Document 31 discloses organic transistor preparation using spin coating and vacuum deposition methods conventionally performed and does not specifically disclose the printing method. Moreover, the printing plate has been unknown which exhibits practically sufficient resistance to a solvent used in a printing ink in organic transistor production using the printing method.

[Regarding Method for Producing Photosensitive Layer of Electrophotographic Photoreceptor]

Conventional techniques do not disclose the production of the photosensitive layer of the electrophotographic photoreceptor by the printing method probably more advantageous for full-scale production. Furthermore, for methods disclosed in Patent Documents 32 to 34, highly efficient production based on the continuous process (roll-to-roll process) is impossible, and production using pattern formation is also impossible. Thus, these methods could not be expected to produce the highly precise photosensitive layer of the electrophotographic photoreceptor.

[Regarding Method for Producing Electron-accepting and/or Electron-donating Organic Layers Constituting Photovoltaic Element for Photosensor]

When electron-accepting and electron-donating organic layers constituting the photovoltaic element are produced by methods disclosed in Patent Documents 35 and 36, large-scale production or a larger area is not easy to achieve.

For methods disclosed in Patent Documents 35 and 36, highly efficient production based on the continuous process (roll-to-roll process) is impossible, and production using pattern formation is also impossible. Thus, these methods could not be expected to produce highly precise electron-accepting and electron-donating organic layers constituting the photovoltaic element.

[Regarding Method for Producing Polysilane Thin Film of Optical Switching Element]

For the spin coating method disclosed in Patent Document 37, highly efficient production based on the continuous process (roll-to-roll process) is impossible, and production using pattern formation is also impossible. Thus, this method could not be expected to produce the highly precise polysilane thin film of the optical switching element.

[Regarding Methods for Producing Bank, Etc.]

Conventional approaches using the bank as disclosed in Patent Document 39 employ the photoresist step in the method for patterning the bank and therefore involve forming a desired pattern by performing light exposure, development, and washing after the application of the photosensitive resin. Thus, the development of a method for efficiently producing the bank has been demanded.

Moreover, an olefin-based or silicone-based rubber or the like is used in the rubber blanket used in offset printing, since the rubber blanket must be elastic. The rubber had the problem that it easily exhibits a mass change or deforms due to aromatic organic solvents such as toluene and xylene.

Furthermore, plates made of, for example, the rubber or photosensitive resin used in flexographic printing also generally had the problem of poor resistance to organic solvents.

Furthermore, plates produced from the polyamide-based photosensitive resin are generally hard and had the problem of large damage to the substrate. Moreover, this technique is also a method using photolithography in which the pattern is formed through light exposure and development steps. Therefore, it had a problem in terms of the efficiency of printing plate making. Furthermore, this method has the problem that a nonuniform plate thickness or plate warpage (curled plate edge) is caused by cupping in which the central portion of the photo-cured pattern has a smaller thickness than that of the other portion due to shrinkage on curing in the light exposure step or the extraction of uncured components into the developing solution in the development step. The use of the printing plate with low thickness precision gives nonuniform film thickness of the pattern obtained in printing and nonuniform performance of the obtained organic light-emitting layer and the organic EL element or display comprising the organic light-emitting layer.

Thus, a method for efficiently producing the organic light-emitting layer for illumination, a display, display backlight, interior, exterior, or surface-emitting light source with high precision has been unknown among the conventional techniques.

An object of the present invention is to produce a polymer excellent in solvent resistance by using polycarbonate diol excellent in solvent resistance and to provide, by use of this polymer, a printing plate or a blank printing plate that has improved printing precision and printing durability.

Moreover, an object of the present invention is to provide a method for producing a conductive layer with high precision, to provide a method for producing an organic light-emitting layer with high precision, to provide a method for producing a liquid crystal orientation film with high precision, to provide a method for producing a black matrix with high precision, to provide a method for producing a colored layer for a color filter with high precision, to provide a method for producing a photoelectric conversion layer for an organic thin-film solar cells with high precision, to provide a method for producing a patterned thin-film semiconductor layer with high precision, to provide a method for producing a photosensitive layer of an electrophotographic photoreceptor with high precision, to provide a method for producing electron-accepting and/or electron-donating organic layers constituting a photovoltaic element for a photosensor a with high precision, to provide a method for producing a polysilane thin film of an optical switching element with high precision, to provide a method for producing a bank with high precision, and to provide a method for producing an organic light-emitting layer for illumination, a display, display backlight, interior, exterior, or surface-emitting light source with high precision.

Means for Solving the Problems

To attain the objects, the present inventors have conducted diligent studies on polycarbonate diol and have consequently completed the present invention by finding out that polycarbonate diol having a particular structure and a polymer produced from this polycarbonate diol exhibit excellent resistance to various solvents used in inks and so on and that a printing plate or a blank printing plate produced from a photosensitive resin composition comprising this polymer has significantly improved printing precision and printing durability.

Moreover, the present inventors have completed the present invention by finding out that, by using the printing plate excellent in solvent resistance, a conductive layer can be produced with high precision, an organic light-emitting layer can be produced with high precision, a liquid crystal orientation film can be produced with high precision, a black matrix can be produced with high precision, a colored layer for a color filter can be produced with high precision, a photoelectric conversion layer for an organic thin-film solar cells can be produced with high precision, a patterned thin-film semiconductor layer can be produced with high precision, a photosensitive layer of an electrophotographic photoreceptor can be produced with high precision, electron-accepting and/or electron-donating organic layers constituting a photovoltaic element for a photosensor can be produced with high precision, a polysilane thin film of an optical switching element can be produced with high precision, a bank can be produced with high precision, and an organic light-emitting layer for illumination, a display, display backlight, interior, exterior, or surface-emitting light source can be produced with high precision.

Specifically, the present invention relates to polycarbonate diol having a particular structure, a polymer produced from the polycarbonate diol, a printing plate and a blank printing plate produced from a photosensitive resin composition comprising the polymer, and methods for producing a conductive layer and so on, according to the following [1] to [45]:

[1]
A polymer comprising: a polycarbonate diol comprising a repeating unit represented by the following formulas (1) and/or (2); a polyisocyanate compound having an isocyanate group equivalent less than a terminal hydroxyl group equivalent of the polycarbonate diol; and isocyanatoalkyl acrylate and/or isocyanatoalkyl methacrylate, wherein
the polycarbonate diol and the polyisocyanate compound are polymerized through a urethane bond, and
a residual terminal hydroxyl group of the polymerized polycarbonate diol is bonded to the isocyanatoalkyl acrylate and/or isocyanatoalkyl methacrylate through a urethane bond:

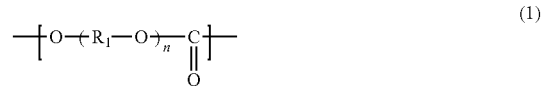

wherein $R_1$ represents a linear or branched hydrocarbon group having 2 to 50 carbon atoms; and n represents an integer of 2 to 50,

wherein $R_2$ represents a linear or branched hydrocarbon group having 10 to 50 carbon atoms.

[2]
The polymer according to item [1], wherein the polycarbonate diol has a number-average molecular weight of from 300 to 50,000.

[3]
The polymer according to item [1] or [2], wherein the polyisocyanate compound is a diisocyanate compound.

[4]
The polymer according to any one of items [1] to [3], wherein the polyisocyanate compound is an aromatic diisocyanate.

[5]
The polymer according to any one of items [1] to [4], wherein the polymer is represented by the following formula (3):

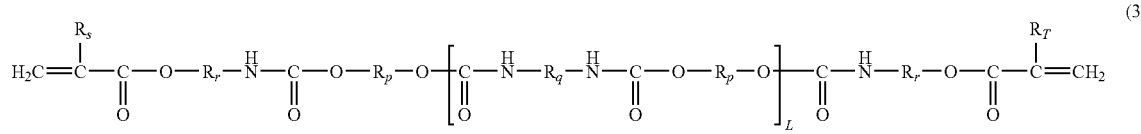

wherein $R_p$ each independently represents a residue, exclusive of both the terminal hydroxyl groups, of the polycarbonate diol comprising the repeating unit represented by the formulas (1) and/or (2); $R_q$ represents a residue of the diisocyanate compound exclusive of the isocyanate groups; $R_r$ represents an alkyl moiety of the isocyanatoalkyl acrylate and/or isocyanatoalkyl methacrylate; $R_S$ and $R_T$ each independently represent a methyl group or a hydrogen atom; and L represents an integer of 1 or larger.

[6]

The polymer according to any one of items [1] to [5], wherein the polycarbonate diol is a polycarbonate diol comprising the repeating unit represented by the formula (1).

[7]

The polymer according to any one of items [1] to [5], wherein the polycarbonate diol is a polycarbonate diol comprising a repeating unit represented by the formula (2).

[9]

A process for producing a polymer according to any one of items [1] to [7], comprising reacting a polycarbonate diol comprising a repeating unit represented by the formulas (1) and/or (2), a polyisocyanate compound having an isocyanate group equivalent less than a terminal hydroxyl group equivalent of the polycarbonate diol, and an isocyanatoalkyl acrylate and/or isocyanatoalkyl methacrylate.

[9]

A polycarbonate diol for production of a printing plate or a blank printing plate, comprising a repeating unit represented by the following formulas (1) and/or (2):

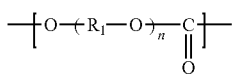

(1)

wherein $R_1$ represents a linear or branched hydrocarbon group having 2 to 50 carbon atoms; and n represents an integer of 2 to 50,

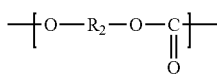

(2)

wherein $R_2$ represents a linear or branched hydrocarbon group having 10 to 50 carbon atoms.

[10]

The polycarbonate diol for production of a printing plate or a blank printing plate according to item [9], wherein the polycarbonate diol has a number-average molecular weight of from 300 to 50,000.

[11]

The polycarbonate diol for production of a printing plate or a blank printing plate according to item [9] or [10], wherein the polycarbonate diol comprises the repeating unit represented by the formula (1).

[12]

The polycarbonate diol for production of a printing plate or a blank printing plate according to item [9] or [10], wherein the polycarbonate diol comprises the repeating unit represented by the formula (2).

[13]

A polymer for production of a printing plate or printing plate, comprising: polycarbonate diol according to any one of items [9] to [12]; a polyisocyanate compound having an isocyanate group equivalent exceeding a terminal hydroxyl group equivalent of the polycarbonate diol; and a hydroxyalkyl acrylate and/or hydroxyalkyl methacrylate, wherein the polycarbonate diol and the polyisocyanate compound are polymerized through a urethane bond, and a residual isocyanate group of the polymerized polyisocyanate compound is bonded to the hydroxyalkyl acrylate and/or hydroxyalkyl methacrylate through a urethane bond.

[14]

The polymer for production of a printing plate or a blank printing plate according to item [13], wherein the polyisocyanate compound is a diisocyanate compound.

[15]

The polymer for production of a printing plate or a blank printing plate according to item [13] or [14], wherein the polyisocyanate compound is an aromatic diisocyanate.

[16]

The polymer for production of a printing plate or a blank printing plate according to any one of items [13] to [15], wherein the polymer is represented by the following formula (4):

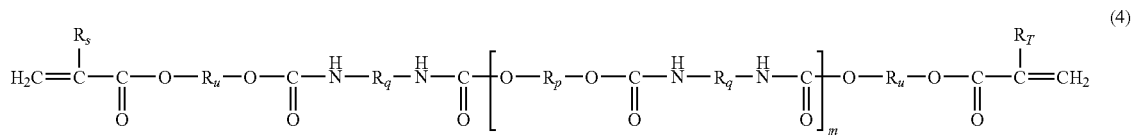

(4)

wherein $R_p$ each independently represents a residue, exclusive of both the terminal hydroxyl groups, of the polycarbonate diol comprising the repeating unit represented by the formulas (1) and/or (2); $R_q$ represents a residue of the diisocyanate compound exclusive of the isocyanate groups; $R_u$ represents an alkyl moiety of the hydroxyalkyl acrylate and/or hydroxyalkyl methacrylate; $R_S$ and $R_T$ each independently

[17]
A process for producing a polymer for production of a printing plate or a blank printing plate according to any one of items [13] to [16], comprising reacting a polycarbonate diol comprising the repeating unit represented by the formulas (1) and/or (2), a polyisocyanate compound having an isocyanate group equivalent exceeding a terminal hydroxyl group equivalent of the polycarbonate diol, and a hydroxyalkyl acrylate and/or hydroxyalkyl methacrylate.

[18]
A photosensitive resin composition for production of a printing plate or a blank printing plate, comprising a polymer (a) produced from polycarbonate diol according to any one of items [9] to [12].

[19]
The photosensitive resin composition for production of a printing plate or a blank printing plate according to item [18], wherein the polymer (a) is a polymer which has a chemical bond formed between a terminal hydroxyl group of the polycarbonate diol and another compound and which comprises a polymerizable unsaturated group.

[20]
The photosensitive resin composition for production of a printing plate or a blank printing plate according to item [19], wherein the chemical bond is a urethane bond.

[21]
The photosensitive resin composition for production of a printing plate or a blank printing plate according to item [19] or [20], wherein the polymerizable unsaturated group is a double bond.

[22]
The photosensitive resin composition for production of a printing plate or a blank printing plate according to any one of items [18] to [21], wherein the polymer (a) is a polymer according to any one of items [1] to [7] and [13] to [16].

[23]
The photosensitive resin composition for production of a printing plate or a blank printing plate according to any one of items [18] to [22], wherein the polymer (a) has a number-average molecular weight of from 1,000 to 100,000.

[24]
The photosensitive resin composition for production of a printing plate or a blank printing plate according to any one of items [18] to [23], wherein the photosensitive resin composition further comprises an organic compound (b) which has a polymerizable unsaturated group and which has a number-average molecular weight smaller than 5,000.

[25]
The photosensitive resin composition for production of a printing plate or a blank printing plate according to any one of items [18] to [24], wherein the photosensitive resin composition further comprises inorganic a fine particle (c).

[26]
The photosensitive resin composition for production of a printing plate or a blank printing plate according to any one of items [18] to [25], wherein the photosensitive resin composition further comprises a photopolymerization initiator (d).

[27]
The photosensitive resin composition for production of a printing plate or a blank printing plate according to any one of items [18] to [26], wherein the polymer (a) comprises an urethane-modified polycarbonate produced from polycarbonate diol according to any one of items [9] to [12] and an aromatic diisocyanate.

[28]
The photosensitive resin composition for production of a printing plate or a blank printing plate according to any one of items [18] to [27], wherein the photosensitive resin composition is for production of a laser-engravable blank printing plate.

[29]
A printing plate or a blank printing plate comprising a polymer (a) produced from the polycarbonate diol according to any one of items [9] to [12].

[30]
A printing plate or a blank printing plate which is produced using the photosensitive resin composition according to any one of items [18] to [28].

[31]
A printing plate or a blank printing plate which is produced by a process comprising the steps of:
molding the photosensitive resin composition according to any one of items [18] to [28] into a sheet or cylindrical form; and
crosslinking and curing the molded photosensitive resin composition by light or electron beam irradiation.

[32]
The printing plate or the blank printing plate according to any one of items [29] to [31], wherein the printing plate or the blank printing plate is laser-engravable.

[33]
The printing plate or the blank printing plate according to any one of items [29] to [32], wherein the printing plate or the blank printing plate is a flexographic printing plate or a flexographic blank printing plate.

[34]
A process for producing a conductive layer, comprising: transferring a conductive ink on a printing plate onto a substrate to be printed; and removing a solvent in the transferred conductive ink by drying or curing the transferred conductive ink by light irradiation such that the conductive ink is fixed on the substrate to be printed, wherein
the printing plate is a printing plate according to any one of items [29] to [33].

[35]
A process for producing an organic light-emitting layer, comprising: transferring an organic light-emitting ink on a printing plate onto a substrate to be printed; and removing a solvent in the transferred organic light-emitting ink by drying or curing the transferred organic light-emitting ink by light irradiation such that the organic light-emitting ink is fixed on the substrate to be printed, wherein
the printing plate is a printing plate according to any one of items [29] to [33].

[36]
A process for producing a liquid crystal orientation film, comprising: transferring a liquid crystal orientation film solution on a printing plate onto a substrate to be printed; and removing a solvent in the transferred liquid crystal orientation film solution by drying such that the liquid crystal orientation film solution is fixed on the substrate to be printed, wherein
the printing plate is a printing plate according to any one of items [29] to [33].

[37]
A process for producing a black matrix, comprising: transferring a coating composition for a black matrix on a printing plate onto a substrate to be printed; and removing a solvent in the transferred coating composition for a black matrix by drying or curing the transferred coating composition for a black matrix by light irradiation such that the coating composition for a black matrix is fixed on the substrate to be printed, wherein
the printing plate is a printing plate according to any one of items [29] to [33].

[38]
A process for producing a colored layer for a color filter, comprising: transferring an ink for a colored layer on a printing plate onto a substrate to be printed; and removing a solvent in the transferred ink for a colored layer by drying or curing the transferred ink for a colored layer by light irradiation such that the ink for a colored layer is fixed on the substrate to be printed, wherein
the printing plate is a printing plate according to any one of items [29] to [33].

[39]
A process for producing a photoelectric conversion layer for an organic thin-film solar cells, comprising: transferring an ink for a photoelectric conversion layer for an organic thin-film solar cells on a printing plate onto a substrate to be printed; and removing a solvent in the transferred ink for a photoelectric conversion layer for an organic thin-film solar cells by drying or curing the transferred ink for a photoelectric conversion layer for an organic thin-film solar cells by light irradiation such that the ink for a photoelectric conversion layer for an organic thin-film solar cells is fixed on the substrate to be printed, wherein
the printing plate is a printing plate according to any one of items [29] to [33].

[40]
A process for producing a patterned thin-film semiconductor layer, comprising: transferring an ink for thin-film semiconductor pattern formation on a printing plate onto a substrate to be printed; and removing a solvent in the transferred ink for thin-film semiconductor pattern formation by drying or curing the transferred ink for thin-film semiconductor pattern formation by light irradiation such that the ink for thin-film semiconductor pattern formation is fixed on the substrate to be printed, wherein
the printing plate is a printing plate according to any one of items [29] to [33].

[41]
A process for producing a photosensitive layer of an electrophotographic photoreceptor, comprising: transferring an ink for formation of a photosensitive layer of an electrophotographic photoreceptor on a printing plate onto a substrate to be printed; and removing a solvent in the transferred ink by drying or curing the transferred ink by light irradiation such that the ink is fixed on the substrate to be printed, wherein
the printing plate is a printing plate according to any one of items [29] to [33].

[42]
A process for producing an electron-accepting and/or electron-donating organic layers constituting a photovoltaic element for a photosensor, comprising: transferring an ink for an electron-accepting organic layer and/or ink for an electron-donating organic layer on a printing plate onto a substrate to be printed; and removing a solvent in the transferred ink for an electron-accepting organic layer and/or ink for an electron-donating organic layer by drying or curing the transferred ink for an electron-accepting organic layer and/or ink for an electron-donating organic layer by light irradiation such that the ink for an electron-accepting organic layer and/or ink for an electron-donating organic layer are fixed on the substrate to be printed, wherein
the printing plate is a printing plate according to any one of items [29] to [33].

[43]
A process for producing a polysilane thin film of an optical switching element, comprising: transferring a polysilane solution for formation of a polysilane thin film of an optical switching element on a printing plate onto a substrate to be printed; and removing a solvent in the transferred polysilane solution by drying such that the polysilane solution is fixed on the substrate to be printed, wherein
the printing plate is a printing plate according to any one of items [29] to [33].

[44]
A process for producing a bank, comprising: transferring a composition for bank formation on a printing plate onto a substrate to be printed; and removing a solvent in the transferred composition for bank formation by drying or curing the transferred composition for bank formation by light irradiation such that the composition for bank formation is fixed on the substrate to be printed, wherein
the printing plate is a printing plate according to any one of items [29] to [33].

[45]
A process for producing an organic light-emitting layer for illumination, a display, display backlight, interior, exterior, or surface-emitting light source, comprising: transferring an organic light-emitting ink on a printing plate onto a substrate to be printed; and removing a solvent in the transferred organic light-emitting ink by drying or curing the transferred organic light-emitting ink by light irradiation such that the organic light-emitting ink is fixed on the substrate to be printed, wherein
the printing plate is a printing plate according to any one of items [29] to [33].

Advantages of the Invention

The present invention can provide polycarbonate diol and a polymer excellent in solvent resistance. The present invention can further provide, by use of this polycarbonate diol or polymer, a printing plate or a blank printing plate that has excellent resistance to various solvents contained in inks and has significantly improved printing precision and printing durability.

Moreover, the present invention can provide an excellent printing plate or blank printing plate that offers high-quality printed matter in printing using aqueous inks.

Furthermore, the production method of the present invention can produce a conductive layer having a pattern with high definition and a uniform film thickness and provide a conductive circuit comprising the conductive layer. The process according to the present invention can produce an organic light-emitting layer having a pattern with high definition and a uniform film thickness and provide an organic EL element comprising the organic light-emitting layer as well as organic EL displays, illumination, displays, display backlights, interiors, exteriors, surface-emitting light sources, toys, cosmetics, novelty goods, and so on using the organic EL element. The process according to the present invention can efficiently produce a liquid crystal orientation film with a uniform film thickness and provide a liquid crystal display comprising the liquid crystal orientation film. The process according to the present invention can produce a black matrix with high precision. The process according to the present invention can produce a colored layer for a color filter with high precision. The process according to the present invention can produce a photoelectric conversion layer for organic thin-film solar cells with high precision and provide an organic thin-film solar cell comprising the photoelectric conversion layer for the organic thin-film solar cells. The process according to the present invention can produce a patterned thin-film semiconductor layer with high precision. The process according to the present invention can produce a photosensitive layer of an electrophotographic photoreceptor with high precision and provide an electrophotographic photoreceptor comprising the photosensitive layer. The process according to the present invention can produce electron-accepting and/or electron-donating organic layers constituting a photovoltaic element for a photosensor with high precision and provide a photovoltaic element for a photosensor and a photosensor comprising the electron-accepting and/or electron-donating organic layers. The process according to the present invention can produce a polysilane thin film of an optical switching element with high precision and provide an optical switching element comprising the polysilane thin film. The process according to the present invention can produce a bank with high precision. The process according to the present invention can produce an organic light-emitting layer for illumination, a display, display backlight, interior, exterior, or surface-emitting light source with high precision.

BEST MODE FOR CARRYING OUT THE INVENTION

Hereinafter, the best mode for carrying out the present embodiment (hereinafter, simply referred to as the "present embodiment") will be described in detail. However, the present embodiment is not intended to be limited to embodiments shown below, and various changes may be made therein without departing from the spirit of the present invention.

Polycarbonate diol of the present embodiment will be described.

An essential requirement is that the polycarbonate diol of the present embodiment comprises a repeating unit represented by the following formulas (1) and/or (2). The polycarbonate diol is used in the production of a printing plate or a blank printing plate.

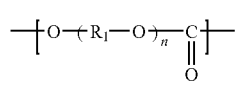 (1)

wherein $R_1$ represents a linear or branched hydrocarbon group having 2 to 50 carbon atoms; and n represents an integer of 2 to 50,

 (2)

wherein $R_2$ represents a linear or branched hydrocarbon group having 10 to 50 carbon atoms.

For performing excellent resistance to various solvents, it is required that the polycarbonate diol should comprise the repeating unit represented by the formulas (1) and/or (2).

In the formula (1), $R_1$ represents a linear or branched hydrocarbon group having 2 to 50 carbon atoms. $R_1$ may contain an unsaturated bond. The number of carbon atoms of $R_1$ of 2 or larger is preferable from the viewpoint of stability and solvent resistance. The number of carbon atoms of $R_1$ of 50 or smaller can permit favorable industrial production of the polycarbonate diol.

In the formula (1), $R_1$ may comprise a single component or a plurality of components. $R_1$ is preferably a polymethylene group represented by the following formula (5):

 (5)

wherein x represents an integer of 2 to 50, more preferably a polymethylene group represented by the formula (5) wherein x is 2 to 30.

In the formula (1), n represents an integer of 2 to 50. n of 2 or larger is preferable from the viewpoint of solvent resistance. n of 50 or smaller is preferable from the viewpoint of solvent resistance and can permit favorable industrial production of the polycarbonate diol. n is more preferably in the range of 2 to 30, even more preferably in the range of 2 to 12, from the viewpoint of easy availability and easy handleability.

In the formula (2), $R_2$ represents a linear or branched hydrocarbon group having 10 to 50 carbon atoms. $R_2$ may contain an unsaturated bond. The number of carbon atoms of $R_2$ of 10 or larger can allow excellent solvent resistance to be performed. The number of carbon atoms of $R_2$ of 50 or smaller can permit favorable industrial production of the polycarbonate diol.

In the formula (2), $R_2$ may comprise a single component or a plurality of components. $R_2$ is preferably a polymethylene group represented by the following formula (6):

 (6)

wherein y represents an integer of 10 to 50, more preferably a polymethylene group represented by the formula (6) wherein y is 10 to 30.

The branched hydrocarbon group is preferably a polyalkylene group having a structure represented by the formula (5) or (6) wherein one or more hydrogen atoms have been substituted by an alkyl group (e.g., methyl or ethyl group).

The polycarbonate diol of the present embodiment has hydroxyl groups at both the termini. These hydroxyl groups at both the termini work to bond the polycarbonate diol to another functional molecule or the like in the production of a photosensitive resin composition suitable for producing a highly solvent-resistant printing plate or blank printing plate.

It is preferred that the polycarbonate diol should have a number-average molecular weight of from 300 to 50,000. The number-average molecular weight of 300 or larger is preferable from the viewpoint of solvent resistance. The number-average molecular weight of 50,000 or smaller can permit favorable industrial production of the polycarbonate diol.

In the present embodiment, the number-average molecular weight (Mn) means a molecular weight calculated from a terminal group concentration and can be calculated from a polycarbonate diol OH value ([OHV]) according to a calculation formula described in Examples shown below.

The polycarbonate diol of the present embodiment can be produced from a diol compound HO—(R₁—O)ₙ—H or HO—R₂—OH corresponding to the formula (1) or (2), respectively, according to a method known in the art (e.g., Japanese Patent Publication No. 5-29648) or the like.

The polycarbonate diol is preferably a compound represented by the following formula (7) or (8):

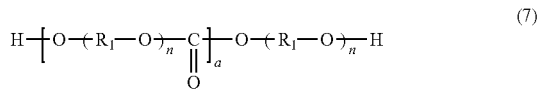

(7)

wherein $R_1$ each independently represents a linear or branched hydrocarbon group having 2 to 50 carbon atoms; n each independently represents an integer of 2 to 50; and a represents an integer of 1 or larger,

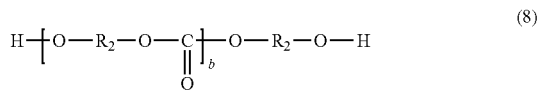

(8)

wherein $R_2$ each independently represents a linear or branched hydrocarbon group having 10 to 50 carbon atoms; and b represents an integer of 1 or larger.

Next, a polymer (a) of the present embodiment produced from the polycarbonate diol will be described.

The polymer (a) of the present embodiment is not particularly limited as long as it is produced from the polycarbonate diol. The polymer (a) is preferably a polymer which is produced through a chemical bond formed between a terminal hydroxyl group of the polycarbonate diol and another compound, and which comprises a polymerizable unsaturated group. The types of the chemical bond and the polymerizable unsaturated group are not particularly limited. The chemical bond is preferably, for example, a urethane bond. The polymerizable unsaturated group is preferably, for example, a double bond capable of participating in radical polymerization or addition polymerization. The polymer (a) having the polymerizable unsaturated group is preferable for producing a printing plate or a blank printing plate, since this polymer (a) can be linked to various molecules.

It is preferred that the polymer (a) should have a number-average molecular weight of from 1,000 to 100,000. The number-average molecular weight of 1,000 or larger is preferable from the viewpoint of solvent resistance. The number-average molecular weight of 100,000 or smaller is preferable from the viewpoint of convenient production.

The polymer (a) is preferably a polymer which is produced, for example, through a chemical bond formed between the terminal hydroxyl group of the polycarbonate diol and a compound having isocyanate groups, such as a polyisocyanate compound, isocyanatoalkyl acrylate, and isocyanatoalkyl methacrylate, and/or through a chemical bond of hydroxyalkyl acrylate and/or hydroxyalkyl methacrylate with the polyisocyanate compound, and has a polymerizable unsaturated group such as an acrylic or methacrylic group.

A first preferable example of the polymer (a) includes a polymer comprising: polycarbonate diol comprising the repeating unit represented by the formulas (1) and/or (2); a polyisocyanate compound having an isocyanate group equivalent less than the terminal hydroxyl group equivalent of the polycarbonate diol; and isocyanatoalkyl acrylate and/or isocyanatoalkyl methacrylate, wherein the polycarbonate diol and the polyisocyanate compound are polymerized through a urethane bond, and the residual terminal hydroxyl group of the polymerized polycarbonate diol is bonded to the isocyanatoalkyl acrylate and/or isocyanatoalkyl methacrylate through a urethane bond.

The polymer (a) of the first example is produced by reacting the terminal hydroxyl groups of the polycarbonate diol, the polyisocyanate compound having an isocyanate group equivalent less than the terminal hydroxyl group equivalent of the polycarbonate diol, and the isocyanatoalkyl acrylate and/or isocyanatoalkyl methacrylate.

In the present embodiment, the polyisocyanate compound is not limited as long as it is a compound having two or more isocyanate groups in one molecule. Examples of a diisocyanate compound may include: aromatic diisocyanates such as diphenylmethane diisocyanate, tolylene diisocyanate, tetramethylxylylene diisocyanate, xylylene diisocyanate, naphthylene diisocyanate, tolidine diisocyanate, and p-phenylene diisocyanate; and aliphatic or alicyclic diisocyanates such as hexamethylene diisocyanate, trimethylhexamethylene diisocyanate, isophorone diisocyanate, dicyclohexylmethane diisocyanate, cyclohexylene diisocyanate, and hydrogenated xylylene diisocyanate. Examples of a triisocyanate compound may include triphenylmethane triisocyanate and tri(isocyanatophenyl) triphosphate. Examples of a polyfunctional polyisocyanate compound may include polymeric (diphenylmethane diisocyanate). The polyisocyanate compound is preferably the diisocyanate compound, more preferably aromatic diisocyanate, even more preferably tolylene diisocyanate, from the viewpoint of the solvent resistance of the printing plate or the blank printing plate.

The isocyanate group equivalent less than the terminal hydroxyl group equivalent of the polycarbonate diol means that the isocyanate group equivalent (mol) of the polyisocyanate compound is less than the terminal hydroxyl group equivalent (mol) of the polycarbonate diol. The isocyanate group equivalent is not limited as long as it is less than the terminal hydroxyl group equivalent of the polycarbonate diol. The isocyanate group equivalent is preferably an equivalent of from 50 to 95%, more preferably from 60 to 90%, of the terminal hydroxyl group equivalent of the polycarbonate diol.

The isocyanatoalkyl acrylate and/or isocyanatoalkyl methacrylate are preferably, for example, compounds derived from the acrylate compounds whose alkyl moiety is, for example, an alkylene group having 2 to 10 carbon atoms, more preferably, for example, an alkylene group having 2 or 3 carbon atoms. Specific examples of the isocyanatoalkyl acrylate and/or isocyanatoalkyl methacrylate may include isocyanatoethyl (meth)acrylate and isocyanatopropyl (meth)acrylate.

Among such polymers (a), a polymer represented by the following formula (3) is preferable, since it exhibits exceedingly excellent solvent resistance:

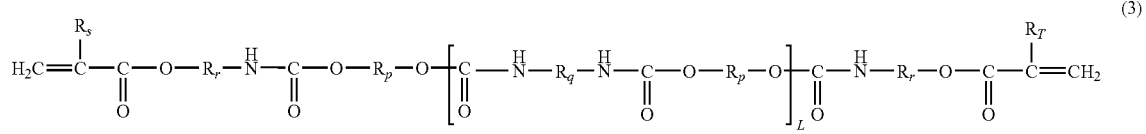

(3)

wherein $R_p$ each independently represents a residue, exclusive of both the terminal hydroxyl groups, of the polycarbonate diol comprising the repeating unit represented by the formulas (1) and/or (2); $R_q$ represents a residue of the diisocyanate compound exclusive of the isocyanate groups; $R_r$, represents the alkyl moiety of the isocyanatoalkyl acrylate and/or isocyanatoalkyl methacrylate; $R_S$ and $R_T$ each independently represent a methyl group or hydrogen atom; and L represents an integer of 1 or larger.

A second preferable example of the polymer (a) includes a polymer comprising: polycarbonate diol comprising the repeating unit represented by the formulas (1) and/or (2); a polyisocyanate compound having an isocyanate group equivalent exceeding the terminal hydroxyl group equivalent of the polycarbonate diol; and hydroxyalkyl acrylate and/or hydroxyalkyl methacrylate, wherein the polycarbonate diol and the polyisocyanate compound are polymerized through a urethane bond, and the residual isocyanate group of the polymerized polyisocyanate compound is bonded to the hydroxyalkyl acrylate and/or hydroxyalkyl methacrylate through a urethane bond.

The polymer (a) of the second example is produced by reacting the terminal hydroxyl groups of the polycarbonate diol, the polyisocyanate compound having an isocyanate group equivalent exceeding the terminal hydroxyl group equivalent of the polycarbonate diol, and the hydroxyalkyl acrylate and/or hydroxyalkyl methacrylate.

In the present embodiment, the polyisocyanate compound is not limited as long as it is a compound having two or more isocyanate groups in one molecule. Examples of a diisocyanate compound may include: aromatic diisocyanates such as diphenylmethane diisocyanate, tolylene diisocyanate, tetramethylxylylene diisocyanate, xylylene diisocyanate, naphthylene diisocyanate, tolidine diisocyanate, and p-phenylene diisocyanate; and aliphatic or alicyclic diisocyanates such as hexamethylene diisocyanate, trimethylhexamethylene diisocyanate, isophorone diisocyanate, dicyclohexylmethane diisocyanate, cyclohexylene diisocyanate, and hydrogenated xylylene diisocyanate. Examples of a triisocyanate compound may include triphenylmethane triisocyanate and tri(isocyanatophenyl)triphosphate. Examples of a polyfunctional polyisocyanate compound may include polymeric (diphenylmethane diisocyanate). The polyisocyanate compound is preferably the diisocyanate compound, more preferably aromatic diisocyanate, even more preferably tolylene diisocyanate, from the viewpoint of the solvent resistance of a printing plate or a blank printing plate.

The isocyanate group equivalent exceeding the terminal hydroxyl group equivalent of the polycarbonate diol means that the isocyanate group equivalent (mol) of the polyisocyanate compound exceeds the terminal hydroxyl group equivalent (mol) of the polycarbonate diol. The isocyanate group equivalent is not limited as long as it exceeds the terminal hydroxyl group equivalent of the polycarbonate diol. The isocyanate group equivalent is preferably an equivalent of from 105 to 150%, more preferably from 110 to 140%, of the terminal hydroxyl group equivalent of the polycarbonate diol.

The hydroxyalkyl acrylate and/or hydroxyalkyl methacrylate are preferably, for example, compounds derived from the acrylate compounds whose alkyl moiety is, for example, an alkylene group having 2 to 10 carbon atoms, more preferably, for example, an alkylene group having 2 or 3 carbon atoms. Specific examples of the hydroxyalkyl acrylate and/or hydroxyalkyl methacrylate may include hydroxyethyl (meth)acrylate and hydroxypropyl (meth)acrylate.

Among such polymers (a), a polymer represented by the following formula (4) is preferable, since it exhibits exceedingly excellent solvent resistance:

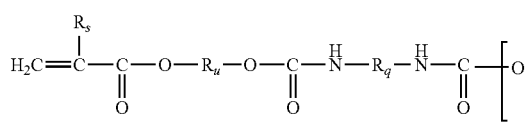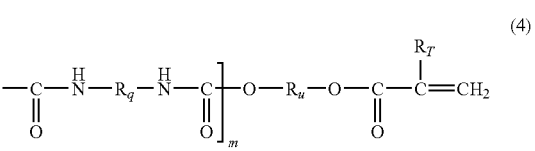

(4)

wherein $R_p$ each independently represents a residue, exclusive of both the terminal hydroxyl groups, of the polycarbonate diol comprising the repeating unit represented by the formulas (1) and/or (2); $R_q$ represents a residue of the diisocyanate compound exclusive of the isocyanate groups; $R_u$ represents the alkyl moiety of the hydroxyalkyl acrylate and/or hydroxyalkyl methacrylate; $R_S$ and $R_T$ each independently represent a methyl group or hydrogen atom; and m represents any integer of 1 or larger.

In the formulas (3) and (4), $R_p$ is preferably a residue, exclusive of both the terminal hydroxyl groups, of a compound represented by the formula (7) and/or (8):

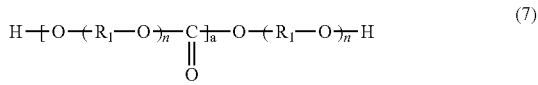

(7)

wherein $R_1$ each independently represents a linear or branched hydrocarbon group having 2 to 50 carbon atoms; n each independently represents an integer of 2 to 50; and a represents an integer of 1 or larger,

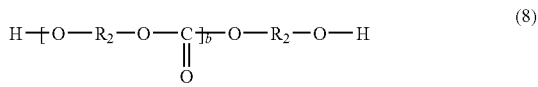

(8)

wherein $R_2$ each independently represents linear and/or branched hydrocarbon groups having 10 to 50 carbon atoms; and b represents an integer of 1 or larger.

In the formulas (3) and (4), examples of $R_q$ may include a residue, exclusive of the isocyanate groups, of the polyisocyanate compounds including: aromatic diisocyanates such as diphenylmethane diisocyanate, tolylene diisocyanate, tetramethylxylylene diisocyanate, xylylene diisocyanate, naphthylene diisocyanate, tolidine diisocyanate, and p-phenylene diisocyanate; and aliphatic or alicyclic diisocyanates such as hexamethylene diisocyanate, trimethylhexamethylene diisocyanate, isophorone diisocyanate, dicyclohexylmethane diisocyanate, cyclohexylene diisocyanate, and hydrogenated xylylene diisocyanate. Among them, $R_q$ is a preferably a residue of aromatic diisocyanate exclusive of the isocyanate groups, most preferably a residue of tolylene diisocyanate exclusive of the isocyanate groups.

In the formulas (3) and (4), $R_r$ and $R_u$ preferably represents an alkylene group having 2 to 10 carbon atoms, more preferably an alkylene group having 2 to 5 carbon atoms, even more preferably an ethylene or propylene group, further more preferably an ethylene group.

A process for producing the polymer (a) is not particularly limited, and the polymer (a) can be produced by, for example, the following method: the polymer (a) can be produced by: reacting the polycarbonate diol with the polyisocyanate compound having an isocyanate group equivalent less than the terminal hydroxyl group equivalent of the polycarbonate diol in the presence of a urethane-forming catalyst at 50 to 90° C. for 1 to 5 hours; and then adding the isocyanatoalkyl (meth) acrylate and a urethane-forming catalyst thereto, followed by reaction at 50 to 90° C. for 1 to 5 hours.

Alternatively, the polymer (a) can be produced by: reacting the polycarbonate diol with the polyisocyanate compound having an isocyanate group equivalent exceeding the terminal hydroxyl group equivalent of the polycarbonate diol in the presence of a urethane-forming catalyst at 50 to 90° C. for 1 to 5 hours; and then adding the hydroxyalkyl (meth)acrylate and a urethane-forming catalyst thereto, followed by reaction at 50 to 90° C. for 1 to 5 hours.

Next, a photosensitive resin composition of the present embodiment will be described.

An essential requirement for exerting excellent resistance to various solvents is that the photosensitive resin composition of the present embodiment comprises the polymer (a) produced from the polycarbonate diol. The photosensitive resin composition is used in the production of a printing plate or a blank printing plate.

In the photosensitive resin composition of the present embodiment, the polymer (a) is not particularly limited as long as it is the polymer produced from the polycarbonate diol. The polymer (a) is preferably a polymer which is produced through a chemical bond formed between a terminal hydroxyl group of the polycarbonate diol and another compound, and which has a polymerizable unsaturated group. The types of the chemical bond and the polymerizable unsaturated group are not particularly limited. The chemical bond is preferably a urethane bond. The polymerizable unsaturated group is preferably a double bond. In the photosensitive resin composition of the present embodiment, the polymer (a) produced through the formed urethane bond is preferably a polymer which comprises urethane-modified polycarbonate produced from the polycarbonate diol and aromatic diisocyanate. Moreover, the polymer (a) having the polymerizable unsaturated group is preferable for producing a printing plate or a blank printing plate using the photosensitive resin composition, since this polymer (a) can be linked to various molecules.

Specifically, the polymer (a) is preferably a polymer which is produced by reacting the polycarbonate diol (particularly, its terminal hydroxyl groups), a diisocyanate compound having an isocyanate group equivalent less than the terminal hydroxyl group equivalent of the polycarbonate diol, and isocyanatoalkyl acrylate and/or isocyanatoalkyl methacrylate or a polymer which is produced by reacting the polycarbonate diol (particularly, its terminal hydroxyl groups), a diisocyanate compound having an isocyanate group equivalent exceeding the terminal hydroxyl group equivalent of the polycarbonate diol, and hydroxyalkyl acrylate and/or hydroxyalkyl methacrylate.

Moreover, it is preferred that the polymer (a) should have a polymerizable unsaturated group. The polymer (a) having the polymerizable unsaturated group is advantageous for producing a blank printing plate or the like, since this polymer (a) can be linked to various molecules.

Furthermore, the polymer (a) is a preferably a polymer represented by the formula (3) or (4), since it is exceedingly excellent in solvent resistance.

It is preferred that the photosensitive resin composition of the present embodiment should comprise an organic compound (b) which has a polymerizable unsaturated group, and which has a number-average molecular weight smaller than 5,000.

In the present embodiment, the polymerizable unsaturated group means an unsaturated group that participates in radical polymerization or addition polymerization reaction. The polymerizable unsaturated group that participates in radical polymerization reaction is preferably, for example, an acrylic or methacrylic group. The polymerizable unsaturated group that participates in addition polymerization reaction is preferably, for example, an epoxy, oxetane, or vinyl ether group.

Specific examples of the organic compound (b) may include: olefins such as ethylene, propylene, styrene, and divinylbenzene; (meth)acrylic acid and derivatives thereof; haloolefins; unsaturated nitriles such as acrylonitrile; (meth) acrylamide and derivatives thereof; allyl compounds such as allyl alcohol and allyl isocyanate; unsaturated dicarboxylic acid and derivatives thereof such as maleic anhydride, maleic acid, and fumaric acid; vinyl acetates; N-vinylpyrrolidone; and N-vinylcarbazole.

These organic compounds (b) can be used alone or in combination of two or more of them according to purposes.

The organic compound (b) is preferably, for example, (meth)acrylic acid or derivatives thereof. Examples of the (meth)acrylic acid derivatives may include esters with the following compounds having an alcoholic hydroxyl group. Examples of the compounds may include: compounds having an alicyclic skeleton, such as cycloalkyl alcohol, bicycloalkyl alcohol, cycloalkenyl alcohol, and bicycloalkenyl alcohol; compounds having an aromatic skeleton, such as benzyl alcohol, phenol, and fluorenyl alcohol; and alkyl alcohol, alkyl halide alcohol, alkoxyalkyl alcohol, phenoxyalkyl alcohol, hydroxyalkyl alcohol, aminoalkyl alcohol, tetrahydrofurfuryl alcohol, and allyl alcohol. Alternatively, examples of the (meth)acrylic acid derivatives may also include esters with polyhydric alcohols such as glycidol, alkylene glycol, polyoxyalkylene glycol, (alkyl/allyloxy)polyalkylene glycol, and trimethylolpropane. Alternatively, when the (meth)acrylic acid derivatives are compounds comprising esters with compounds having an aromatic skeleton, examples thereof may also include organic compounds comprising esters with heteroaromatic compounds containing nitrogen, sulfur, or the like as a heteroatom.

Specific examples of the organic compound (b) may include phenoxyethyl (meth)acrylate, hydroxyethyl (meth) acrylate, diethylene glycol butyl ether (meth)acrylate, ethylene glycol phenyl ether (meth)acrylate, trimethylolpropane (meth)acrylate, and lauryl (meth)acrylate.

The organic compound (b) is preferably a compound having an epoxy group capable of ring-opening addition polymerization reaction. Examples of the compound having an epoxy group capable of ring-opening addition reaction may include: compounds obtained by reacting epichlorohydrin with various polyols such as diols or triols; and epoxy compounds obtained by reacting peracid with an intramolecular ethylene bond.

Specific examples thereof may include ethylene glycol diglycidyl ether, diethylene glycol diglycidyl ether, triethylene glycol diglycidyl ether, tetraethylene glycol diglycidyl ether, polyethylene glycol diglycidyl ether, polypropylene glycol diglycidyl ether, neopentyl glycol diglycidyl ether, 1,6-hexanediol diglycidyl ether, glycerin diglycidyl ether, glycerin triglycidyl ether, trimethylolpropane triglycidyl ether, bisphenol A diglycidyl ether, bisphenol F diglycidyl ether, bisphenol S propylene oxide diglycidyl ether, hydrogenated bisphenol A diglycidyl ether, diglycidyl ether of an ethylene oxide or propylene oxide adduct of bisphenol A, polytetramethylene glycol diglycidyl ether, poly(propylene glycol adipate)diol diglycidyl ether, poly(ethylene glycol adipate)diol diglycidyl ether, poly(caprolactone)diol diglycidyl ether, 3,4-epoxycyclohexylmethyl-3',4'-epoxycyclohexyl carboxylate, 1-methyl-3,4-epoxycyclohexylmethyl-1'-methyl-3',4'-epoxycyclohexyl carboxylate, bis[1-methyl-3,4-epoxycyclohexyl]adipate, vinylcyclohexene diepoxide, polyepoxy compounds obtained by reacting peracetic acid with polydiene such as polybutadiene or polyisoprene, and epoxidized soybean oil.

The photosensitive resin composition of the present embodiment, when made into a blank printing plate or printing plate, is characterized in that it has both of excellent resistance to various solvents and excellent laser engravability which is an important property for an approach of directly forming a relief pattern by means of a laser. For further improving laser engravability, it is preferred that the resin composition should further comprise inorganic fine particles (c). The inorganic fine particles (c) are not limited by material, form, and so on and are more preferably particles having a micropore or microvoid. The inorganic fine particles (c) have the function of effectively absorptively removing liquid debris generated by the laser decomposition of a blank printing plate. Therefore, the inorganic fine particles (c) contained in the photosensitive resin composition not only improve laser engraving precision of a relief pattern and but also make washing procedures after laser engraving exceedingly convenient.

The size of the inorganic fine particles (c) is not limited and is preferably 0.01 to 100 μm more preferably 0.1 to 20 μm even more preferably 1 to 10 μm in terms of an average particle size. The average micropore size of the inorganic fine particles (c) is not limited and is 1 to 1,000 nm, more preferably 2 to 200 nm, even more preferably 2 to 50 nm. The micropore volume of the inorganic fine particles (c) is not limited and is preferably 0.01 to 10 ml/g, more preferably 0.1 to 5 ml/g. The specific surface area of the inorganic fine particles (c) is not limited and is preferably 1 to 1,500 $m^2/g$, more preferably 10 to 800 $m^2/g$.

The shape of the inorganic fine particles (c) is not limited. For examples, particles in a spherical, flat, acicular, or amorphous shape or having surface protrusions can be used. Alternatively, for example, particles having an internal cavity or spherical granules having a uniform pore size, such as silica sponge, can also be used. Both of porous and nonporous inorganic fine particles can be used as the inorganic fine particles. For example, porous silica, mesoporous silica, silica-zirconia porous gel, mesoporous molecular sieves, porous alumina, porous glass, alumina, silica, zirconium oxide, barium titanate, strontium titanate, titanium oxide, silicon nitride, boron nitride, silicon carbide, chromium oxide, vanadium oxide, tin oxide, bismuth oxide, germanium oxide, aluminum boronate, nickel oxide, molybdenum oxide, tungsten oxide, iron oxide, and cerium oxide can be used. Moreover, those having an interlayer void of a few nm to 100 nm, such as layered clay compounds, can be used as the inorganic fine particles.

It is preferred that the photosensitive resin composition of the present embodiment should further comprise a photopolymerization initiator. The photopolymerization initiator may be selected appropriately from among those known in the art. For example, polymerization initiators such as radical polymerization, cationic polymerization, and anionic polymerization initiators can be used, which are illustrated in "Polymer Data Handbook-Basic Edition" (1986, published by BAIFU-KAN CO., LTD), ed., by The Society of Polymer Science, Japan.

The crosslinking of the photosensitive resin composition through photopolymerization using the photopolymerization initiator is useful as a process for producing a blank printing plate or printing plate with high productivity, with storage stability maintained.

The polymerization initiators known in the art that can be used as the photopolymerization initiator can be exemplified by: benzoin; benzoin alkyl ethers such as benzoin ethyl ether; acetophenones such as 2-hydroxy-2-methylpropiophenone, 4'-isopropyl-2-hydroxy-2-methylpropiophenone, 2,2-dimethoxy-2-phenylacetophenone, and diethoxyacetophenone; photoradical polymerization initiators such as 1-hydroxycyclohexyl phenyl ketone, 2-methyl-1-[4-(methylthio)phenyl]-2-morpholino-propane-1-one, methyl phenylglyoxylate, benzophenone, benzyl, diacetyl, diphenyl sulfide, eosin, thionine, and anthraquinones; photocationic polymerization initiators such as aromatic diazonium salt, aromatic iodonium salt, and aromatic sulfonium salt, which generate acids by light absorption; and photoanionic polymerization initiators which generate bases by light absorption.

The photosensitive resin composition is not limited and preferably comprises 5 to 200 parts by mass of the organic compound (b) having a polymerizable unsaturated group and 1 to 100 parts by mass of the inorganic fine particles (c), based on 100 parts by mass of the polymer (a) produced from the polycarbonate diol from the viewpoint of the solvent resistance of a blank printing plate or a printing plate. Moreover, the photosensitive resin composition more preferably comprises 10 to 180 parts by mass of the organic compound (b) having a polymerizable unsaturated group and 1 to 80 parts by mass of the inorganic fine particles (c), based on 100 parts by mass of the polymer (a) produced from the polycarbonate diol from the viewpoint of the solvent resistance of a printing plate. Furthermore, the photosensitive resin composition preferably comprises 1 to 100 parts by mass of the photopolymerization initiator from the viewpoint of the production efficiency of a blank printing plate, more preferably 1 to 80 parts by mass of the photopolymerization initiator from the viewpoint of the solvent resistance of a printing plate.

The photosensitive resin composition can be supplemented with a polymerization inhibitor, a UV absorber, a dye, a lubricant, a surfactant, a plasticizer, a flavor, and so on, according to applications and purposes. The total amount of these additives is preferably in a range of 10 parts by mass or lower, based on 100 parts by mass of the photosensitive resin composition.

Next, a printing plate and a blank printing plate of the present embodiment will be described.

The blank printing plate and the printing plate of the present embodiment are not limited as long as they comprise the polymer (a) produced from the polycarbonate diol. The blank printing plate and the printing plate are preferably those produced from the photosensitive resin composition. The blank printing plate and the printing plate are obtained, for example, by curing a resin composition comprising the polymer (a) produced from the polycarbonate diol comprising the repeating unit represented by the formulas (1) and/or (2). Preferably, the blank printing plate and the printing plate comprise a cured resin layer obtained by curing a resin composition layer comprising the resin composition. The blank printing plate and the printing plate are more preferably those produced by a method comprising: molding the photosensitive resin composition into a sheet or cylindrical form; and crosslinking and curing the molded photosensitive resin composition by light or electron beam irradiation.

A method for molding the photosensitive resin composition of the present embodiment into a sheet or cylindrical form is not limited, and an existing resin molding method can be used. The method can be exemplified by: a method comprising extruding a resin from a nozzle or die using a machine such as a pump or extruder and adjusting its thickness using a blade (casting method); and a method comprising calendering a resin using a roll and adjusting its thickness. The resin can also be molded under heat without deteriorating the performance thereof. Moreover, rolling treatment, grinding treatment, or the like may be performed, if necessary. Usually, the resin composition is molded on an underlay called a back film, which is made of a material such as PET (polyethylene terephthalate) or nickel. Alternatively, the resin composition can be molded directly on a cylinder of a printing machine. In this case, the resin composition can be molded into a seamless sleeve. Moreover, the resin composition can also be molded into a blank printing plate using a sleeve-forming/engraving apparatus (laser light source (for laser engraving)-equipped apparatus by which a liquid photosensitive resin composition is applied onto a cylindrical support and crosslinked and cured by light irradiation). When such an apparatus is used, laser engraving can be performed immediately after sleeve formation to form a printing plate. Therefore, molding can be achieved in a totally unthinkable shorter time than a few weeks required for a conventional rubber sleeve.

The printing plate of the present embodiment is preferably a printing plate which is obtained by laser-engraving a printing pattern onto the surface of the blank printing plate.

The format of the printing plate of the present embodiment is not limited. The printing plate can be used as every printing plate such as a flexographic plate, resin letterpress plate, or a blanket used in offset, dry offset, reverse offset, or gravure offset and is particularly preferably as a flexographic plate.

In the present embodiment, the printing plate or the blank printing plate produced from the polycarbonate diol comprising a repeating unit represented by the formulas (1) and/or (2) exhibits excellent resistance to various solvents belonging to, for example, groups shown below.

The printing plate or blank printing plate produced from the polycarbonate diol comprising the repeating unit represented by the formula (1) exhibits excellent resistance particularly to, for example, hexane, diethylene glycol diethyl ether, propylene glycol monomethyl ether acetate, ethylene glycol monobutyl ether, cyclohexanone, toluene, xylene, dichlorobenzene, methyl benzoate, and anisole.

The printing plate or blank printing plate produced from the polycarbonate diol comprising the repeating unit represented by the formula (2) exhibits excellent resistance particularly to, for example, γ-butyrolactone, methyl ethyl ketone, N-methyl-2-pyrrolidone, N,N-dimethylformamide, dimethyl sulfoxide, methyl benzoate, and anisole.

[Regarding Process for Producing Conductive Layer]

In the present embodiment, a conductive circuit refers to a circuit which is formed by patterning a conductive substance-containing thin film (conductive layer) obtained by transferring and fixing a conductive ink. Applications for which the conductive circuit is suitable are not particularly limited. Examples thereof may include: windows or walls of buildings; and electromagnetic shields or RFID tags in a cathode-ray tube (CRT), plasma display panel (PDP), liquid crystal panel, or the like.

In the present embodiment, the conductive ink is not particularly limited, and those of fixable types generally used are used which comprise a conductive substance, a binder component, a solvent, and other various additives added if necessary. The fixable types are generally classified into evaporatively dryable, UV-curable, and oxidatively polymerizable types. The conductive ink may be of any of these types and is preferably of an evaporatively dryable or UV-curable type from the viewpoint of productivity.

Resins selected according to these types are used as the binder component. When the ink is of an evaporatively dryable type, the ink contains a solvent in addition to the conductive substance and the binder component.

Examples of the conductive substance may include powders or fine particles of metallic elements such as gold, silver, copper, platinum, palladium, rhodium, ruthenium, indium, nickel, aluminum, and silicon, and/or metal oxides, metal nitrides, metal halides, metal sulfides, and metal carbides.

Examples of the binder component may include rosin, butyral, maleic acid, polyamide, urethane, epoxy, acrylic, alkyd, polyester, polystyrene, ethylcellulose, nitrocellulose, vinyl acetate, and polyvinyl alcohol resins and rubbers. The ink may contain two or more of these binder components, if necessary.

Moreover, examples of the solvent may include: hydrocarbon-based solvents such as hexane, heptane, octane, toluene, and xylene; ester-based solvents such as ethyl acetate, propyl acetate, butyl acetate, methyl benzoate, and ethyl benzoate; ether-based solvents such as tetrahydrofuran, oxirane, dibutyl ether, ethylene glycol monobutyl ether, and propylene glycol monoethyl ether; halogen-based solvents such as chloroform, dichloroethane, tetrachloroethylene, chlorobenzene, and dichlorobenzene; nitrogen-containing solvents such as methylpyrrolidone and pyridine; alcoholic solvents such as methanol, ethanol, isopropyl alcohol, isobutyl alcohol, and diacetone alcohol; and ketone-based solvents such as acetone and methyl ethyl ketone.

The type of the solvent in the solvent-containing ink is determined depending on the solubility of the polymer component in the solvent-containing ink, the drying property in a printing step, and so on. It is preferred that at least one solvent component selected from among the ester-based, ether-based, hydrocarbon-based, halogen-based, and nitrogen-containing solvents should be contained in an amount between 20% by mass and 100% by mass inclusive of the total solvent amount. The content of the solvent component between 20% by mass and 100% by mass inclusive can sufficiently dissolve or disperse an aromatic compound used in electronic material applications.

When the conductive ink is of a UV-curable type, a radical polymerizable compound is formulated with a cationic polymerization initiator capable of generating active cationic species by UV irradiation as an additive and is preferably used as the binder component.

The conductive ink used in the present embodiment may comprise additives, if necessary, in addition to the conductive substance, the binder component, and the solvent, for improving printing quality, productivity, thixotropy, and so on. Examples of these additives may include: dispersants such as citric acid and derivatives thereof and aniline and derivatives thereof; black pigments such as carbon black and iron oxide; thixotropy-imparting agents such as silica; thickeners such as mica, smectite, and cellulose; and silane coupling agents, leveling agents, wax, and polymerization initiators such as cationic polymerization initiators.

The film thickness of the conductive layer is between 1 nm and 10 μm inclusive, preferably between 5 nm and 5 μm inclusive, more preferably between 10 nm and 1 μm inclusive. The film thickness of 1 nm or larger can allow conductor functions to be performed. Alternatively, the film thickness of 10 μm or smaller can permit easy removal of the solvent component in the ink.

In the present embodiment, the resistance of the printing plate and the blank printing plate to the solvent contained in the conductive ink is evaluated by a solvent dipping/swelling test. The rate of mass change of the blank printing plate between before and after dipping in the solvent is preferably 10% by mass or less, more preferably 5% by mass or less.

In the present embodiment, the solvent dipping/swelling test is conducted by dipping a test sample in the solvent at room temperature for 24 hours. The rate of mass change, of 10% by mass or less, of the blank printing plate between before and after dipping not only achieves small dimensional change of the printing plate, fine pattern printing, and uniform application of the conductive layer but also can secure the dimensional stability of the printing plate. The resultant printing plate can have favorable durability and resist repetitive printing steps.

When a printing pattern is formed on the surface of the blank printing plate by laser engraving, the depth of the formed pattern is preferably between 1 μm and 1,000 μm inclusive, more preferably between 5 μm and 700 μm inclusive, even more preferably between 20 μm and 500 μm inclusive. The depth of the printing pattern of 1 μm or larger can allow the conductive ink transferred from the printing plate to be held on a substrate to be printed. The depth of 1,000 μm or smaller is preferable, since the printing pattern is neither deformed nor destroyed during a printing step.

A process for producing the conductive layer of the present embodiment is a process for producing a conductive layer, comprising: transferring a conductive ink on a printing plate onto a substrate to be printed; and removing a solvent in the transferred conductive ink by drying or curing the transferred conductive ink by light irradiation such that the conductive ink is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the conductive ink onto the substrate to be printed.

When the process of the present embodiment employs a flexographic printing technique, a method for transferring a conductive ink on a flexographic printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the conductive ink on the substrate to be printed is a method comprising removing, by drying, a solvent in the ink transferred by the method such that the conductive ink is fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the conductive ink on the substrate to be printed is a method comprising curing, by light irradiation, the ink transferred by the method such that the conductive ink is fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Organic Light-emitting Layer]

In the present embodiment, an organic EL element refers to an element which is formed by patterning a thin film (organic light-emitting layer) produced by transferring and fixing an organic light-emitting ink containing an organic light-emitting material. More specifically, the organic EL element is obtained by sequentially forming a hole transport layer, a light-emitting layer, and a negative electrode layer onto a substrate comprising an electrode formed thereon. Moreover, in the present embodiment, an organic EL display panel is a panel hermetically sealed with a glass cap for protecting the organic EL element thus obtained from oxygen or moisture in the external environment.

The organic light-emitting ink is not particularly limited, and those comprising an organic light-emitting material, a binder resin component, a solvent, and other various additives added if necessary can be used.

The organic light-emitting materials are classified into, for example, lower-molecular-weight organic light-emitting materials and high-molecular-weight (or polymer) organic light-emitting materials. Most low-molecular-weight organic light-emitting materials are made into a thin film by a vacuum process such as a deposition method, and a fine pattern is formed on the formed thin film. However, this method has the problem that the use of a larger substrate offers lower patterning precision. Moreover, the method also has the problem of poor throughput due to film formation in vacuum. Thus, a currently attempted method comprises dissolving a high-molecular-weight (or polymer) material in a solvent to prepare a coating solution, which is in turn used to form a thin film by a wet coating method.

Thus, in the present embodiment, high-molecular-weight (or polymer) organic light-emitting materials are preferably used. Examples thereof may include polymer (e.g., polystyrene, polymethyl methacrylate, or polyvinylcarbazole) dispersions of coumarin-based, perylene-based, pyrane-based, anthrone-based, porphyrin-based, quinacridone-based, N,N'-dialkyl-substituted quinacridone-based, naphthalimide-based, N,N'-diaryl-substituted pyrrolopyrrole-based, and iridium complex-based light-emitting dyes; and polymer materials such as polyarylene-based, polyarylene vinylene-based or polyfluorene materials.

Examples of the solvent may include single or mixed solvents of toluene, xylene, acetone, anisole, methyl ethyl ketone, methyl isobutyl ketone, and cyclohexanone. Among them, aromatic organic solvents such as toluene, xylene, and anisole are preferable in terms of the solubility of the organic light-emitting material.

In the present embodiment, the organic light-emitting ink may contain additives, if necessary, in addition to the organic light-emitting ink, the binder resin component, and the solvent, for improving printing quality, productivity, thixotropy, and so on.

The type of the solvent in the organic light-emitting ink is determined depending on the solubility of the polymer component in the ink, the drying property in a printing step, and so on. It is preferred that at least one solvent component selected from among the aromatic organic solvents should be contained in an amount between 20% by mass and 100% by mass inclusive of the total solvent amount. The content of the solvent component between 20% by mass and 100% by mass inclusive can sufficiently dissolve or disperse the organic light-emitting material used in organic light-emitting ink applications.

When the organic light-emitting ink used in the present embodiment is of a UV-curable type, a radical polymerizable compound is formulated with a cationic polymerization initiator capable of generating active cationic species by UV irradiation and is preferably used as the binder resin component.

In the present embodiment, the thickness of the organic light-emitting layer is preferably between 1 nm and 10 μm inclusive, more preferably between 5 nm and 5 μm inclusive, even more preferably between 10 nm and 1 μm inclusive, after the removal of the solvent component in the organic light-emitting ink by drying. The thickness of 1 nm or larger can allow organic light-emitting ink functions to be exerted. Alternatively, the thickness of 10 μm or smaller can permit easy removal of the solvent component in the organic light-emitting ink.

In the present embodiment, the resistance of the printing plate and the blank printing plate to the solvent contained in the organic light-emitting ink is evaluated by a solvent dipping/swelling test. The rate of mass change between before and after dipping in the solvent is preferably 10% by mass or less, more preferably 5% by mass or less.

In the present embodiment, the solvent dipping/swelling test is conducted by dipping a test sample in the solvent at room temperature for 24 hours. The rate of mass change, of 10% by mass or less, of the blank printing plate between before and after dipping not only achieves small dimensional change of the printing plate, fine pattern printing, and uniform application of the thin film but also can secure the dimensional stability of the printing plate. The resultant printing plate can have favorable durability and resist repetitive printing steps.

When a printing pattern is formed on the surface of the blank printing plate by laser engraving, the depth of the formed pattern is preferably between 1 μm and 1,000 μm inclusive, more preferably between 5 μm and 700 inclusive, even more preferably between 20 μm and 500 μm inclusive. The depth of the printing pattern of 1 μm or larger can allow the organic light-emitting ink transferred from the printing plate to be held on a substrate to be printed. The depth of 1,000 μm or smaller is preferable, since the printing pattern is neither deformed nor destroyed during a printing step.

A process for producing the organic light-emitting layer of the present embodiment is a process for producing an organic light-emitting layer, comprising: transferring an organic light-emitting ink on a printing plate onto a substrate to be printed; and removing a solvent in the transferred organic light-emitting ink by drying or curing the transferred organic light-emitting ink by light irradiation such that the organic light-emitting ink is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the organic light-emitting ink onto the substrate to be printed.

When the process of the present embodiment employs a flexographic printing technique, a method for transferring an organic light-emitting ink on a flexographic printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the organic light-emitting ink on the substrate to be printed is a method comprising removing, by drying, a solvent in the ink transferred by the method such that the organic light-emitting ink is fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the organic light-emitting ink on the substrate to be printed is a method comprising curing, by light irradiation, the ink transferred by the method such that the organic light-emitting ink is fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Liquid Crystal Orientation Film]

A liquid crystal orientation film solution used in the present embodiment is not particularly limited, and those comprising a liquid crystal orientation film material, a solvent, and other various additives added if necessary can be used.

An organic polymer used as the liquid crystal orientation film material is not particularly limited. Examples thereof may include polyimide resins generally used.

More specific examples thereof may include: an imidized polymer of polyamic acid (described in Japanese Patent Publication No. 5-60565 or Japanese Patent No. 2893671), polyamic acid (described in Japanese Patent No. 2600338), polyamic acid and/or a mixture of an imidized polymer (described in Japanese Patent Laid-Open No. 10-183120), and polyamic acid and/or a partially imidized polymer thereof (described in Japanese Patent Laid-Open No. 5-216044); a liquid crystal orientating agent comprising an epoxy group-containing compound having a particular structure as an essential component and a liquid crystal orientation film material comprising one or more polymers selected from the group consisting of polymers having a polyamic acid structure and/or polymers having an imide structure and an epoxy compound containing a nitrogen atom (Japanese Patent No. 3206401); and a composition containing polyamic acid and a monofunctional tertiary amine compound dissolved in a solvent (disclosed in Japanese Patent Laid-Open No. 5-203953).

The solvent is not particularly limited as long as it dissolves the organic polymer therein. Specifically, for example, N,N-dimethylformamide, N,N-dimethylacetamide, N-methyl-2-pyrrolidone, γ-butyrolactone, N-methylcaprolactam, dimethyl sulfoxide, and hexamethylphosphoramide are preferable in terms of solubility. A carbitol-based or cellosolve-based solvent can also be added, if necessary, for improving wettability.

In the present embodiment, the solid concentration of the liquid crystal orientation film solution differs depending on an application method and solution viscosity and is preferably in a range of from 0.1 to 10% by mass. The solid concentration of 0.1% by mass or higher can produce a favorable liquid crystal orientation film, since the film thickness of the liquid crystal orientation film can be controlled within a range shown below. Alternatively, the solid concentration of 10% by mass or lower can produce a favorable liquid crystal orientation film, since the film thickness of the liquid crystal orientation film can be controlled within a range shown below. Furthermore, the solid concentration of 10% by mass or lower is preferable from the viewpoint of applicability resulting from the viscosity of the liquid crystal orientation film solution.

In the present embodiment, the film thickness of the liquid crystal orientation film is preferably 0.001 to 1 μm, more preferably 0.005 to 0.5 μm, after the removal of the solvent component in the liquid crystal orientation film solution by drying. The film thickness of 0.001 μm or larger can achieve uniform orientation. Alternatively, the film thickness of 0.5 μm or smaller is preferable from the viewpoint of the staining of the liquid crystal orientation film as a coating and the drive voltage of an element.

In the present embodiment, the resistance of the printing plate and the blank printing plate to the solvent contained in the liquid crystal orientation film solution is evaluated by a solvent dipping/swelling test. The rate of mass change of the blank printing plate between before and after dipping in the solvent is preferably 10% by mass or less, more preferably 5% by mass or less.

In the present embodiment, the solvent dipping/swelling test is conducted by dipping a test sample in the solvent at room temperature for 24 hours. The rate of mass change, of 10% by mass or less, of the blank printing plate between before and after dipping not only achieves small dimensional change of the printing plate, fine pattern printing, and uniform application of the liquid crystal orientation film but also can secure the dimensional stability of the printing plate. The resultant printing plate can have favorable durability and resist repetitive printing steps.

When a printing pattern is formed on the surface of the blank printing plate by laser engraving, the depth of the formed pattern is preferably between 1 μm and 1,000 μm inclusive, more preferably between 5 μm and 700 μm inclusive, even more preferably between 20 μm and 500 μm inclusive. The depth of the printing pattern of 1 μm or larger can allow the liquid crystal orientation film solution transferred from the printing plate to be held on a substrate to be printed. The depth of 1,000 μm or smaller is preferable, since the printing pattern is neither deformed nor destroyed during a printing step.

A process for producing the liquid crystal orientation film of the present embodiment is a process for producing a liquid crystal orientation film, comprising: transferring a liquid crystal orientation film solution on a printing plate onto a substrate to be printed; and removing a solvent in the transferred liquid crystal orientation film solution by drying such that the liquid crystal orientation film solution is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the liquid crystal orientation film solution onto the substrate to be printed.

When the process of the present embodiment employs a flexographic printing technique, a method for transferring a liquid crystal orientation film solution on a flexographic printing plate onto a substrate to be printed is not particularly limited. Examples thereof may include a method comprising: supplying the liquid crystal orientation film solution onto the surface of a relief on a patterned flexographic printing plate by use of an ink-supplying roll or the like; and next bringing the flexographic printing plate into contact with a substrate to be printed such that the liquid crystal orientation film solution on the relief surface is transferred to the substrate to be printed.

In the process of the present embodiment, a method for fixing the liquid crystal orientation film solution on the substrate to be printed is a method comprising removing, by drying, a solvent in the liquid crystal orientation film solution transferred by the method such that the liquid crystal orientation film solution is fixed on the substrate to be printed.

Examples of a method for removing a solvent in the liquid crystal orientation film solution by drying such that the liquid crystal orientation film solution is fixed thereon may include a method comprising vaporizing the solvent by heat treatment in the presence of an inert gas such as nitrogen gas to dry the solution.

[Regarding Process for Producing Black Matrix]

In the present embodiment, a black matrix refers to a membrane which is formed by transferring and fixing a coating composition for a black matrix on a substrate made of glass or the like and is a black membrane for preventing color mixture.

In the present embodiment, the coating composition for a black matrix is not particularly limited, and those comprising a light-shielding material, a resin, a solvent and other various additives added if necessary can be used.

In the present embodiment, a black pigment such as chromium metal, chromium oxide, iron oxide, titanium black, molybdenum, tantalum, aluminum, or oxides thereof, titanium oxynitride, carbon black, or aniline black is used as the light-shielding material used in the coating composition for a black matrix. For example, a resin dispersion of the light-shielding material is used as the coating composition for a black matrix. Among them, a resin dispersion of chromium metal or a carbon or black pigment is preferable in terms of the light-shielding property, the film forming property, and so on.

In the present embodiment, the resin used in the coating composition for a black matrix is not particularly limited, and both photosensitive and nonphotosensitive resins can be used. Acrylic, acrylic epoxy, siloxane polymer-based, and polyimide-based (e.g., polyimide, silicon acid-containing polyimide, polyimide siloxane, and polymaleimide) resins generally used are preferably used.

The polyimide-based resin is formed, for example, by imidizing its precursor polyamic acid through ring closure reaction by heating. The polyamic acid is usually mainly composed of a structural unit represented by the following formula (9):

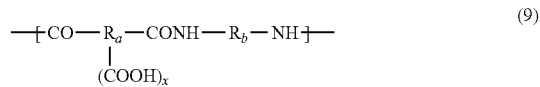

wherein x of formula (9) is an integer of 1 or 2. Ra and Rb each independently represent an organic group having at least two carbon atoms and each independently are preferably a cyclic hydrocarbon, aromatic ring-containing, or heteroaromatic ring-containing group having 6 to 30 carbon atoms from the viewpoint of heat resistance. Ra and Rb are not particularly limited, and examples thereof may include groups derived from phenyl, biphenyl, terphenyl, naphthalene, perylene, diphenyl ether, diphenyl sulfone, diphenylpropane, benzophenone, biphenyl trifluoropropane, diphenylmethane, and cyclohexylmethane groups.

The solvent is not particularly limited as long as it dissolves the resin therein. Specifically, for example, amide-based solvents (e.g., N,N-dimethylformamide, N,N-dimethylacetamide, and N-methyl-2-pyrrolidone), lactone-based polar solvents (e.g., β-propiolactone, γ-butyrolactone, γ-valerolactone, δ-valerolactone, γ-caprolactone, and ε-caprolactone), dimethyl sulfoxide, and hexamethylphosphoramide are preferable in terms of solubility. Among them, γ-butyrolactone is preferable in terms of the solubility of the polyimide precursor.

The coating composition for a black matrix of the present embodiment may be supplemented with pigments of complementary colors in small amounts which do not reduce the light-shielding performance. Examples of the pigments of complementary colors may include one or more pigments selected from blue pigments, purple pigments, green pigments, yellow pigments, and orange pigments. The proportion of the pigments of complementary colors to the light-shielding material is preferably 10% by mass or lower. The pigments of complementary colors contained at a proportion exceeding this range are not preferable, since they reduce the light-shielding performance of the black matrix.

In the present embodiment, the resistance of the printing plate and the blank printing plate to the solvent contained in the coating composition for a black matrix is evaluated by a solvent dipping/swelling test. The rate of mass change of the blank printing plate between before and after dipping in the solvent is preferably 10% by mass or less, more preferably 5% by mass or less.

In the present embodiment, the solvent dipping/swelling test is conducted by dipping a test sample in the solvent at room temperature for 24 hours. The rate of mass change, of 10% by mass or less, of the blank printing plate between before and after dipping not only achieves small dimensional change of the printing plate, fine pattern printing, and uniform application of the black matrix but also can secure the dimensional stability of the printing plate. The resultant printing plate can have favorable durability and resist repetitive printing steps.

In the present embodiment, when a pattern is formed on the surface of the blank printing plate by laser engraving, the depth of the formed pattern is preferably between 1 μm and 1,000 μm inclusive, more preferably between 5 μm and 700 μm inclusive, even more preferably between 20 μm and 500 μm inclusive, though differing depending on the type of a printing method. The depth of 1 μm or larger can allow the coating composition for a black matrix transferred from the printing plate to be held on a substrate to be printed. The depth of 1,000 μm or smaller is preferable, since the pattern is neither deformed nor destroyed during a printing step.

In a printing method according to the present embodiment, the thickness of the black matrix printable on a substrate to be printed is not particularly limited as long as it falls within a range available as a black matrix after the removal of the solvent component in the coating composition for a black matrix by drying. The thickness is preferably 0.5 to 2.0 μm, more preferably 0.7 to 1.5 μm.

A process for producing the black matrix of the present embodiment is a process for producing a black matrix, comprising: transferring a coating composition for a black matrix on a printing plate onto a substrate to be printed; and removing a solvent in the transferred coating composition for a black matrix by drying or curing the transferred coating composition for a black matrix by light irradiation such that the coating composition for a black matrix is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the coating composition for a black matrix onto the substrate to be printed.

When the process of the present embodiment employs a flexographic printing technique, a method for transferring a coating composition for a black matrix on a flexographic printing plate onto a substrate to be printed is not particularly limited. Examples thereof may include a method comprising: supplying the coating composition for a black matrix onto the surface of a relief on a patterned flexographic printing plate by use of an ink-supplying roll or the like; and next bringing the flexographic printing plate into contact with a substrate to be printed such that the coating composition for a black matrix on the relief surface is transferred to the substrate to be printed.

In the process of the present embodiment, a first aspect of a method for fixing the coating composition for a black matrix on the substrate to be printed is a method comprising removing, by drying, a solvent in the coating composition for a black matrix transferred by the method such that the coating composition for a black matrix is fixed on the substrate to be printed.

Examples of a method for removing a solvent in the coating composition for a black matrix by drying such that the coating composition for a black matrix is fixed thereon may include a method comprising vaporizing the solvent by heat treatment in the presence of an inert gas such as nitrogen gas to dry the composition.

In the process of the present embodiment, a second aspect of a method for fixing the coating composition for a black matrix on the substrate to be printed is a method comprising curing, by light irradiation, the coating composition for a black matrix transferred by the method such that the coating composition for a black matrix is fixed on the substrate to be printed.

Examples of a method for curing the coating composition for a black matrix by light irradiation such that the coating composition for a black matrix is fixed thereon may include a method comprising photo-curing a photopolymerizable monomer formulated in the coating composition for a black matrix, such as (meth)acrylic acid derivatives.

[Regarding Process for Producing Colored Layer for color Filter]

An ink for a colored layer for a color filter of the present embodiment is not particularly limited, and those comprising a pigment, a resin, a solvent, and other various additives added if necessary can be used.

The pigment used in the ink for a colored layer for a color filter of the present embodiment is not particularly limited and is preferably a pigment excellent in light resistance, heat resistance, and chemical resistance. Specific examples of typical pigments are indicated in Color Index (CI) No. Examples of yellow pigments may include Pigment Yellow 12, 13, 14, 17, 20, 24, 83, 86, 93, 94, 109, 110, 117, 125, 137, 138, 139, 147, 148, 150, 153, 154, 166, and 173. Examples of orange pigments may include Pigment Orange 13, 31, 36, 38, 40, 42, 43, 51, 55, 59, 61, 64, and 65. Examples of red pigments may include Pigment Red 9, 97, 122, 123, 144, 149, 166, 168, 177, 190, 192, 215, 216, and 224. Examples of purple pigments may include Pigment Violet 19, 23, 29, 32, 33, 36, 37, and 38. Examples of blue pigments may include Pigment Blue 15 (15:3, 15:4, 15:6, etc.), 21, 22, 60, and 64. In this context, the pigment used may be surface-treated, if necessary, by rosin treatment, acidic group treatment, or basic group treatment. Moreover, the surface of the pigment used may be coated, if necessary, with a resin for improving adhesion to a black matrix.

The resin used in the ink for a colored layer for a color filter of the present embodiment is not particularly limited, and an acrylic resin, polyvinyl alcohol, polyamide, polyimide, or the like can be used. A resin membrane comprising the pigment dispersed therein is preferably used as pixels in terms of an easy production process, heat resistance, light resistance, and so on. A photosensitive acrylic resin comprising the pigment dispersed therein is preferably used in terms of easy pattern formation. A polyimide-based resin comprising the pigment dispersed therein is preferably used from the viewpoint of heat resistance and chemical resistance.

The polyimide-based resin is formed, for example, by imidizing its precursor polyamic acid through ring closure reaction by heating. The polyamic acid is usually mainly composed of a structural unit represented by the following formula (9):

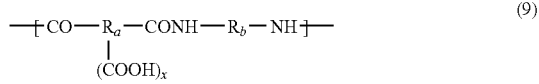

(9)

wherein x of formula (9) is an integer of 1 or 2. Ra and Rb each independently represent an organic group having at least two carbon atoms and each independently are preferably a cyclic hydrocarbon, aromatic ring-containing, or heteroaromatic ring-containing group having 6 to 30 carbon atoms from the viewpoint of heat resistance. Ra and Rb are not particularly limited, and examples thereof may include groups derived from phenyl, biphenyl, terphenyl, naphthalene, perylene, diphenyl ether, diphenyl sulfone, diphenylpropane, benzophenone, biphenyl trifluoropropane, diphenylmethane, and cyclohexylmethane groups.

The solvent is not particularly limited as long as it dissolves the resin therein. Specifically, for example, amide-based solvents (e.g., N,N-dimethylformamide, N,N-dimethylacetamide, and N-methyl-2-pyrrolidone), lactone-based polar solvents (e.g., β-propiolactone, γ-butyrolactone, γ-valerolactone, δ-valerolactone, γ-caprolactone, and ε-caprolactone), dimethyl sulfoxide, and hexamethylphosphoramide are preferable in terms of solubility. Among them, γ-butyrolactone is preferable in terms of the solubility of the polyimide precursor.

In a printing method according to the present embodiment, the thickness of the colored layer for a color filter printable on a substrate to be printed is not particularly limited as long as it falls within a range available as a colored layer. The thickness is preferably 0.1 to 10 μm, more preferably 0.2 to 7 μm.

In the present embodiment, the resistance of the printing plate and the blank printing plate to the solvent contained in the ink for a colored layer is evaluated by a solvent dipping/swelling test. The rate of mass change between before and after dipping in the solvent is preferably 10% by mass or less, more preferably 5% by mass or less.

In the present embodiment, the solvent dipping/swelling test is conducted by dipping a test sample in the solvent at room temperature for 24 hours. The rate of mass change, of 10% by mass or less, of the blank printing plate between before and after dipping not only achieves small dimensional change of the printing plate, fine pattern printing, and uniform application of the thin film but also can secure the dimensional stability of the printing plate. The resultant printing plate can have favorable durability and resist repetitive printing steps.

In the present embodiment, when a pattern is formed on the surface of the blank printing plate by laser engraving, the depth of the formed pattern is preferably between 1 μm and 1,000 μm inclusive, more preferably between 5 μm and 700 μm inclusive, even more preferably between 20 μm and 500 μm inclusive, though differing depending on the type of a printing method. The depth of 1 μm or larger can allow the ink for a colored layer transferred from the printing plate to be held on a substrate to be printed. The depth of 1,000 μm or smaller is preferable, since the pattern is neither deformed nor destroyed during a printing step.

A process for producing the colored layer for a color filter of the present embodiment is a process for producing a colored layer for a color filter, comprising: transferring an ink for a colored layer on a printing plate onto a substrate to be printed; and removing a solvent in the transferred ink for a colored layer by drying or curing the transferred ink for a colored layer by light irradiation such that the ink for a colored layer is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the ink for a colored layer onto the substrate to be printed.

When the process of the present embodiment employs a flexographic printing technique, a method for transferring an ink for a colored layer on a flexographic printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the ink for a colored layer on the substrate to be printed is a method comprising removing, by drying, a solvent in the ink transferred by the method such that the ink for a colored layer is fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the ink for a colored layer on the substrate to be printed is a method comprising curing, by light irradiation, the ink transferred by the method such that the ink for a colored layer is fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Photoelectric Conversion Layer for Organic Thin-film Solar Cells]

In the present embodiment, a photoelectric conversion layer for organic thin-film solar cells means a member which contributes to charge separation in an organic thin-film solar cell and has the function of transporting formed electrons and holes toward electrodes in directions opposite to each other. Specific examples of such a photoelectric conversion layer can may include: a member comprising at least one of a hole transport layer functioning as an electron donor and an electron transport layer functioning as an electron acceptor; and a member comprising an electron/hole transport layer having both of electron donor and electron acceptor functions. The organic thin-film solar cell is not limited, and specific examples thereof may include: a Schottky-type organic thin-film solar cell which utilizes a Schottky barrier between an electrode and a photoelectric conversion layer, and which comprises the photoelectric conversion layer disposed between first and second electrode layers, wherein the photoelectric conversion layer has one of electron-donating and electron-accepting functions, that is, is one of the electron transport and hole transport layers; and a heterojunction-type organic thin-film solar cell which utilizes a p-n junction and comprises a set of electron-accepting and electron-donating functions.

(a) Schottky-type Organic Thin-film Solar Cell

When the photoelectric conversion layer is prepared as a layer having one of electron-donating and electron-accepting functions, that is, is one of electron transport and hole transport layers, a Schottky-type organic thin-film solar cell can be prepared which utilizes a Schottky barrier formed at the interface between such a photoelectric conversion layer and an electrode to obtain photoelectric current. For example, when the photoelectric conversion layer is a hole transport layer, a Schottky barrier is formed at its interface with an electrode having a smaller work function, of the first and second electrodes. Therefore, photocharge separation can occur at the interface. On the other hand, when the photoelectric conversion layer is an electron transport layer, photoelectric current can be generated at its interface with an electrode having a larger work function, of the first and second electrodes.

Thus, a material for forming the photoelectric conversion layer in the Schottky-type organic thin-film solar cell is not particularly limited as long as it is a material having an electron-donating or electron-accepting property. Specific examples thereof may include: organic monocrystal such as pentacene; conductive polymers and derivatives thereof such as poly-3-methylthiophene, polyacetylene, polyphenylene and derivatives thereof, polyphenylene vinylene and derivatives thereof, polysilane and derivatives thereof, and polyalkylthiophene and derivatives thereof; synthetic dyes such as porphyrin derivatives, phthalocyanine derivatives, merocyanine derivatives, and chlorophyll; and organic metal polymers.

The film thickness of the photoelectric conversion layer is preferably in a range of from 0.1 nm to 1,500 nm. The film thickness of the photoelectric conversion layer of 1,500 nm or smaller is preferable from the viewpoint of membrane resistance. Alternatively, the film thickness of the photoelectric conversion layer of 0.1 nm or larger can prevent short-circuit between the first and second electrode layers. The film thickness of the photoelectric conversion layer is more preferably in a range of from 5 nm to 300 nm from the viewpoint of overall performance.

(b) Heterojunction-type Organic Thin-film Solar Cell

The heterojunction-type organic thin-film solar cells can be classified into bilayer and bulk heterojunction types.

i. Bilayer-type Organic Thin-film Solar Cell

The bilayer-type organic thin-film solar cell is an organic thin-film solar cell which is obtained by separately forming, as photoelectric conversion layers, an electron transport layer having an electron-accepting function and a hole transport layer having an electron-donating function. The bilayer-type organic thin-film solar cell utilizes a p-n junction formed at the interface therebetween, at which photocharge separation occurs to give photoelectric current.

The film thicknesses of the electron transport and hole transport layers such photoelectric conversion layers are not particularly limited. Specifically, each of the film thicknesses is preferably in a range of from 0.1 nm to 1,500 nm. The film thickness of each photoelectric conversion layer of 1,500 nm or smaller is preferable from the viewpoint of membrane resistance. Alternatively, the film thickness of each photoelectric conversion layer of 0.1 nm or larger can prevent short-circuit between the first and second electrode layers. The film thickness of each photoelectric conversion layer is more preferably in a range of from 5 nm to 300 nm from the viewpoint of overall performance.

A material for forming the electron transport layer is not particularly limited as long as it has a function as an electron acceptor. Specific examples thereof may include materials such as CN-poly(phenylene-vinylene), MEH-CN-PPV, —CN group- or —CF$_3$ group-containing polymers, —CF$_3$-substituted polymers thereof, poly(fluorene) derivatives, fullerene derivatives (e.g., C$_{60}$), carbon nanotube, perylene derivatives, polycyclic quinone, and quinacridone. Among them, a material having high electron mobility is preferable.

On the other hand, a material for forming the hole transport layer is not particularly limited as long as it has a function as an electron donor. Specific examples thereof may include polyphenylene and derivatives thereof, polyphenylene vinylene and derivatives thereof, polysilane and derivatives thereof, polyalkylthiophene and derivatives thereof, porphyrin derivatives, phthalocyanine derivatives, and organic metal polymers. Among them, a material having high hole mobility is preferable.

ii. Bulk Heterojunction-type Organic Thin-film Solar Cell

The bulk heterojunction-type organic thin-film solar cell is a solar cell which is obtained by preparing, as a photoelectric conversion layer, an electron/hole transport layer having both of electron-accepting and electron-donating functions. The bulk heterojunction-type organic thin-film solar cell utilizes a p-n junction formed within the electron/hole transport layer, at which photocharge separation occurs to give photoelectric current.

The film thickness of such an electron/hole transport layer is not particularly limited as long as it is a film thickness generally adopted in the bulk heterojunction type. Specifically, the film thickness is preferably in a range of from 0.2 nm to 3,000 nm. The film thickness of the electron/hole transport layer of 3,000 nm or smaller is preferable from the viewpoint of membrane resistance. Alternatively, the film thickness of the electron/hole transport layer of 0.2 nm or larger can prevent short-circuit between the first and second electrode layers. The film thickness of the electron/hole transport layer is more preferably in a range of from 10 nm to 600 nm from the viewpoint of overall performance.

Furthermore, a material for forming the electron/hole transport layer is not particularly limited as long as it is generally used in the bulk heterojunction-type organic thin-film solar cell. Specific examples thereof may include uniform dispersions of both of electron-donating and electron-accepting materials. Moreover, the ratio of the electron-donating and electron-accepting materials mixed is appropriately adjusted to the optimum ratio for the materials used.

Examples of the electron-accepting material may specifically include materials such as CN-poly(phenylene-vinylene), MEH-CN-PPV, —CN group- or —CF$_3$ group-containing polymers, —CF$_3$-substituted polymers thereof, poly(fluorene) derivatives, C$_{60}$ derivatives, carbon nanotube, perylene derivatives, polycyclic quinone, and quinacridone. Among them, a material having high electron mobility is preferable.

On the other hand, the electron-donating material is not particularly limited as long as it has such a function. Specific examples thereof may include polyphenylene and derivatives thereof, polyphenylene vinylene and derivatives thereof, polysilane and derivatives thereof, polyalkylthiophene and derivatives thereof, porphyrin derivatives, phthalocyanine derivatives, and organic metal polymers. Among them, a material having high hole mobility is preferable. Moreover, in the finally obtained organic thin-film solar cell, the number of the electron/hole transport layer may be one or several.

A solvent used in an ink for a photoelectric conversion layer for the organic thin-film solar cells is not particularly limited as long as it dissolves therein both the electron-donating and electron-accepting materials. Specific examples thereof may include: hydrocarbon-based solvents such as toluene, xylene, mesitylene, tetralin, decalin, and n-butylbenzene; ketone-based solvents such as methyl ethyl ketone and cyclohexanone; halogen-based solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; and ether-based solvents such as tetrahydrofuran. These solvents can usually dissolve therein 0.1% by mass or more of the electron-donating and electron-accepting materials, depending on the chemical structures or molecular weights of the materials. These solvents can be used alone or as a mixed solvent of two or more of them.

When the ink for a photoelectric conversion layer for the organic thin-film solar cells is cured by light irradiation, the ink may contain a photopolymerizable monomer. Examples of the photopolymerizable monomer may include urethane acrylate and epoxy acrylate.

In the present embodiment, the resistance of the printing plate and the blank printing plate to the solvent contained in the ink for a photoelectric conversion layer for the organic thin-film solar cells can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change, of 10% by mass or less, of the blank printing plate between before and after dipping achieves small dimensional change of the printing plate, fine pattern printing, and uniform application of the organic thin film. Moreover, the rate of mass change of 10% by mass or less can secure the dimensional stability of the printing plate. The resultant printing plate can have favorable durability and resist repetitive printing steps.

When a printing pattern is formed on the surface of the blank printing plate by laser engraving, the depth of the formed pattern is preferably between 1 μm and 1,000 μm inclusive, more preferably between 5 μm and 700 μm inclusive, even more preferably between 20 μm and 500 μm inclusive. The depth of the printing pattern of 1 μm or larger can allow the ink for a photoelectric conversion layer for the organic thin-film solar cells transferred from the printing plate to be held on a substrate to be printed. The depth of 1,000 μm or smaller is preferable, since the printing pattern is neither deformed nor destroyed during a printing step.

A process for producing the photoelectric conversion layer for the organic thin-film solar cells of the present embodiment is a process for producing a photoelectric conversion layer for an organic thin-film solar cells, comprising: transferring an ink for a photoelectric conversion layer for an organic thin-film solar cells on a printing plate onto a substrate to be printed; and removing a solvent in the transferred ink for a photoelectric conversion layer for an organic thin-film solar cells by drying or curing the transferred ink for a photoelectric conversion layer for an organic thin-film solar cells by light irradiation such that the ink for a photoelectric conversion layer for an organic thin-film solar cells is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the ink for a photoelectric conversion layer for an organic thin-film solar cells onto the substrate to be printed.

When the process of the present embodiment employs a flexographic printing technique, a method for transferring an ink for a photoelectric conversion layer for the organic thin-film solar cells on a flexographic printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the ink for a photoelectric conversion layer for the organic thin-film solar cells on the substrate to be printed is a method comprising removing, by drying, a solvent in the ink transferred by the method such that the ink for a photoelectric conversion layer for an organic thin-film solar cells is fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the ink for a photoelectric conversion layer for an organic thin-film solar cells on the substrate to be printed is a method comprising curing, by light irradiation, the ink transferred by the method such that the ink for a photoelectric conversion layer for an organic thin-film solar cells is fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Patterned Thin-film Semiconductor Layer]

In the present embodiment, an organic semiconductor material used in an ink for thin-film semiconductor pattern formation is not particularly limited, and pi-conjugated materials and the like can be used. Examples of the material that can be used may include: polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylene vinylenes such as polythienylene vinylene; poly(p-phenylene vinylene)s such as poly(p-phenylene vinylene); polyanilines such as polyaniline, poly(N-substituted aniline), poly(3-substituted aniline), and poly(2,3-substituted aniline); polyacetylenes such as polyacetylene; polydiacetylenes such as polydiacetylene; polyazulenes such as polyazulene; polypyrenes such as polypyrene; polycarbazoles such as polycarbazole and poly(N-substituted carbazole); polyselenophenes such as polyselenophene; polyfurans such as polyfuran and polybenzofuran; poly(p-phenylene)s such as poly(p-phenylene); polyindoles such as polyindole; polypyridazines such as polypyridazine; polyacenes such as naphthacene, pentacene, hexacene, heptacene, dibenzopentacene, tetrabenzopentacene, pyrene, dibenzopyrene, chrysene, perylene, coronene, terrylene, ovalene, quaterrylene, and circumanthracene, and derivatives thereof wherein the carbon atoms of the polyacenes have been partially substituted by an atom such as N, S, or O or by a functional group such as a carbonyl group (triphenodioxazine, triphenodithiazine, hexacene-6, 15-quinone, etc.); polymers such as polyvinylcarbazole, polyphenylene sulfide, and polyvinylene sulfide; and a polycyclic condensation product disclosed in Japanese Patent Laid-Open No. 11-195790.

Moreover, oligomers having the same repeating units as in these polymers, for example, thiophene hexamers including α-sexithiophene, α,ω-dihexyl-α-sexithiophene, α,ω-dihexyl-α-quinquethiophene, α,ω-bis(3-butoxypropyl)-α-sexithiophene, and styrylbenzene derivatives can also be used preferably.

Furthermore, examples thereof may include: metal phthalocyanines such as copper phthalocyanine and fluorine-substituted copper phthalocyanine disclosed in Japanese Patent Laid-Open No. 11-251601; condensed-ring tetracarboxylic diimides such as naphthalene tetracarboxylic diimides (e.g., naphthalene 1,4,5,8-tetracarboxylic diimide, N,N'-bis(4-trifluoromethylbenzyl)naphthalene 1,4,5,8-tetracarboxylic diimide, N,N'-bis(1H,1H-perfluorooctyl)-, N,N'-bis(1H,1H-perfluorobutyl)-, and N,N'-dioctyl naphthalene-1,4,5,8-tetracarboxylic diimide derivatives, and naphthalene-2,3,6,7-tetracarboxylic diimide) and anthracene tetracarboxylic diimides (e.g., anthracene-2,3,6,7-tetracarboxylic diimide); fullerenes such as $C_{60}$, $C_{70}$, $C_{76}$, $C_{78}$, and $C_{84}$; carbon nanotube such as SWNT; and dyes such as merocyanine dyes and hemicyanine dyes.

Of these pi-conjugated materials, at least one is preferable which is selected from the group consisting of thiophene, vinylene, thienylene vinylene, phenylene vinylene, p-phenylene, substitution products thereof, oligomers comprising two or more of them as repeating units wherein the number n of the repeating unit is 4 to 10, polymers comprising these repeating units wherein the number n of the repeating units is 20 or larger, condensed polycyclic aromatic compounds (e.g., pentacene), fullerenes, condensed-ring tetracarboxylic diimides, and metal phthalocyanine.

Moreover, other organic semiconductor materials can also be used, such as organic molecular complexes including a tetrathiafulvalene (TTF)-tetracyanoquinodimethane (TCNQ) complex, a bis(ethylenedithio)tetrathiafulvalene (BEDTTTF)-perchloric acid complex, a BEDTTTF-iodine complex, and a TCNQ-iodine complex. Furthermore, sigma-conjugated polymers (e.g., polysilane and polygermane) and an organic/inorganic hybrid material disclosed in Japanese Patent Laid-Open No. 2000-260999 can also be used.

The thin-film semiconductor may be subjected to so-called doping treatment by introducing therein, for example, electron acceptor materials including: materials having a functional group such as acrylic acid, acetamide, a dimethylamino group, cyano group, carboxyl group, or nitro group; and compounds such as benzoquinone derivatives, tetracyanoethylene, and tetracyanoquinodimethane, and derivatives thereof, or, for example, electron donor materials including: materials having a functional group such as an amino group, a triphenyl group, an alkyl group, a hydroxyl group, an alkoxy group, and a phenyl group; and compounds such as substituted amines (e.g., phenylenediamine), anthracene, benzanthracene, substituted benzanthracenes, pyrene, substituted pyrene, carbazole and derivatives thereof, and tetrathiafulvalene and derivatives thereof.

The doping treatment means that an electron-accepting molecule (acceptor) or electron-donating molecule (donor) is introduced as a dopant into the thin-film semiconductor of the present embodiment. Thus, the doped thin-film semiconductor is a thin-film semiconductor comprising the organic semiconductor material such as condensed polycyclic aromatic compounds and the dopant. Both the acceptor and the donor can be used as the dopant, and a material and a process known in the art can be used in the doping treatment.

A solvent used in the ink for thin-film semiconductor pattern formation differs depending on the type of the organic semiconductor material and is not particularly limited as long as it dissolves the organic semiconductor material therein. Examples thereof may include: hydrocarbon-based solvents such as toluene, xylene, mesitylene, tetralin, decalin, and n-butylbenzene; ketone-based solvents such as methyl ethyl ketone and cyclohexanone; halogen-based solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; and ether-based solvents such as tetrahydrofuran and tetrahydropyran. These solvents can usually dissolve therein 0.1% by mass or more of the organic semiconductor material, depending on the chemical structure or molecular weight of the material. These solvents can be used alone or as a mixed solvent of two or more of them.

When the ink for thin-film semiconductor pattern formation is cured by light irradiation, the ink may contain a photopolymerizable monomer. Examples of the photopolymerizable monomer may include urethane acrylate and epoxy acrylate.

In the present embodiment, the film thickness of the patterned thin-film semiconductor layer is not particularly limited. The properties of a transistor obtained therefrom largely depend on the film thickness of the active layer made of the organic semiconductor material in most cases. The film thickness is generally 1 μm or smaller, preferably 10 to 300 nm, though differing depending on the type of the organic semiconductor material.

In the present embodiment, the resistance of the printing plate and the blank printing plate to the solvent contained in the ink for thin-film semiconductor pattern formation can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change, of 10% by mass or less, of the blank printing plate between before and after dipping achieves small dimensional change of the printing plate, fine pattern printing, and uniform application of the thin-film semiconductor pattern. Moreover, the rate of mass change of 10% by mass or less can secure the dimensional stability of the printing plate. The resultant printing plate can have favorable durability and resist repetitive printing steps.

When a printing pattern is formed on the surface of the blank printing plate by laser engraving, the depth of the formed printing pattern is preferably between 1 μm and 1,000 μm inclusive, more preferably between 5 μm and 700 μm inclusive, even more preferably between 20 μm and 500 μm inclusive. The depth of the printing pattern of 1 µm or larger can allow the ink for thin-film semiconductor pattern formation transferred from the printing plate to be held on a substrate to be printed. The depth of the printing pattern of 1,000 µm or smaller is preferable, since the printing pattern is neither deformed nor destroyed during a printing step.

A process for producing the patterned thin-film semiconductor layer of the present embodiment is a process for producing a patterned thin-film semiconductor layer, comprising: transferring an ink for thin-film semiconductor pattern formation on a printing plate onto a substrate to be printed; and removing a solvent in the transferred ink for thin-film semiconductor pattern formation by drying or curing the transferred ink for thin-film semiconductor pattern formation by light irradiation such that the ink for thin-film semiconductor pattern formation is fixed on the substrate to be printed, wherein
a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the ink for thin-film semiconductor pattern formation onto the substrate to be printed.

When the process of the present embodiment employs a flexographic printing technique, a method for transferring an ink for thin-film semiconductor pattern formation on a flexographic printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the ink for thin-film semiconductor pattern formation on the substrate to be printed is a method comprising removing, by drying, a solvent in the ink transferred by the method such that the ink for thin-film semiconductor pattern formation is fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the ink for thin-film semiconductor pattern formation on the substrate to be printed is a method comprising curing, by light irradiation, the ink transferred by the method such that the ink for thin-film semiconductor pattern formation is fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Photosensitive Layer of Electrophotographic Photoreceptor]

In the present embodiment, a conductive support used in an electrophotographic photoreceptor needs only to be any conventionally known support having conductivity and is, for example, a metal (e.g., aluminum or aluminum alloy) plate or drum, a metal oxide (e.g., tin oxide or indium oxide) plate, or various plastic films or paper conductively treated by coating them with these metals or metal oxides by vacuum deposition, sputtering, lamination, application, or the like.

Examples of a photosensitive layer of an electrophotographic photoreceptor may include: a multilayered photosensitive layer comprising a charge transport layer and a charge generation layer; and a photosensitive layer obtained by mixing, not stacking, a charge transport layer and a charge generation layer. Specific examples of the multilayered photosensitive layer may include photosensitive layers disclosed in Patent Documents 32 and 33. Specific examples of the mixed photosensitive layer may include photosensitive layers disclosed in Patent Document 34.

An electrophotographic photoreceptor will be described in detail which comprises a multilayered photosensitive layer obtained by stacking a charge transport layer made of an electron-donating material and a charge generation layer made of an electron-accepting material.

Examples of the electron-donating material used in the charge transport layer forming the photosensitive layer may include: compounds having an electron-donating group such as an alkyl, alkoxy, amino, or imide group; polycyclic aromatic compounds such as anthracene, pyrene, and phenanthrene, and derivatives containing them; heterocyclic compounds such as indole, oxazole, oxadiazole, carbazole, thiazole, pyrazoline, imidazole, and triazole, and derivatives containing them; and polyphenylene and derivatives thereof, polyphenylene vinylene and derivatives thereof, polysilane and derivatives thereof, and polyalkylthiophene and derivatives thereof. The electron-donating material is dissolved or dispersed in an appropriate solvent, and this solution or dispersion is printed onto a substrate using the printing plate of the present embodiment and dried to form a charge transport layer. It is preferred that the electron-donating material for forming the charge transport layer in the photosensitive layer should be mixed with a binder resin or the like. When the electron-donating material is a polymer compound, the electron-donating material may be made alone into a charge transport layer without mixing with a binder resin.

Examples of the electron-accepting material used in the charge generation layer forming the photosensitive layer may include various (e.g., phthalocyanine-based, azo-based, squarylium-based, cyanine-based, and perylene-based) pigments or dyes, poly(fluorene) derivatives, fullerene derivatives (e.g., $C_{60}$), and carbon nanotube. The electron-accepting material may be dissolved or dispersed in an appropriate solvent to prepare an ink for formation of a photosensitive layer of an electrophotographic photoreceptor, which is in turn printed on a substrate using the printing plate of the present embodiment and dried to form a charge generation layer. It is preferred that the electron-accepting material for forming the charge generation layer forming the photosensitive layer of an electrophotographic photoreceptor should be mixed with a binder resin or the like.

Examples of the binder resin may include thermoplastic or thermosetting resins such as polystyrene, a styrene-acrylonitrile copolymer, a styrene-butadiene copolymer, a styrene-maleic anhydride copolymer, polyester, polyvinyl chloride, a vinyl chloride-vinyl acetate copolymer, polyvinyl acetate, polyvinylidene chloride, a polyacrylate resin, a phenoxy resin, polycarbonate, a cellulose acetate resin, an ethylcellulose resin, polyvinyl butyral, polyvinyl formal, polyvinyltoluene, poly-N-vinylcarbazole, an acrylic resin, a silicon resin, an epoxy resin, a melamine resin, an urethane resin, a phenol resin, and an alkyd resin.

The film thickness of the charge transport layer is preferably 5 µm to 100 µm, more preferably 5 µm to 50 µm.

The film thickness of the charge generation layer is preferably 0.05 µm to 2 µm, more preferably 0.1 µm to 1 µm.

An electrophotographic photoreceptor will be described in detail which comprises a mixed photosensitive layer obtained by mixing the electron-donating material and the electron-accepting material.

The electron-donating material and the electron-accepting material are mixed and dissolved in a solvent that dissolves both of them therein to prepare an ink for formation of a photosensitive layer. For preparing an electrophotographic photoreceptor, this ink for formation of a photosensitive layer is printed onto a substrate using the printing plate of the present embodiment and dried to form a photosensitive layer. Moreover, a polymer compound may be mixed into the solution for film formation for enhancing the mechanical properties of the mixed photosensitive layer. The polymer compound mixed is preferably a compound that does not extremely inhibit carrier transport, and those having less strong visible light absorption are preferably used. The polymer compound is exemplified by poly(p-phenylene vinylene) and derivatives thereof, polycarbonate, polymethyl acrylate, polymethyl methacrylate, polystyrene, polyvinyl chloride, and polysiloxane.

The film thickness of the photosensitive layer must be large at least enough for preventing pinhole formation and is 5 nm to 300 µm, preferably 10 nm to 100 µm, even more preferably 50 nm to 50 µm.

The solvent used in the ink for formation of a photosensitive layer of an electrophotographic photoreceptor is not particularly limited. Examples thereof may include: hydrocarbon-based solvents such as toluene, xylene, mesitylene, tetralin, decalin, and n-butylbenzene; ketone-based solvents such as methyl ethyl ketone and cyclohexanone; halogenated unsaturated hydrocarbon-based solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; and ether-based solvents such as tetrahydrofuran.

When the ink for formation of a photosensitive layer of an electrophotographic photoreceptor is cured by light irradiation, the ink may contain a photopolymerizable monomer. Examples of the photopolymerizable monomer may include urethane acrylate and epoxy acrylate.

In the present embodiment, the resistance of the printing plate and the blank printing plate to the solvent contained in the ink for formation of a photosensitive layer of an electrophotographic photoreceptor can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change, of 10% by mass or less, of the blank printing plate between before and after dipping not only achieves small dimensional change of the printing plate, fine pattern printing, and uniform application of the photosensitive layer of an electrophotographic photoreceptor but also can secure the dimensional stability of the printing plate. The resultant printing plate can have favorable durability and resist repetitive printing steps.

When a printing pattern is formed on the surface of the blank printing plate by laser engraving, the depth of the formed printing pattern is preferably between 1 µm and 1,000 µm inclusive, more preferably between 5 µm and 700 µm inclusive, even more preferably between 20 µm and 500 µm inclusive. The depth of the printing pattern of 1 µm or larger can allow, for example, the inks for electron-accepting and electron-donating organic layers transferred from the printing plate to be held on a substrate to be printed. The depth of the printing pattern of 1,000 µm or smaller is preferable, since the printing pattern is neither deformed nor destroyed during a printing step.

A process for producing the photosensitive layer of an electrophotographic photoreceptor of the present embodiment is a process for producing a photosensitive layer of an electrophotographic photoreceptor, comprising: transferring an ink for formation of a photosensitive layer of an electrophotographic photoreceptor on a printing plate onto a substrate to be printed; and removing a solvent in the transferred ink by drying or curing the transferred ink by light irradiation such that the ink for formation of a photosensitive layer of an electrophotographic photoreceptor is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the ink for formation of a photosensitive layer of an electrophotographic photoreceptor onto the substrate to be printed.

When the process of the present embodiment employs a flexographic printing technique, a method for transferring an ink for formation of a photosensitive layer of an electrophotographic photoreceptor on a flexographic printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the ink for formation of a photosensitive layer of an electrophotographic photoreceptor on the substrate to be printed is a method comprising removing, by drying, a solvent in the ink transferred by the method such that the ink for formation of a photosensitive layer of an electrophotographic photoreceptor is fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the ink for formation of a photosensitive layer of an electrophotographic photoreceptor on the substrate to be printed is a method comprising curing, by light irradiation, the ink transferred by the method such that the ink for formation of a photosensitive layer of an electrophotographic photoreceptor is fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Electron-accepting and/or Electron-donating Organic Layers Constituting Photovoltaic Element for Photosensor]

In the present embodiment, a photovoltaic element for a photosensor comprises electron-accepting and electron-donating organic layers stacked between two electrodes, at least one of which is optically transparent, wherein the electron-accepting and electron-donating organic layers generate an internal electric field through a junction therebetween. The reason why the photovoltaic element has a photovoltaic ability (i.e., functions even as a photosensor) is attributed to a local internal electric field generated at the interface between the electron-accepting and electron-donating organic layers due to the Fermi level difference between the layers. In a portion on which this internal electric field acts, light absorption occurs to generate a carrier. This carrier is finally delivered externally as electric current. Thus, large factors responsible for the conversion efficiency of a photovoltaic element are, for example: a larger amount of light that reaches this interface and is absorbed therein; a carrier-generating ability such as the magnitude of the internal electric field generated between the electron-accepting and electron-donating organic layers; and the electron and hole mobility and injectability of electron-accepting and electron-donating organic layers. These factors largely depend on materials used in the electron-accepting and electron-donating organic layers.

pigments (divalent metal phthalocyanine having a central metal such as Cu, Zn, Co, Ni, Pb, Pt, Fe, or Mg, metal-free phthalocyanine, halogen atom-coordinated trivalent metal phthalocyanine such as aluminum chlorophthalocyanine, indium chlorophthalocyanine, indium bromophthalocyanine, and gallium chlorophthalocyanine, chlorinated copper phthalocyanine, chlorinated zinc phthalocyanine, and oxygen-coordinated phthalocyanine such as vanadyl phthalocyanine, and titanyl phthalocyanine), indigo-based or thioindigo-based pigments (e.g., Pigment Blue 66 and Pigment Violet 36), quinacridone-based pigments (e.g., Pigment Violet 19 and Pigment Red 122), dyes such as merocyanine compounds, cyanine compounds, and squarylium compounds, and a compound disclosed in Patent Document 36 (Japanese Patent Laid-Open No. 2005-93572). Among others, a compound represented by the following formula (10) is preferable:

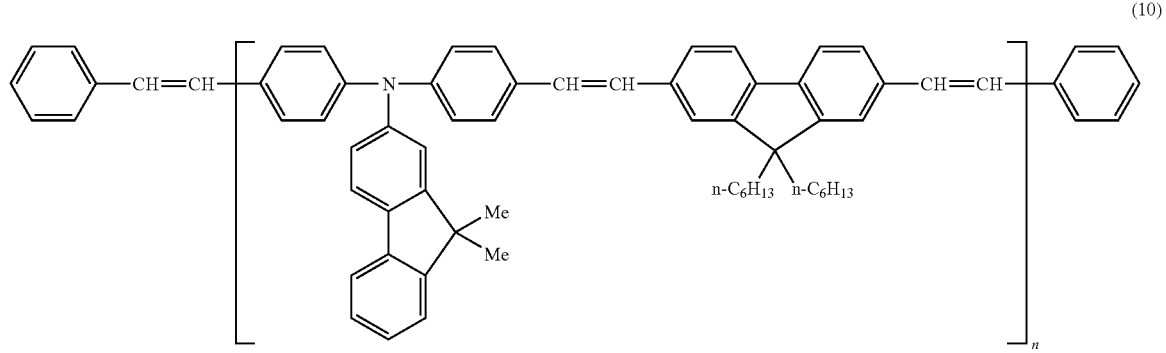

(10)

Various materials and processes used for producing the photovoltaic element of the present embodiment will be described.

Examples of a transparent insulating support used may include glass and plastic films.

Examples of a transparent electrode used may include indium tin oxide (ITO), tin oxide, indium oxide, zinc oxide, and semitransparent Au. The thickness of the transparent electrode is preferably 10 nm to 1,000 nm.

Examples of an organic material for the electron-accepting organic layer may include CN-(polyphenylene vinylene), fullerene derivatives (e.g., $C_{60}$), perylene-based pigments (e.g., Pigment Red (hereinafter, PR) 179, PR190, PR149, PR189, PR123, and Pigment Brown 26), perinone-based pigments (e.g., Pigment Orange 43 and PR194), anthraquinone-based pigments (e.g., PR168, PR177, and Vat Yellow 4), quinone-containing yellow pigments (e.g., flavanthrone), dye fluorenone (e.g., crystal violet, methyl violet, and malachite green), and acceptor compounds (e.g., 2,4,7-trinitrofluorenone, tetracyanoquinodimethane, and tetracyanoethylene).

The film thickness of the electron-accepting organic layer is preferably in a range of from 5 nm to 300 nm. The film thickness of the electron-accepting organic layer of 300 nm or smaller is preferable from the viewpoint of membrane resistance. Alternatively, the film thickness of the electron-accepting organic layer of 5 nm or larger can prevent short-circuit between the first and second electrode layers. The film thickness of the electron-accepting organic layer is more preferably in a range of from 10 nm to 250 nm from the viewpoint of overall performance.

Examples of an organic material for the electron-donating organic layer may include polythiophene, polypyrrole, polyfuran, polypyridine, polycarbazole, phthalocyanine-based The film thickness of the electron-donating organic layer is preferably in a range of from 5 nm to 300 nm. The film thickness of the electron-donating organic layer of 300 nm or smaller is preferable from the viewpoint of membrane resistance. Alternatively, the film thickness of the electron-donating organic layer of 5 nm or larger can prevent short-circuit between the first and second electrode layers. The film thickness of the electron-donating organic layer is more preferably in a range of from 10 nm to 250 nm from the viewpoint of overall performance.

Moreover, for the purpose of enhancing the productivity of the electron-accepting and/or electron-donating organic layers by a printing method, preventing pinhole generation in the photovoltaic element, and imparting high conversion efficiency thereto, the electron-donating organic layer may contain high-molecular-weight (or polymer) organic materials having a particular constitutional unit as disclosed in the following patent documents:

(1) organic semiconductors disclosed in Japanese Patent Laid-Open No. 2005-93572,
(2) poly-N-vinylcarbazole derivatives, poly-γ-carbazolylethyl glutamate derivatives, condensed pyrene-formaldehyde derivatives, polyvinylpyrene, polyvinylphenanthrene, oxazole derivatives, imidazole derivatives, distyrylbenzene derivatives, and diphenethylbenzene derivatives (Japanese Patent Laid-Open No. 9-127713),
(3) α-phenylstilbene derivatives (Japanese Patent Laid-Open No. 9-297419),
(4) butadiene derivatives (Japanese Patent Laid-Open No. 9-80783),
(5) hydrogenated butadiene (Japanese Patent Laid-Open No. 9-80784), (6) diphenylcyclohexane derivatives (Japanese Patent Laid-Open No. 9-80772),
(7) distyryltriphenylamine derivatives (Japanese Patent Laid-Open No. 9-222740),
(8) diphenyldistyrylbenzene derivatives (Japanese Patent Laid-Open Nos. 9-265197 and 9-265201),
(9) stilbene derivatives (Japanese Patent Laid-Open No. 9-211877),
(10) m-phenylenediamine derivatives (Japanese Patent Laid-Open Nos. 9-304956 and 9-304957),
(11) resorcin derivatives (Japanese Patent Laid-Open No. 9-329907), and
(12) triarylamine derivatives (Japanese Patent Laid-Open Nos. 64-9964, 7-199503, 8-176293, 8-208820, 4-11627, 4-316543, 5-310904, 7-56374, and 8-62864, and U.S. Pat. Nos. 5,428,090 and 5,486,439).

Furthermore, for the purpose of enhancing photoelectric conversion efficiency, low-molecular-weight electron-donating organic materials conventionally known in the art may be contained therein together with or instead of the high-molecular-weight (or polymer) organic materials. Examples of the low-molecular-weight electron-donating organic materials conventionally known in the art may include low-molecular-weight organic materials disclosed in the following patent documents:

(a) hydrazone derivatives (Japanese Patent Laid-Open Nos. 55-154955, 55-156954, 55-52063, and 56-81850),
(b) anthracene derivatives (Japanese Patent Laid-Open No. 51-94829),
(c) oxazole derivatives and oxadiazole derivatives (Japanese Patent Laid-Open Nos. 52-139065 and 52-139066),
(d) imidazole derivatives and triphenylamine derivatives (Japanese Patent Laid-Open No. 3-285960),
(e) benzidine derivatives (Japanese Patent Publication No. 58-32372),
(f) styryl derivatives (Japanese Patent Laid-Open Nos. 56-29245 and 58-198043), and
(g) carbazole derivatives (Japanese Patent Laid-Open No. 58-58552).

Moreover, a metal having a high work function, such as Au, Pt, Ni, Pd, Cu, Cr, or Ag is used as a back plate. The thickness of the back plate is preferably 5 to 300 nm.

In the present embodiment, a solvent used in an ink for an electron-accepting organic layer and an ink for an electron-donating organic layer is not particularly limited as long as it can dissolve therein one or both of the electron-donating and electron-accepting organic materials. Specific examples thereof may include: hydrocarbon-based solvents such as toluene, xylene, mesitylene, tetralin, decalin, and n-butylbenzene; halogen-based solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; ether-based solvents such as tetrahydrofuran; and ketone-based solvents such as methyl ethyl ketone and cyclohexanone. These solvents can usually dissolve therein 0.1% by mass or more of the electron-accepting and electron-accepting organic materials, depending on the chemical structures or molecular weights of the organic materials. These solvents can be used alone or as a mixed solvent of two or more of them.

When the ink for an electron-accepting organic layer and/or ink for an electron-donating organic layer are cured by light irradiation, the inks may contain a photopolymerizable monomer. Examples of the photopolymerizable monomer may include urethane acrylate and epoxy acrylate.

In the present embodiment, the resistance of the printing plate and the blank printing plate to the solvent contained in the ink for an electron-accepting organic layer and/or ink for an electron-donating organic layer constituting a photovoltaic element for a photosensor can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change of 10% by mass or less not only achieves small dimensional change of the laser-engraved printing plate, fine pattern printing, and uniform application of the electron-accepting and/or electron-donating organic layers but also can secure the dimensional stability of the printing plate. The resultant printing plate can have favorable durability and resist repetitive printing steps.

When a printing pattern is formed on the surface of the blank printing plate by laser engraving, the depth of the formed printing pattern is preferably between 1 µm and 1,000 µm inclusive, more preferably between 5 µm and 700 µm inclusive, even more preferably between 20 µm and 500 µm inclusive. The depth of the printing pattern of 1 µm or larger can allow the ink for an electron-accepting organic layer and/or ink for an electron-donating organic layer transferred from the printing plate to be held on a substrate to be printed. The depth of the printing pattern of 1,000 µm or smaller is preferable, since the printing pattern is neither deformed nor destroyed during a printing step.

A process for producing the electron-accepting and/or electron-donating organic layers constituting a photovoltaic element for a photosensor of the present embodiment is a process for producing an electron-accepting and/or electron-donating organic layers constituting a photovoltaic element for a photosensor, comprising: transferring an ink for an electron-accepting organic layer and/or ink for an electron-donating organic layer on a printing plate onto a substrate to be printed; and removing a solvent in the transferred ink by drying or curing the transferred ink by light irradiation such that the ink for an electron-accepting organic layer and/or ink for an electron-donating organic layer are fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the ink for an electron-accepting organic layer and/or ink for an electron-donating organic layer onto the substrate to be printed.

When the process of the present embodiment employs a flexographic printing technique, a method for transferring an ink for an electron-accepting organic layer and/or ink for an electron-donating organic layer on a printing plate onto a substrate to be printed is not particularly limited. Examples thereof may include a method comprising: supplying the ink onto the surface of a relief on a patterned flexographic printing plate by use of an ink-supplying roll or the like; and next bringing the flexographic printing plate into contact with a substrate to be printed such that the ink on the relief surface is transferred to the substrate to be printed.

In the process of the present embodiment, a first aspect of a method for fixing the ink for an electron-accepting organic layer and/or ink for an electron-donating organic layer on the substrate to be printed is a method comprising removing, by drying, a solvent in the ink transferred by the method such that the ink for an electron-accepting organic layer and/or ink for an electron-donating organic layer are fixed on the substrate to be printed.

Examples of a method for removing a solvent in the ink by drying such that the ink is fixed thereon may include a method comprising vaporizing the solvent by heat treatment in the presence of an inert gas such as nitrogen gas to dry the ink.

In the process of the present embodiment, a second aspect of a method for fixing the ink for an electron-accepting organic layer and/or ink for an electron-donating organic layer on the substrate to be printed is a method comprising curing, by light irradiation, the ink transferred by the method such that the ink for an electron-accepting organic layer and/or ink for an electron-donating organic layer are fixed on the substrate to be printed.

Examples of a method for curing the ink by light irradiation such that the ink is fixed thereon may include a method comprising photo-curing a photopolymerizable monomer formulated in the ink, such as (meth)acrylic acid derivatives.

[Regarding Process for Producing Polysilane Thin Film of Optical Switching Element]

In the present embodiment, an optical switching element can be produced as follows: first, a repeating unit-containing polysilane solution for formation of a polysilane thin film of an optical switching element is printed onto a substrate using the printing plate and dried to form a polysilane thin film. A portion of this polysilane thin film is selectively exposed by irradiation with UV rays at a wavelength of from 250 to 360 nm by use of, for example, a mercury lamp, via a mask to convert the polysilane to polysiloxane having a repeating unit. Polysiloxane, which is porous, can be impregnated with a solution of a photochromic material and dried to form an optical switching portion containing the photochromic material.

In the present embodiment, polysilane used in the polysilane solution for formation of a polysilane thin film of an optical switching element is not particularly limited. For example, polymethylphenylsilane comprising methyl and phenyl groups as substituents bonded to the silicon of the silane moiety and polyphenylhydrosilane comprising hydrogen and a phenyl group as substituents bonded thereto are preferable, since they permit efficient conversion to polysiloxane by light exposure by use of a mercury lamp. The molecular weight of the polysilane is preferably 1,000 to 20,000, more preferably 1,300 to 1,700, from the viewpoint of overall performance.

A solvent for dissolving the polysilane is not particularly limited as long as it can dissolve the polysilane therein. Examples thereof may include: aromatic hydrocarbon-based solvents such as benzene, toluene, xylene, mesitylene, tetralin, and n-butylbenzene; ketone-based solvents such as methyl ethyl ketone and cyclohexanone; halogen-based solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; and ether-based solvents such as tetrahydrofuran and dibutyl ether. The concentration of the polysilane solution is preferably 1 to 20% by mass from the viewpoint of printability.

The film thickness of the polysilane thin film is not particularly limited and is specifically preferably in the range of 0.1 µm to 10 µm. The film thickness of the polysilane thin film of 10 µm or smaller is preferable. Alternatively, the film thickness of the polysilane thin film of 0.1 µm or larger is preferable. The film thickness of the polysilane thin film is more preferably in the range of 0.5 µm to 8 µm from the viewpoint of overall performance.

The optical switching element may be structurally of a transmission type or of an optical waveguide type.

The element of a transmission type can be produced by: forming a polysilane thin film on a transparent substrate made of, for example, glass; selectively exposing a portion thereof to light; and impregnating the resultant film with a solution of a photochromic material. Monitor light is incident normally on the film surface of the optical switching portion comprising polysiloxane containing the photochromic material, and transmitted light is detected. In this operation, irradiation with control light normal to the film surface of the optical switching portion changes the absorption spectrum of the photochromic material such that the switching of the monitor light is achieved.

The element of an optical waveguide type can be produced by: forming a polysilane thin film on a substrate having a reflection plane (a transparent substrate (e.g., glass) comprising a metallic reflective layer formed thereon, or a metal substrate); selectively exposing a portion thereof to light such that a predetermined optical waveguide pattern is formed thereon; and impregnating the resultant film with a solution of a photochromic material. Light is incident on one end of the optical switching portion (optical waveguide) comprising polysiloxane containing the photochromic material and travels along the film surface thereof, and the light exiting from the other end is detected. In this operation, irradiation with control light normal to the film surface at a predetermined portion of the optical switching portion (optical waveguide) changes the absorption spectrum of the photochromic material such that the switching of the monitor light is achieved.

Examples of the photochromic material may include spiropyran derivatives, xanthene, oxazine, fulgide, dihydropyrene, thioindigo, bipyridine, aziridine, aromatic polycyclic compounds, azobenzene, sal icylideneaniline, cyclophane compounds, spirooxazine compounds, diarylethene compounds, and chalcone compounds.

A solvent for dissolving the photochromic material is not particularly limited. Examples thereof may include halogen-based solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane.

In the present embodiment, the resistance of the printing plate to the solvent contained in the polysilane solution for formation of a polysilane thin film of an optical switching element can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change, of 10% by mass or less, of the blank printing plate between before and after dipping achieves small dimensional change of the printing plate, fine pattern printing, and uniform application of the polysilane thin film. Moreover, the rate of mass change of 10% by mass or less can secure the dimensional stability of the printing plate. The resultant printing plate can have favorable durability and resist repetitive printing steps.

When a printing pattern is formed on the surface of the blank printing plate by laser engraving, the depth of the formed pattern is preferably between 1 µm and 1,000 µm inclusive, more preferably between 5 µm and 700 µm inclusive, even more preferably between 20 µm and 500 µm inclusive. The depth of the printing pattern of 1 µm or larger can allow the polysilane solution for formation of a polysilane thin film of an optical switching element transferred from the printing plate to be held on a substrate to be printed. The depth of 1,000 μm or smaller is preferable, since the printing pattern is neither deformed nor destroyed during a printing step.

A process for producing the polysilane thin film of an optical switching element of the present embodiment is a process for producing a polysilane thin film of an optical switching element, comprising: transferring a polysilane solution for formation of a polysilane thin film of an optical switching element on a printing plate onto a substrate to be printed; and removing a solvent in the transferred polysilane solution by drying such that the polysilane solution is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the polysilane solution for formation of a polysilane thin film of an optical switching onto the substrate to be printed.

When the process of the present embodiment employs a flexographic printing technique, a method for transferring a polysilane solution for formation of a polysilane thin film of an optical switching on a flexographic printing plate onto a substrate to be printed is not particularly limited. Examples thereof may include a method comprising: supplying the polysilane solution onto the surface of a relief on a patterned flexographic printing plate by use of a solution-supplying roll or the like; and next bringing the flexographic printing plate into contact with a substrate to be printed such that the polysilane solution on the relief surface is transferred to the substrate to be printed.

In the process of the present embodiment, a method for fixing the polysilane solution on the substrate to be printed is a method comprising removing, by drying, a solvent in the polysilane solution transferred by the method such that the polysilane solution for formation of a polysilane thin film of an optical switching element is fixed on the substrate to be printed.

Examples of a method for removing a solvent in the polysilane solution by drying such that the polysilane solution is fixed thereon include a method comprising vaporizing the solvent by heat treatment in the presence of an inert gas such as nitrogen gas to dry the solution.

[Regarding Processes for Producing Bank, Etc.]

In the present embodiment, a resin used in a composition for bank formation is not particularly limited. For example, organic materials (e.g., a novolac-based resin, polyamic acid, a polyimide-based resin, polymethacrylate, polypropylene hexafluoride, polyethylene tetrafluoride, polyethylene trifluoride, polyvinylidene fluoride, polyethylene, polybutadiene, polystyrene, polystyrene fluoride, polyethyl acrylate, perfluorooctylethyl methacrylate, polyvinyl alcohol, polychloroprene, polyvinyl chloride, polymethyl acrylate, polyvinylidene chloride, nylon 6, nylon 6-6, nylon 7-7, polyethylene terephthalate, and polyhexamethylene adipamide), inorganic materials (e.g., Cyrolite and Sylophobic (manufactured by FUJI SILYSIA CHEMICAL LTD.)), or positive or negative resist dispersions of these organic and inorganic materials can be used.

A solvent used in the composition for bank formation is not particularly limited as long as it dissolves therein the resin used in the composition for bank formation. Specifically, for example, amide-based solvents (e.g., N,N-dimethylformamide, N,N-dimethylacetamide, and N-methyl-2-pyrrolidone), lactone-based solvents (e.g., β-propiolactone, γ-butyrolactone, γ-valerolactone, δ-valerolactone, γ-caprolactone, and ε-caprolactone), alkoxyalkyl alcohol-based solvents (e.g., butyl cellosolve), dimethyl sulfoxide, and hexamethylphosphoramide are preferable in terms of solubility. Among them, γ-butyrolactone is preferable in terms of solubility. Moreover, these solvents for bank formation may be used alone or as a mixture of two or more of them.

When the composition for bank formation is cured by light irradiation, the composition may contain a photopolymerizable monomer. Examples of the photopolymerizable monomer may include urethane acrylate and epoxy acrylate.

The polyimide-based resin is formed, for example, by imidizing its precursor polyamic acid through ring closure reaction by heating. The polyamic acid is usually mainly composed of a structural unit represented by the following formula (9):

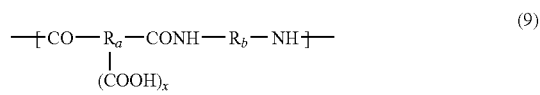

(9)

Wherein x of the formula (9) is an integer of 1 or 2. Ra and Rb each independently represent an organic group having at least two carbon atoms and each independently are preferably a cyclic hydrocarbon, aromatic ring-containing, or heteroaromatic ring-containing group having 6 to 30 carbon atoms from the viewpoint of heat resistance. Ra and Rb are not particularly limited, and examples thereof may include groups derived from phenyl, biphenyl, terphenyl, naphthalene, perylene, diphenyl ether, diphenyl sulfone, diphenylpropane, benzophenone, biphenyl trifluoropropane, diphenylmethane, and cyclohexylmethane groups.

When polyamic acid is used in the composition for bank formation, a solvent is not particularly limited as long as it dissolves the polyamic acid therein. Specifically, for example, amide-based solvents (e.g., N,N-dimethylformamide, N,N-dimethylacetamide, and N-methyl-2-pyrrolidone), lactone-based solvents (e.g., β-propiolactone, γ-butyrolactone, γ-valerolactone, δ-valerolactone, γ-caprolactone, and ε-caprolactone), alkoxyalkyl alcohol-based solvents (e.g., butyl cellosolve), dimethyl sulfoxide, and hexamethylphosphoramide are preferable in terms of solubility. Among them, γ-butyrolactone is preferable in terms of solubility. Moreover, these solvents for the polyamic acid may be used alone or as a mixture of two or more of them.

The film thickness of the bank is not particularly limited and is specifically preferably in a range of from 0.1 μm to 10 μm. The film thickness of the bank of 10 μm or smaller is preferable from the viewpoint of productivity. Alternatively, the film thickness of the bank of 0.1 μm or larger is preferable from the viewpoint of overall performance. The film thickness of the bank is more preferably in a range of from 0.2 μm to 8 μm from the viewpoint of overall performance.

In the present embodiment, the resistance of the printing plate to the solvent contained in the composition for bank formation can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change, of 10% by mass or less, of the blank printing plate between before and after dipping achieves small dimensional change of the printing plate, fine pattern printing, and uniform application of the bank. Moreover, the rate of mass change of 10% by mass or less can secure the dimensional stability of the printing plate. The resultant printing plate can have favorable durability and resist repetitive printing steps.

In the present embodiment, an organic light-emitting ink is not particularly limited, and those comprising an organic light-emitting material, a binder component, and a solvent can be used. The organic light-emitting ink used may be supplemented with various additives, if necessary, for improving printing quality, productivity, thixotropy, and so on.

High-molecular-weight (or polymer) organic light-emitting materials are used as the organic light-emitting material. Examples thereof may include: polymer (e.g., polystyrene, polymethyl methacrylate, or polyvinylcarbazole) dispersions of coumarin-based, perylene-based, pyrane-based, anthrone-based, porphyrin-based, quinacridone-based, N,N'-dialkyl-substituted quinacridone-based, naphthalimide-based, N,N'-diaryl-substituted pyrrolopyrrole-based, and iridium complex-based light-emitting dyes; and polymer materials such as polyarylene-based, polyarylene vinylene-based or polyfluorene materials.

When the organic light-emitting ink is of a UV-curable type, a radical polymerizable compound is formulated with a cationic polymerization initiator capable of generating active cationic species by UV irradiation and is preferably used as the binder resin component.

Moreover, the solvent in the organic light-emitting ink is not particularly limited as long as it can dissolve the high-molecular-weight (or polymer) materials therein. Examples thereof may include: aromatic solvents such as toluene, xylene, and anisole; and ketone-based solvents such as acetone, methyl ethyl ketone, methyl isobutyl ketone, and cyclohexanone. These solvents may be used alone or as a mixed solvent thereof. Among them, aromatic solvents such as toluene, xylene, and anisole are preferable from the solubility of the organic light-emitting material.

The type of the solvent in the organic light-emitting ink is determined depending on the solubility of the polymer component, the drying property in a printing step, and so on. It is preferred that at least one solvent component selected from among the aromatic solvents should be contained in an amount between 20% by mass and 100% by mass inclusive of the total solvent amount. The content of the solvent component between 20% by mass and 100% by mass inclusive can sufficiently dissolve or disperse the organic light-emitting material used in organic light-emitting ink applications.

The film thickness of an organic light-emitting layer for illumination, a display, display backlight, interior, exterior, or surface-emitting light source is not particularly limited and is specifically preferably in a range of from 1 nm to 10 μm. The film thickness of the organic light-emitting layer of 10 μm or smaller is preferable from the viewpoint of productivity. Alternatively, the film thickness of the organic light-emitting layer of 1 nm or larger is preferable from the viewpoint of overall performance. The film thickness of the organic light-emitting layer is more preferably in a range of from 5 nm to 5 μm, even more preferably in a range of from 10 nm to 1 μm, from the viewpoint of overall performance.

In the present embodiment, the resistance of the printing plate to the solvent contained in the organic light-emitting ink can be evaluated by a solvent dipping/swelling test. The rate of mass change of the blank printing plate between before and after dipping in the solvent is preferably 10% by mass or less, more preferably 5% by mass or less.

The solvent dipping/swelling test is conducted by dipping a test sample in the solvent at room temperature for 24 hours. The rate of mass change, of 10% by mass or less, of the blank printing plate between before and after dipping achieves small dimensional change of the printing plate, fine pattern printing, and uniform application of the organic light-emitting ink. Moreover, the rate of mass change of 10% by mass or less can secure the dimensional stability of the printing plate. The resultant printing plate can have favorable durability and resist repetitive printing steps.

When a printing pattern is formed on the surface of the blank printing plate by laser engraving, the depth of the formed pattern is preferably between 1 μm and 1,000 μm inclusive, more preferably between 5 μm and 700 inclusive, even more preferably between 20 μm and 500 μm inclusive. The depth of the printing pattern of 1 μm or larger can allow the composition for bank formation or the organic light-emitting ink transferred from the printing plate to be held on a substrate to be printed. The depth of 1,000 μm or smaller is preferable, since the printing pattern is neither deformed nor destroyed during a printing step.

In the present embodiment, applications of the bank are not limited to an RGB pixel formation application by an ink-jet printing method. The bank can also be used when RGB pixels are formed by other printing methods, for example, flexographic printing, gravure printing, and offset printing.

A process for producing the bank of the present embodiment is a process for producing a bank, comprising: transferring a composition for bank formation on a printing plate onto a substrate to be printed; and removing a solvent in the transferred composition for bank formation by drying or curing the transferred composition for bank formation by light irradiation such that the composition for bank formation is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the composition for bank formation onto the substrate to be printed.

When the process of the present embodiment employs a flexographic printing technique, a method for transferring a composition for bank formation on a flexographic printing plate onto a substrate to be printed is not particularly limited. Examples thereof may include a method comprising: supplying the composition for bank formation onto the surface of a relief on a patterned flexographic printing plate by use of a solution-supplying roll or the like; and next bringing the flexographic printing plate into contact with a substrate to be printed such that the composition for bank formation on the relief surface is transferred to the substrate to be printed.

In the process of the present embodiment, a first aspect of a method for fixing the composition for bank formation on the substrate to be printed is a method comprising removing, by drying, a solvent in the composition for bank formation transferred by the method such that the composition for bank formation is fixed on the substrate to be printed.

Examples of a method for removing a solvent in the composition for bank formation by drying such that the composition for bank formation is fixed thereon may include a method comprising vaporizing the solvent by heat treatment in the presence of an inert gas such as nitrogen gas to dry the composition.

In the process of the present embodiment, a second aspect of a method for fixing the composition for bank formation on the substrate to be printed is a method comprising curing, by light irradiation, the composition for bank formation transferred by the method such that the composition for bank formation is fixed on the substrate to be printed.

Examples of a method for curing the composition for bank formation by light irradiation such that the composition for bank formation is fixed thereon may include a method comprising photo-curing a photopolymerizable monomer formulated in the composition for bank formation, such as (meth) acrylic acid derivatives.

A process for producing the organic light-emitting layer for illumination, a display, display backlight, interior, exterior, or surface-emitting light source of the present embodiment is a process for producing an organic light-emitting layer for illumination, a display, display backlight, interior, exterior, or surface-emitting light source, comprising: transferring an organic light-emitting ink on a printing plate onto a substrate to be printed; and removing a solvent in the transferred organic light-emitting ink by drying or curing the transferred organic light-emitting ink by light irradiation such that the organic light-emitting ink is fixed on the substrate to be printed, wherein a printing plate which is obtained by curing the photosensitive resin composition comprising the polymer (a) produced from the polycarbonate diol comprising the repeating unit represented by the formulas (1) and/or (2) and having hydroxyl groups at both the termini is used to transfer the organic light-emitting ink onto the substrate to be printed.

In the process of the present embodiment, a method for transferring an organic light-emitting ink on a printing plate onto a substrate to be printed is not particularly limited. Examples thereof may include a method comprising: supplying the organic light-emitting ink onto the surface of a relief on a patterned printing plate by use of a solution-supplying roll or the like; and next bringing the printing plate into contact with a substrate to be printed such that the organic light-emitting ink on the relief surface is transferred to the substrate to be printed.

In the process of the present embodiment, a first aspect of a method for fixing the organic light-emitting ink on the substrate to be printed is a method comprising removing, by drying, a solvent in the organic light-emitting ink transferred by the method such that the organic light-emitting ink is fixed on the substrate to be printed.

Examples of a method for removing a solvent in the organic light-emitting ink by drying such that the organic light-emitting ink is fixed thereon may include a method comprising vaporizing the solvent by heat treatment in the presence of an inert gas such as nitrogen gas to dry the ink.

In the process of the present embodiment, a second aspect of a method for fixing the organic light-emitting ink on the substrate to be printed is a process comprising curing, by light irradiation, the organic light-emitting ink transferred by the method such that the organic light-emitting ink is fixed on the substrate to be printed.

Examples of a method for curing the organic light-emitting ink by light irradiation such that the ink is fixed thereon may include: a method comprising photo-curing a photopolymerizable monomer formulated in the organic light-emitting ink, such as (meth)acrylic acid derivatives; and a method comprising curing, by UV irradiation, the radical-polymerizable compound formulated in the organic light-emitting ink.

EXAMPLES

The present embodiment will be described in more detail with reference to Examples and Comparative Examples shown below. These Examples are given for specifically illustrating the description of the present embodiment and advantages and so on obtained therefrom and do not limit the present embodiment by any means. In this context, properties shown in Examples and Comparative Examples below were measured according to the following methods:

<Measurement Methods>

1. OH Value of Polycarbonate Diol 12.5 g of acetic anhydride was diluted with 50 ml of pyridine to prepare an acetylating reagent. 1.0 g of a sample was precisely weighed in a 100-ml eggplant-shaped flask. 2 ml of the acetylating reagent and 4 ml of toluene were added thereto using a whole pipette, and a condenser tube was then attached to the flask. The mixture was heated with stirring at 100° C. for 1 hour. 1 ml of distilled water was added thereto using a whole pipette, and the mixture was heated with stirring for additional 10 minutes.

After cooling for 2 to 3 minutes, 5 ml of ethanol was added thereto, and 2 to 3 drops of a 1% phenolphthalein/ethanol solution were added as an indicator. Then, the solution was titrated with 0.5 mol/l ethanolic potassium hydroxide.

A blank test was conducted by adding 2 ml of the acetylating reagent, 4 ml of toluene, and 1 ml of distilled water to a 100-ml eggplant-shaped flask and heating the mixture with stirring for 10 minutes, followed by titration in the same way as above. Based on this result, an OH value was calculated according to the following calculation formula (i):

$$\text{OH value (mg-KOH/g)} = \{(b-a) \times 28.05 \times f\}/e \quad \text{(i)}$$

wherein
a: titer of sample (ml)
b: titer of blank test (ml)
e: sample mass (g)
f: factor of titrated solution.

2. Molecular Weight of Polycarbonate Diol

Substantially all the termini of polycarbonate diols shown in Synthesis Examples and Comparative Synthesis Examples were determined by $^{13}$C-NMR (270 MHz) measurement to be hydroxyl groups. Moreover, the acid values of the polycarbonate diols were measured by titration with KOH and consequently determined to be 0.01 or smaller in all Synthesis Examples and Comparative Synthesis Examples.

Thus, the number-average molecular weights of the obtained polymers were determined according to the following calculation formula (ii):

$$\text{Number-average molecular weight } Mn = 2/(\text{OH value} \times 10^{-3}/56.11) \quad \text{(ii)}$$

3. Composition of Polycarbonate Diol Copolymerization

The composition of polycarbonate diol copolymerization was measured as follows:

1 g of a sample was placed in a 100-ml eggplant-shaped flask, and 30 g of ethanol and 4 g of potassium hydroxide were added thereto, followed by reaction at 100° C. for 1 hour. After cooling to room temperature, 2 to 3 drops of a 1% phenolphthalein/ethanol solution were added as an indicator, and the mixture was neutralized with hydrochloric acid. After cooling in a refrigerator for 1 hour, precipitated salt was removed by filtration, and the filtrate was analyzed by gas chromatography. The gas chromatography analysis was conducted using a gas chromatograph GC-14B (manufactured by Shimadzu Corp.) equipped with a column DB-WAX (manufactured by J&W), diethylene glycol diethyl ester as an internal standard, and FID as a detector. In this context, the heating profile of the column involved keeping at 60° C. for 5 minutes and then heating at a rate of 10° C./min to 250° C.

4. Solubility of Polycarbonate Diol

Each polycarbonate diol sample was mixed with a solvent (N-methyl-2-pyrrolidone: NMP) at each mass ratio (% by mass) of 10/90, 20/80, 30/70, 40/60, 50/50, 60/40, 70/30, 80/20, and 90/10 in a hermetically sealed container and dissolved by heating at 80° C., followed by standing to cool within a room kept at 25° C. Among the ratios that offered uniform dissolution even after 24 hours, the highest polycarbonate diol concentration was used as the solubility of the sample in the solvent.

For the samples having solubility lower than 10% by mass, a supernatant of the mixed solution with the mass ratio of 10/90 after the solubility test was sampled and evaporated to dryness in an oven to remove the solvent, and then, solubility was determined based on the mass of the residue.

5. Rate of Mass Change of Blank Printing Plate

A rate of mass change caused by N-methyl-2-pyrrolidone (NMP) was determined according to the following calculation formula (iii) by cutting a blank printing plate into 3 cm×5 cm and dipping the cut piece in the solvent at room temperature for 24 hours.

A rate of mass change caused by other solvents was determined according to the following calculation formula (iii) by cutting a blank printing plate into 1 cm×2 cm and dipping the cut piece in each solvent at room temperature for 24 hours:

Rate of mass change (%)={(mass after dipping-mass before dipping)/mass before dipping}×100   (iii)

6. Hardness of Blank Printing Plate

A value was measured 15 seconds after the intimate contact between pressurizing surface and a plate using a durometer type A GS-719G and a constant loader GS-710 for durometers (both TECLOCK Crop.). Three sites in the 3 cm×5 cm blank printing plate were measured three times each, and an average value thereof was used as hardness.

7. Laser Engravability of Blank Printing Plate

The laser engraving of a blank printing plate was performed using a $CO_2$ laser engraving machine (output: 12 watts, trademark: Laser Pro Venus, manufactured by GCC). The engraving resulted in a pattern containing a line drawing with relief lines of 200 μm in width. The engraving depth (relief depth) was set to 400 μm. The presence or absence of viscous liquid debris generated by laser engraving and the sharpness of the line drawing were visually assessed.

Synthesis Example 1

A 500-ml four-neck flask equipped with a distillation column (filled with a regular packing Heli Pack Packing No. 3, filling height: 300 mm, inside diameter: 30 mm) and a fractionating column was charged with 214 g (2.01 mol) of diethylene glycol and 186 g (2.12 mol) of ethylene carbonate, and the mixture was dissolved by stirring at 70° C. The system was substituted by nitrogen, and then, 0.177 g of tetrabutoxytitanium was added thereto as a catalyst. This flask was heated in an oil bath, while a portion of the refluxing solution was discharged from the fractionating column to adjust the inside temperature of the flask to 145 to 150° C. and the pressure to 2.5 to 3.5 kPa. In this state, the mixture was reacted for 22 hours. Then, the packed distillation column was removed and replaced by a simple distillation apparatus. The inside temperature of the flask was increased to 170° C., and the pressure was decreased to 0.2 kPa. Diethylene glycol and ethylene carbonate remaining in the flask were distilled off over 1 hour. Then, the mixture was reacted for additional 5 hours at an inside temperature of the flask of 170° C. and a pressure of 0.1 kPa. This reaction produced 174 g of polycarbonate diol that was viscous and liquid at room temperature. The obtained polycarbonate diol had an OH value of 60.9 (number-average molecular weight Mn=1843).

A 300-ml separable flask equipped with a stirrer was charged with 65.0 g of this polycarbonate diol and 0.05 g of monobutyl phosphate, and tetrabutoxytitanium was inactivated by stirring at 80° C. for 3 hours. Then, 4.63 g of tolylene diisocyanate, 0.07 g of 2,6-di-tert-butyl-4-methyl phenol, 0.01 g of adipic acid, and 0.001 g of di-n-butyltin dilaurate were added thereto, and the mixture was stirred at 80° C. for 3 hours in a dry air atmosphere. Then, 2.77 g of 2-methacryloyloxyethyl isocyanate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 24.14 g of ethylene glycol phenyl ether methacrylate, 7.24 g of diethylene glycol butyl ether methacrylate, 0.12 g of trimethylolpropane trimethacrylate, 5.55 g of silica gel C-1504 (FUJI SILYSIA CHEMICAL LTD.), 1.21 g of silicone oil KF-410 (Shin-Etsu Chemical Co., Ltd.), 0.72 g of 2,2-dimethoxy-2-phenylacetophenone, 1.21 g of benzophenone, 0.72 g of 2,6-di-tert-butyl-4-methyl phenol, 2.17 g of triphenyl phosphate, and 1.21 g of SANOL LS-785 (Daiichi Sankyo Co., Ltd.) were added thereto, and the mixture was degassed by decreasing the pressure to 13 kPa with stirring at 80° C. to obtain a photosensitive resin composition that was viscous and liquid at room temperature.

Synthesis Example 2

A 500-ml four-neck flask equipped with a distillation column (filled with a regular packing Heli Pack Packing No. 3, filling height: 300 mm, inside diameter: 30 mm) and a fractionating column was charged with 214 g (2.01 mol) of diethylene glycol and 186 g (2.12 mol) of ethylene carbonate, and the mixture was dissolved by stirring at 70° C. The system was substituted by nitrogen, and then, 0.177 g of tetrabutoxytitanium was added thereto as a catalyst. This flask was heated in an oil bath, while a portion of the refluxing solution was discharged from the fractionating column to adjust the inside temperature of the flask to 145 to 150° C. and the pressure to 2.5 to 3.5 kPa. In this state, the mixture was reacted for 22 hours. Then, the packed distillation column was removed and replaced by a simple distillation apparatus. The inside temperature of the flask was increased to 170° C., and the pressure was decreased to 0.2 kPa. Diethylene glycol and ethylene carbonate remaining in the flask were distilled off over 1 hour. Then, the mixture was reacted for additional 5 hours at an inside temperature of the flask of 170° C. and a pressure of 0.1 kPa. This reaction produced 174 g of polycarbonate diol that was viscous and liquid at room temperature. The obtained polycarbonate diol had an OH value of 60.9 (number-average molecular weight Mn=1843).

A 300-ml separable flask equipped with a stirrer was charged with 65.0 g of this polycarbonate diol and 0.05 g of monobutyl phosphate, and tetrabutoxytitanium was inactivated by stirring at 80° C. for 3 hours. Then, 4.63 g of tolylene diisocyanate, 0.07 g of 2,6-di-tert-butyl-4-methyl phenol, 0.01 g of adipic acid, and 0.001 g of di-n-butyltin dilaurate were added thereto, and the mixture was stirred at 80° C. for 3 hours in a dry air atmosphere. Then, 2.77 g of 2-methacryloyloxyethyl isocyanate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 10.74 g of ethylene glycol phenyl ether methacrylate, 5.96 g of trimethylolpropane trimethacrylate, 5.55 g of silica gel C-1504 (FUJI SILYSIA CHEMICAL LTD.), 1.21 g of silicone oil KF-410 (Shin-Etsu Chemical Co., Ltd.), 0.72 g of 2,2-dimethoxy-2-phenylacetophenone, 1.21 g of benzophenone, 0.72 g of 2,6-di-tert-butyl-4-methyl phenol, 2.17 g of triphenyl phosphate, and 1.21 g of SANOL LS-785 (Daiichi Sankyo Co., Ltd.) were added thereto, and the mixture was degassed by decreasing the pressure to 13 kPa with stirring at 80° C. to obtain a photosensitive resin composition that was viscous and liquid at room temperature.

Synthesis Example 3

A photosensitive resin composition was synthesized in the same way as in Synthesis Example 2 except that hydroxyethyl methacrylate was used instead of ethylene glycol phenyl ether methacrylate.

Synthesis Example 4

A photosensitive resin composition was synthesized in the same way as in Synthesis Example 2 except that hexamethylene diisocyanate was used instead of tolylene diisocyanate.

Synthesis Example 5

A 300-ml four-neck flask equipped with a fractionating column was charged with 100 g (0.32 mol) of 1,20-eicosanediol and 30 g (0.34 mol) of ethylene carbonate, and the mixture was dissolved by stirring at 70° C. The system was substituted by nitrogen, and then, 0.062 g of tetrabutoxytitanium was added thereto as a catalyst. This flask was heated in an oil bath, while a portion of the refluxing solution was discharged from the fractionating column to adjust the inside temperature of the flask to 150 to 155° C. and the pressure to 7 to 8 kPa. In this state, the mixture was reacted for 11 hours. Then, additional 30 g (0.34 mol) of ethylene carbonate was added thereto, and the mixture was reacted for 7 hours at an inside temperature of the flask of 155° C. and a pressure of 6 to 7 kPa. Then, the pressure was decreased to 0.2 kPa, and ethylene carbonate remaining in the flask was distilled off. Then, further additional 30 g (0.34 mol) of ethylene carbonate was added thereto, and the mixture was reacted for 5 hours at an inside temperature of the flask of 155° C. and a pressure of 5 to 6 kPa in the same way as above. Then, the pressure was decreased to 0.2 kPa, and ethylene carbonate remaining in the flask was distilled off. This reaction produced 102 g of polycarbonate diol that was solid at room temperature. The obtained polycarbonate diol had an OH value of 45.3 (number-average molecular weight Mn=2476).

A 300-ml separable flask equipped with a stirrer was charged with 65.1 g of this polycarbonate diol and 0.03 g of monobutyl phosphate, and tetrabutoxytitanium was inactivated by stirring at 80° C. for 3 hours. Then, 3.18 g of tolylene diisocyanate, 0.08 g of 2,6-di-tert-butyl-4-methyl phenol, 0.01 g of adipic acid, and 0.002 g of di-n-butyltin dilaurate were added thereto, and the mixture was stirred at 80° C. for 3 hours in a dry air atmosphere. Then, 2.77 g of 2-methacryloyloxyethyl isocyanate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 23.61 g of ethylene glycol phenyl ether methacrylate, 7.08 g of diethylene glycol butyl ether methacrylate, 0.12 g of trimethylolpropane trimethacrylate, 5.43 g of silica gel C-1504 (FUJI SILYSIA CHEMICAL LTD.), 1.12 g of silicone oil KF-410 (Shin-Etsu Chemical Co., Ltd.), 0.71 g of 2,2-dimethoxy-2-phenylacetophenone, 1.19 g of benzophenone, 0.71 g of 2,6-di-tert-butyl-4-methyl phenol, 2.13 g of triphenyl phosphate, and 1.20 g of SANOL LS-785 (Daiichi Sankyo Co., Ltd.) were added thereto, and the mixture was degassed by decreasing the pressure to 13 kPa with stirring at 80° C. to obtain a photosensitive resin composition that was solid at room temperature.

Synthesis Example 6

A resin composition shown below was obtained by changing the ethylene glycol phenyl ether methacrylate of Synthesis Example 5 to lauryl methacrylate.

A 300-ml separable flask equipped with a stirrer was charged with 34.5 g of the polycarbonate diol obtained in Synthesis Example 5 and 0.02 g of monobutyl phosphate, and tetrabutoxytitanium was inactivated by stirring at 80° C. for 3 hours. Then, 1.61 g of tolylene diisocyanate, 0.04 g of 2,6-di-tert-butyl-4-methyl phenol, 0.01 g of adipic acid, and 0.001 g of di-n-butyltin dilaurate were added thereto, and the mixture was stirred at 80° C. for 3 hours in a dry air atmosphere. Then, 1.44 g of 2-methacryloyloxyethyl isocyanate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 12.54 g of lauryl methacrylate, 3.59 g of diethylene glycol butyl ether methacrylate, 0.07 g of trimethylolpropane trimethacrylate, 2.90 g of silica gel C-1504 (FUJI SILYSIA CHEMICAL LTD.), 0.63 g of silicone oil KF-410 (Shin-Etsu Chemical Co., Ltd.), 0.38 g of 2,2-dimethoxy-2-phenylacetophenone, 0.63 g of benzophenone, 0.38 g of 2,6-di-tert-butyl-4-methyl phenol, 1.13 g of triphenyl phosphate, and 0.63 g of SANOL LS-785 (Daiichi Sankyo Co., Ltd.) were added thereto, and the mixture was degassed by decreasing the pressure to 13 kPa with stirring at 80° C. to obtain a photosensitive resin composition that was solid at room temperature.

Synthesis Example 7

A 300-ml four-neck flask equipped with a fractionating column was charged with 100 g (0.29 mol) of 8,13-dimethyl-1,20-eicosanediol and 27 g (0.31 mol) of ethylene carbonate, and the mixture was dissolved by stirring at 70° C. The system was substituted by nitrogen, and then, 0.062 g of tetrabutoxytitanium was added thereto as a catalyst. This flask was heated in an oil bath, while a portion of the refluxing solution was discharged from the fractionating column to adjust the inside temperature of the flask to 150 to 155° C. and the pressure to 7 to 8 kPa. In this state, the mixture was reacted for 8 hours. Then, additional 27 g (0.31 mol) of ethylene carbonate was added thereto, and the mixture was reacted for 6 hours at an inside temperature of the flask of 155 to 160° C. and a pressure of 7 to 8 kPa. Then, the pressure was decreased to 0.1 kPa, and ethylene carbonate remaining in the flask was distilled off. Then, further additional 27 g (0.31 mol) of ethylene carbonate was added thereto, and the mixture was reacted for 4 hours at an inside temperature of the flask of 155° C. and a pressure of 5 to 6 kPa in the same way as above. Then, the pressure was decreased to 0.1 kPa, and ethylene carbonate remaining in the flask was distilled off. This reaction produced 105 g of polycarbonate diol that was viscous and liquid at room temperature. The obtained polycarbonate diol had an OH value of 28.6 (number-average molecular weight Mn=3927).

A 300-ml separable flask equipped with a stirrer was charged with 51.4 g of this polycarbonate diol and 0.05 g of monobutyl phosphate, and tetrabutoxytitanium was inactivated by stirring at 95° C. for 3 hours. Then, 1.30 g of tolylene diisocyanate, 0.06 g of 2,6-di-tert-butyl-4-methyl phenol, 0.01 g of adipic acid, and 0.001 g of di-n-butyltin dilaurate were added thereto, and the mixture was stirred at 40° C. for 30 minutes and further at 80° C. for 3 hours in a dry air atmosphere. Then, 2.16 g of 2-methacryloyloxyethyl isocyanate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 18.22 g of lauryl methacrylate, 5.46 g of diethylene glycol butyl ether methacrylate, 0.10 g of trimethylolpropane trimethacrylate, 4.18 g of silica gel C-1504 (FUJI SILYSIA CHEMICAL LTD.), 0.91 g of silicone oil KF-410 (Shin-Etsu Chemical Co., Ltd.), 0.55 g of 2,2-dimethoxy-2-phenylacetophenone, 0.91 g of benzophenone, 0.55 g of 2,6-di-tert-butyl-4-methyl phenol, 1.67 g of triphenyl phosphate, and 0.93 g of SANOL LS-785 (Daiichi Sankyo Co., Ltd.) were added thereto, and the mixture was degassed by decreasing the pressure to 13 kPa with stirring at 80° C. to obtain a photosensitive resin composition that was viscous and liquid at room temperature.

Synthesis Example 8

A 300-ml four-neck flask equipped with a fractionating column was charged with 26 g (0.13 mol) of 1,12-dodecanediol, 40 q (0.13 mol) of 1,20-eicosanediol, and 24 g (0.27 mol) of ethylene carbonate, and the mixture was dissolved by stirring at 70° C. The system was substituted by nitrogen, and then, 0.068 g of tetrabutoxytitanium was added thereto as a catalyst. This flask was heated in an oil bath, while a portion of the refluxing solution was discharged from the fractionating column to adjust the inside temperature of the flask to 145 to 150° C. and the pressure to 5 to 6 kPa. In this state, the mixture was reacted for 8 hours. Then, additional 24 g (0.27 mol) of ethylene carbonate was added thereto, and the mixture was reacted for 7 hours at an inside temperature of the flask of 150° C. and a pressure of 4 to 5 kPa. Then, the pressure was decreased to 0.2 kPa, and ethylene carbonate remaining in the flask was distilled off. Then, further additional 24 g (0.27 mol) of ethylene carbonate was added thereto, and the mixture was reacted for 5 hours at an inside temperature of the flask of 155° C. and a pressure of 4 to 5 kPa in the same way as above. Then, the pressure was decreased to 0.2 kPa, and ethylene carbonate remaining in the flask was distilled off. Again, additional 24 g (0.27 mol) of ethylene carbonate was added thereto, and the mixture was reacted for 2 hours at an inside temperature of the flask of 155° C. and a pressure of 4 to 5 kPa in the same way as above. Then, the pressure was decreased to 0.2 kPa, and ethylene carbonate remaining in the flask was distilled off. This reaction produced 67 g of polycarbonate diol that was solid at room temperature. The obtained polycarbonate diol had an OH value of 47.3 (number-average molecular weight Mn=2371).

A 300-ml separable flask equipped with a stirrer was charged with 40.1 g of this polycarbonate diol and 0.04 g of monobutyl phosphate, and tetrabutoxytitanium was inactivated by stirring at 80° C. for 3 hours. Then, 2.04 g of tolylene diisocyanate, 0.05 g of 2,6-di-tert-butyl-4-methyl phenol, 0.01 g of adipic acid, and 0.001 g of di-n-butyltin dilaurate were added thereto, and the mixture was stirred at 80° C. for 2.5 hours in a dry air atmosphere. Then, 1.66 g of 2-methacryloyloxyethyl isocyanate and 0.001 g of di-n-butyltin dilaurate were added thereto, and the mixture was stirred at 80° C. for 2.5 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 14.57 g of lauryl methacrylate, 4.37 g of diethylene glycol butyl ether methacrylate, 0.07 g of trimethylolpropane trimethacrylate, 3.35 g of silica gel C-1504 (FUJI SILYSIA CHEMICAL LTD.), 0.73 g of silicone oil KF-410 (Shin-Etsu Chemical Co., Ltd.), 0.44 g of 2,2-dimethoxy-2-phenylacetophenone, 0.73 g of benzophenone, 0.44 g of 2,6-di-tert-butyl-4-methyl phenol, 1.31 g of triphenyl phosphate, and 0.73 g of SANOL LS-785 (Daiichi Sankyo Co., Ltd.) were added thereto, and the mixture was degassed by decreasing the pressure to 13 kPa with stirring at 80° C. to obtain a photosensitive resin composition that was solid at room temperature.

Synthesis Example 9

A 500-ml four-neck flask equipped with a fractionating column was charged with 274.5 g (1.36 mol) of 1,12-dodecanediol and 125.6 g (1.43 mol) of ethylene carbonate, and the mixture was dissolved by stirring at 80° C. The system was substituted by nitrogen, and then, 0.150 g of tetrabutoxytitanium was added thereto as a catalyst. This flask was heated in an oil bath, while a portion of the refluxing solution was discharged from the fractionating column at an inside temperature of the flask to 140 to 175° C. and a pressure to 0.2 to 2.0 kPa. In this state, the mixture was reacted for a total of 12 hours.

Then, the packed distillation column was removed and replaced by a simple distillation apparatus. The inside temperature of the flask was increased to 195° C., and the pressure was decreased to 0.2 kPa. 1,12-dodecanediol and ethylene carbonate remaining in the flask were distilled off over 1 hour. Then, the mixture was reacted for additional 7 hours at an inside temperature of the flask of 216° C. and a pressure of 0.2 kPa. This reaction produced 212 g of polycarbonate diol that was solid at room temperature. The obtained polycarbonate diol had an OH value of 63.0 (number-average molecular weight Mn=1781).

A 300-ml separable flask equipped with a stirrer was charged with 60.1 g of this polycarbonate diol and 0.03 g of monobutyl phosphate, and tetrabutoxytitanium was inactivated by stirring at 80° C. for 3 hours. Then, 4.47 g of tolylene diisocyanate, 0.07 g of 2,6-di-tert-butyl-4-methyl phenol, 0.01 g of adipic acid, and 0.001 g of di-n-butyltin dilaurate were added thereto, and the mixture was stirred at 80° C. for 3 hours in a dry air atmosphere. Then, 2.57 g of 2-methacryloyloxyethyl isocyanate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 22.37 g of lauryl methacrylate, 6.71 g of diethylene glycol butyl ether methacrylate, 0.11 g of trimethylolpropane trimethacrylate, 5.15 g of silica gel C-1504 (FUJI SILYSIA CHEMICAL LTD.), 1.12 g of silicone oil KF-410 (Shin-Etsu Chemical Co., Ltd.), 0.67 g of 2,2-dimethoxy-2-phenylacetophenone, 1.12 g of benzophenone, 0.67 g of 2,6-di-tert-butyl-4-methyl phenol, 2.01 g of triphenyl phosphate, 1.12 g of SANOL LS-785 (Daiichi Sankyo Co., Ltd.), 0.007 g of a pigment Green AG (NIPPON KAYAKU CO., LTD.) were added thereto, and the mixture was degassed by decreasing the pressure to 13 kPa with stirring at 80° C. to obtain a photosensitive resin composition that was solid at room temperature.

Synthesis Example 10

A 300-ml four-neck flask equipped with a fractionating column was charged with 193 g (0.64 mol) of 10-oxanonadecane-1,19-diol and 59 g (0.67 mol) of ethylene carbonate, and the mixture was dissolved by stirring at 70° C. The system was substituted by nitrogen, and then, 0.11 g of tetrabutoxytitanium was added thereto as a catalyst. This flask was heated in an oil bath, while a portion of the refluxing solution was discharged from the fractionating column to adjust the inside temperature of the flask to 150 to 155° C. and the pressure to 4 to 6 kPa. In this state, the mixture was reacted for 11 hours. Then, a procedure was repeated three times in which additional 59 g (0.67 mol) of ethylene carbonate was added thereto, and the mixture was reacted at an inside temperature of the flask of 150° C. and a pressure of 4 to 6 kPa; and then, the pressure was decreased to 0.1 kPa, and ethylene carbonate remaining in the flask was distilled off. The times of the first, second, and third reactions were 6 hours, 7 hours, and 4 hours, respectively. This reaction produced 195 g of polycarbonate diol that was solid at room temperature. The obtained polycarbonate diol had an OH value of 51.1 (number-average molecular weight Mn=2196).

A 300-ml separable flask equipped with a stirrer was charged with 96.6 g of this polycarbonate diol and 0.04 g of monobutyl phosphate, and tetrabutoxytitanium was inactivated by stirring at 95° C. for 3 hours. Then, 5.74 g of tolylene diisocyanate, 0.11 g of 2,6-di-tert-butyl-4-methyl phenol, 0.02 g of adipic acid, and 0.002 g of di-n-butyltin dilaurate were added thereto, and the mixture was stirred at 80° C. for 3 hours in a dry air atmosphere. Then, 4.09 g of 2-methacryloyloxyethyl isocyanate and 0.002 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 35.38 g of lauryl methacrylate, 10.62 g of diethylene glycol butyl ether methacrylate, 0.18 g of trimethylolpropane trimethacrylate, 8.18 g of silica gel C-1504 (FUJI SILYSIA CHEMICAL LTD.), 1.78 g of silicone oil KF-410 (Shin-Etsu Chemical Co., Ltd.), 1.07 g of 2,2-dimethoxy-2-phenylacetophenone, 1.77 g of benzophenone, 1.06 g of 2,6-di-tert-butyl-4-methyl phenol, 3.19 g of triphenyl phosphate, and 1.78 g of SANOL LS-785 (Daiichi Sankyo Co., Ltd.) were added thereto, and the mixture was degassed by decreasing the pressure to 13 kPa with stirring at 80° C. to obtain a photosensitive resin composition that was solid at room temperature.

Synthesis Example 11

A 300-ml separable flask equipped with a stirrer was charged with 65.0 g of the polycarbonate diol of Synthesis Example 1 and 0.05 g of monobutyl phosphate, and tetrabutoxytitanium was inactivated by stirring at 80° C. for 3 hours. Then, 8.16 g of tolylene diisocyanate, 0.08 g of 2,6-di-tert-butyl-4-methyl phenol, 0.01 g of adipic acid, and 0.001 g of di-n-butyltin dilaurate were added thereto, and the mixture was stirred at 80° C. for 3 hours in a dry air atmosphere. Then, 6.66 g of 2-hydroxypropyl methacrylate and 0.001 g of di-n-butyltin dilaurate were added thereto, and the mixture was stirred at 80° C. for 2 hours in a dry air atmosphere. At this stage, infrared spectroscopy was conducted to confirm that a polymer was obtained which comprised the polycarbonate diol having terminal hydroxyl group linkage through a urethane bond and had a double bond.

Then, 10.74 g of ethylene glycol phenyl ether methacrylate, 5.96 g of trimethylolpropane trimethacrylate, 5.55 g of silica gel C-1504 (FUJI SILYSIA CHEMICAL LTD.), 1.21 g of silicone oil KF-410 (Shin-Etsu Chemical Co., Ltd.), 0.72 g of 2,2-dimethoxy-2-phenylacetophenone, 1.21 g of benzophenone, 0.72 g of 2,6-di-tert-butyl-4-methyl phenol, 2.17 g of triphenyl phosphate, and 1.21 g of SANOL LS-785 (Daiichi Sankyo Co., Ltd.) were added thereto, and the mixture was degassed by decreasing the pressure to 13 kPa with stirring at 80° C. to obtain a photosensitive resin composition that was viscous and liquid at room temperature.

Synthesis Example 12

A 500-ml four-neck flask equipped with a distillation column (filled with a regular packing Heli Pack Packing No. 3, filling height: 300 mm, inside diameter: 30 mm) and a fractionating column was charged with 254.8 g (1.57 mol) of dibutylene glycol and 145.2 g (1.65 mol) of ethylene carbonate, and the mixture was dissolved by stirring at 80° C. The system was substituted by nitrogen, and then, 0.16 g of tetrabutoxytitanium was added thereto as a catalyst. This flask was heated in an oil bath, while a portion of the refluxing solution was discharged from the fractionating column to adjust the inside temperature of the flask to 150 to 155° C. and the pressure to 2 to 3 kPa. In this state, the mixture was reacted for 20 hours. Then, the packed distillation column was removed and replaced by a simple distillation apparatus. The inside temperature of the flask was adjusted to 155° C., and the pressure was adjusted to 1.0 kPa. Dibutylene glycol and ethylene carbonate remaining in the flask were distilled off over 1 hour. Then, the mixture was reacted for additional 7 hours at an inside temperature of the flask of 155 to 175° C. and a pressure of 0.1 to 0.2 kPa. This reaction produced 164 g of polycarbonate diol that was solid at room temperature. The obtained polycarbonate diol had an OH value of 55.8 (number-average molecular weight Mn=2011).

A 300-ml separable flask equipped with a stirrer was charged with 65.0 g of this polycarbonate diol and 0.04 g of monobutyl phosphate, and tetrabutoxytitanium was inactivated by stirring at 95° C. for 3 hours. Then, 4.13 g of tolylene diisocyanate, 0.07 g of 2,6-di-tert-butyl-4-methyl phenol, 0.01 g of adipic acid, and 0.001 g of di-n-butyltin dilaurate were added thereto, and the mixture was stirred at 40° C. for 30 minutes and further at 80° C. for 4 hours in a dry air atmosphere. Then, 2.75 g of 2-methacryloyloxyethyl isocyanate and 0.001 g of di-n-butyltin dilaurate were added thereto, and the mixture was stirred at 80° C. for 2 hours in a dry air atmosphere.

Then, 24.14 g of ethylene glycol phenyl ether methacrylate, 7.26 g of diethylene glycol butyl ether methacrylate, 0.13 g of trimethylolpropane trimethacrylate, 5.55 g of silica gel C-1504 (FUJI SILYSIA CHEMICAL LTD.), 1.20 g of silicone oil KF-410 (Shin-Etsu Chemical Co., Ltd.), 0.72 g of 2,2-dimethoxy-2-phenylacetophenone, 1.19 g of benzophenone, 0.72 g of 2,6-di-tert-butyl-4-methyl phenol, 2.16 g of triphenyl phosphate, 1.19 g of SANOL LS-785 (Daiichi Sankyo Co., Ltd.), and 0.007 g of a pigment Green AG (NIPPON KAYAKU CO., LTD.) were added thereto, and the mixture was degassed by decreasing the pressure to 13 kPa with stirring at 80° C. to obtain a photosensitive resin composition that was solid at room temperature.

Comparative Synthesis Example 1

A 500-ml four-neck flask equipped with a distillation column (filled with a regular packing Heli Pack Packing No. 3, filling height: 300 mm, inside diameter: 30 mm) and a fractionating column was charged with 197.4 g (2.19 mol) of 1,4-butanediol and 202.6 g (2.30 mol) of ethylene carbonate, and the mixture was dissolved by stirring at 80° C. The system was substituted by nitrogen, and then, 0.033 g of tetrabutoxytitanium was added thereto as a catalyst. This flask was heated in an oil bath, while a portion of the refluxing solution was discharged from the fractionating column to adjust the inside temperature of the flask to 139 to 145° C. and the pressure to 2 to 3 kPa. In this state, the mixture was reacted for a total of 23 hours. Then, the packed distillation column was removed and replaced by a simple distillation apparatus. The inside temperature of the flask was adjusted to 145° C., and the pressure was adjusted to 1.5 kPa. 1,4-butanediol and ethylene carbonate remaining in the flask were distilled off over 1 hour. Then, the mixture was reacted for additional 7.5 hours at an inside temperature of the flask of 145 to 185° C. and a pressure of 0.08 to 0.3 kPa. This reaction produced 128 g of polycarbonate diol that was solid at room temperature. The obtained polycarbonate diol had an OH value of 45.0 (number-average molecular weight Mn=2493).

A 300-ml separable flask equipped with a stirrer was charged with 50.2 g of this polycarbonate diol and 0.009 g of monobutyl phosphate, and tetrabutoxytitanium was inactivated by stirring at 80° C. for 3 hours. Then, 2.36 g of tolylene diisocyanate, 0.05 g of 2,6-di-tert-butyl-4-methyl phenol, 0.01 g of adipic acid, and 0.001 g of di-n-butyltin dilaurate were added thereto, and the mixture was stirred at 80° C. for 3 hours in a dry air atmosphere. Then, 2.09 g of 2-methacryloyloxyethyl isocyanate and 0.001 g of di-n-butyltin dilaurate were added thereto, and the mixture was stirred at 80° C. for 2 hours in a dry air atmosphere.

Then, 18.22 g of ethylene glycol phenyl ether methacrylate, 5.47 g of diethylene glycol butyl ether methacrylate, 0.09 g of trimethylolpropane trimethacrylate, 4.19 g of silica gel C-1504 (FUJI SILYSIA CHEMICAL LTD.), 0.91 g of silicone oil KF-410 (Shin-Etsu Chemical Co., Ltd.), 0.55 g of 2,2-dimethoxy-2-phenylacetophenone, 0.91 g of benzophenone, 0.55 g of 2,6-di-tert-butyl-4-methyl phenol, 1.64 g of triphenyl phosphate, 0.91 g of SANOL LS-785 (Daiichi Sankyo Co., Ltd.), and 0.006 g of a pigment Green AG (NIPPON KAYAKU CO., LTD.) were added thereto, and the mixture was degassed by decreasing the pressure to 13 kPa with stirring at 80° C. to obtain a photosensitive resin composition that was solid at room temperature.

Comparative Synthesis Example 2

To a 300-ml separable flask equipped with a stirrer, 61.67 g of polycarbonate diol "T6002" (OH value=56, number-average molecular weight Mn=2004, Asahi Kasei Chemicals Corp.), 3.93 g of tolylene diisocyanate, 0.07 g of 2,6-di-tert-butyl-4-methyl phenol, 0.01 g of adipic acid, and 0.001 g of di-n-butyltin dilaurate were added, and the mixture was stirred at 80° C. for 3 hours in a dry air atmosphere. Then, 2.61 g of 2-methacryloyloxyethyl isocyanate and 0.001 g of di-n-butyltin dilaurate were added thereto, and the mixture was stirred at 80° C. for 2 hours in a dry air atmosphere.

Then, 22.74 g of ethylene glycol phenyl ether methacrylate, 6.82 g of diethylene glycol butyl ether methacrylate, 0.11 g of trimethylolpropane trimethacrylate, 5.23 g of silica gel C-1504 (FUJI SILYSIA CHEMICAL LTD.), 1.14 g of silicone oil KF-410 (Shin-Etsu Chemical Co., Ltd.), 0.68 g of 2,2-dimethoxy-2-phenylacetophenone, 1.14 g of benzophenone, 0.68 g of 2,6-di-tert-butyl-4-methyl phenol, 2.05 g of triphenyl phosphate, 1.14 g of SANOL LS-785 (Daiichi Sankyo Co., Ltd.), and 0.007 g of a pigment Green AG (NIPPON KAYAKU CO., LTD.) were added thereto, and the mixture was degassed by decreasing the pressure to 13 kPa with stirring at 80° C. to obtain a photosensitive resin composition that was solid at room temperature.

Examples 1 to 9 and Comparative Examples 1 to 2

Each of the photosensitive resin compositions obtained in Synthesis Examples 1 to 9 and Comparative Synthesis Examples 1 to 2 was used to prepare blank printing plates by the method shown below. In this context, the blank printing plates of Examples 1 to 9 were prepared using the photosensitive resin compositions of Synthesis Examples 1 to 9, respectively, and the blank printing plates of Comparative Examples 1 to 2 were prepared using the photosensitive resin compositions of Comparative Synthesis Examples 1 to 2, respectively.

A thin layer of diethylene glycol was applied onto a 12×11×0.3 cm glass plate. Then, a PET film was placed thereon and rubbed against the diethylene glycol layer using a spatula to bring the intimate contact therebetween. Onto the film, a 10-cm-square frame prepared with a sponge frame was fixed by use of a double-sided tape, and aluminum spacers of 3 mm in thickness were placed in four outside corners of the frame. This prepared jig was placed on a hot plate at approximately 90° C.

Each of the resin compositions was poured into the frame of the jig and then covered with a glass plate coated with diethylene glycol and further with a PET film such that the PET film surface came into contact with the resin composition. Then, the upper and lower glass plates were clipped for securing.

This jig was exposed to light at a dose of 500 mJ/cm$^2$ (illuminance: 33.7 mW/cm$^2$, time: 14.8 seconds) using a high-pressure mercury lamp (HC-98, SEN ENGINEERING CO., LTD.), and then, the reverse side of the jig was further exposed to light at a dose of 500 mJ/cm$^2$. This procedure was performed again on both the sides (total exposure of 2000 mJ/cm$^2$) to prepare blank printing plates.

Results of measuring the resistance of the polycarbonate diols of each Synthesis Example and Comparative Synthesis Example in the solvent (N-methyl-2-pyrrolidone) are shown in Table 1.

Results of measuring the laser engravability and rate of mass change caused by each solvent, of the blank printing plates of each Example and Comparative Example are also shown in Table 1.

TABLE 1

| | Polycarbonate diol | | | | Properties of blank printing plate | | | | | | | |
|---|---|---|---|---|---|---|---|---|---|---|---|---|
| | | | | | | Laser engravability | | Rate of mass change (% by mass) | | | | |
| | Main repeating unit | Mn | Solubility in NMP (% by mass) | Polyisocyanate compound | Hardness | Generation of viscous liquid debris | Sharpness of line drawing | NMP | Butyl acetate | Ethyl acetate | Toluene | Xylene |
| Ex. 1 | $-[O-(CH_2)_2-O]_2-C(=O)-$ | 1,843 | — | Tolylene diisocyanate | 37 | Low | Good | — | 10 | — | 18 | 5 |
| Ex. 2 | $-[O-(CH_2)_2-O]_2-C(=O)-$ | 1,843 | — | Tolylene diisocyanate | — | Low | Good | — | — | — | 3 | 06 |
| Ex. 3 | $-[O-(CH_2)_2-O]_2-C(=O)-$ | 1,843 | — | Tolylene diisocyanate | — | Low | Good | — | — | — | 2 | 0.7 |
| Ex. 4 | $-[O-(CH_2)_2-O]_2-C(=O)-$ | 1,843 | — | Hexamethylene diisocyanate | — | Slightly high | Slightly blur | — | — | — | 28 | 12 |
| Ex. 5 | $-[O-(CH_2)_{20}-O-C(=O)]-$ | 2,476 | 0.5 | Tolylene diisocyanate | 79 | Low | Good | 15 | — | 27 | — | — |
| Ex. 6 | $-[O-(CH_2)_{20}-O-C(=O)]-$ | 2,476 | — | Tolylene diisocyanate | 81 | Low | Good | 6 | — | 9 | — | — |
| Ex. 7 | $-[O-(CH_2)_7-CH(CH_3)-(CH_2)_4-CH(CH_3)-(CH_2)_7-O-C(=O)]-$ | 3,927 | — | Tolylene diisocyanate | — | Low | Good | 16 | — | — | — | — |

TABLE 1-continued

| | Polycarbonate diol | | | | Properties of blank printing plate | | | | | | | |
|---|---|---|---|---|---|---|---|---|---|---|---|---|
| | | | Solubility in | | | Laser engravability | | Rate of mass change (% by mass) | | | | |
| | Main repeating unit | Mn | NMP (% by mass) | Polyisocyanate compound | Hardness | Generation of viscous liquid debris | Sharpness of line drawing | NMP | Butyl acetate | Ethyl acetate | Toluene | Xylene |
| Ex. 8 | $-\!\!\left[\mathrm{O}\!-\!(\mathrm{CH}_2)_{12}\!-\!\mathrm{O}\!-\!\underset{\mathrm{O}}{\mathrm{C}}\right]\!-$ | 2,371 | 1.2 | Tolylene diisocyanate | 66 | Low | Good | 10 | — | 19 | — | — |
| Ex. 9 | $-\!\!\left[\mathrm{O}\!-\!(\mathrm{CH}_2)_{20}\!-\!\mathrm{O}\!-\!\underset{\mathrm{O}}{\mathrm{C}}\right]\!-$ | 1,781 | 2 | Tolylene diisocyanate | 70 | Low | Good | 29 | — | — | — | — |
| Com. Ex. 1 | $-\!\!\left[\mathrm{O}\!-\!(\mathrm{CH}_2)_{12}\!-\!\mathrm{O}\!-\!\underset{\mathrm{O}}{\mathrm{C}}\right]\!-$ | 2,493 | 40 | Tolylene diisocyanate | 49 | Low | Good | 183 | 24 | 80 | 39 | — |
| Com. Ex. 2 | $-\!\!\left[\mathrm{O}\!-\!(\mathrm{CH}_2)_{4}\!-\!\mathrm{O}\!-\!\underset{\mathrm{O}}{\mathrm{C}}\right]\!-$ | 2,004 | 50 | Tolylene diisocyanate | 54 | Low | Good | 143 | — | — | — | — |
| | $-\!\!\left[\mathrm{O}\!-\!(\mathrm{CH}_2)_{6}\!-\!\mathrm{O}\!-\!\underset{\mathrm{O}}{\mathrm{C}}\right]\!-$ | | | | | | | | | | | |

As seen from the results of Table 1, the polycarbonate diols used in Examples were low soluble in NMP (N-methyl-2-pyrrolidone) and excellent in solvent resistance.

Moreover, the blank printing plates of Examples exhibited a lower rate of mass change caused by the solvents such as NMP and toluene than that of the blank printing plates of Comparative Examples 1 and 2 represented by the formula (1) wherein n of $R_1$ is 1 or the formula (2) wherein $R_2$ has carbon atoms less than 10, and were excellent in solvent resistance.

Furthermore, the use of the aromatic diisocyanate as the polyisocyanate compound in the blank printing plate production gave blank printing plates having better performance as to solvent resistance and laser engravability than that obtained using the aliphatic diisocyanate.

[Regarding Process for Producing Conductive Layer]

Example 10

(Printing Evaluation of Conductive Layer)

The photosensitive resin composition obtained in Synthesis Example 2 was used to prepare a blank printing plate in the same way as in Example 2. The laser engravability of the blank printing plate is shown in Table 2. The blank printing plate was patterned by laser engraving to prepare a printing plate, which was then used to conduct the printing evaluation of a conductive ink. In printing, a printability tester for flexo (IGT-F1, manufactured by IGT Testing Systems) was used, and the printing plate was attached onto the printing cylinder by use of a double-sided tape. Polyethylene terephthalate (thickness: 100 μm) was treated to have a highly adhesive surface. A conductive ink comprising 100 parts by mass of "Silver NanoPaste" (trademark, manufactured by HARIMA CHEMICALS, INC.) supplemented with 30 parts by mass of xylene was prepared as a conductive ink containing silver ultrafine particles (average particle size: 7 nm) dispersed therein and printed at an ink film thickness of 1 μm (after baking) onto the highly adhesive surface, followed by drying and baking. The results are shown in Table 2.

(Measurement of Rate of Mass Change)

A test sample prepared from the blank printing plate was dipped in the xylene used in the conductive ink and a mixed solvent (ethyl acetate/2-propanol=20/80% by mass) at 20° C. for 24 hours. Then, the drops attached to the surface were wiped off. The amount of the mass increased was measured to determine a rate of mass change according to the method for measuring a rate of mass change. The results are shown in Table 2.

Example 11

(Printing Evaluation of Conductive Layer)

The photosensitive resin composition obtained in Synthesis Example 6 was used to prepare a blank printing plate in the same way as in Example 6. The laser engravability of the blank printing plate is shown in Table 2. The blank printing plate was patterned by laser engraving to prepare a printing plate, which was then used to conduct the printing evaluation of a conductive layer. In printing, a printability tester for flexo (IGT-F1, manufactured by IGT Testing Systems) was used, and the printing plate was attached onto the printing cylinder by use of a double-sided tape. Polyethylene terephthalate (thickness: 100 μm) was treated to have a highly adhesive surface. A conductive ink comprising 100 parts by mass of "Silver NanoPaste" (trademark, manufactured by HARIMA CHEMICALS, INC.) supplemented with 30 parts by mass of a mixed solvent (ethyl acetate/2-propanol=20/80% by mass) was prepared as a conductive ink containing silver ultrafine particles (average particle size: 7 nm) dispersed therein and printed at an ink film thickness of 1 μm (after baking) onto the highly adhesive surface, followed by drying and baking. The results are shown in Table 2.

(Measurement of Rate of Mass Change)

A test sample prepared from the blank printing plate was dipped in the mixed solvent (ethyl acetate/2-propanol=20/80% by mass) used in the conductive ink at 20° C. for 24 hours. Then, the drops attached to the surface were wiped off. The amount of the mass increased was measured to determine a rate of mass change according to the method for measuring a rate of mass change. The results are shown in Table 2.

Example 12

(Printing Evaluation of Conductive Layer)

The photosensitive resin composition obtained in Synthesis Example 8 was used to prepare a blank printing plate in the same way as in Example 8. The laser engravability of the blank printing plate is shown in Table 2. The blank printing plate was patterned by laser engraving to prepare a printing plate, which was then used to perform printing, drying, and baking in the same way as in Example 11. The results are shown in Table 2.

(Measurement of Rate of Mass Change)

A test sample prepared from the blank printing plate was dipped in the mixed solvent (ethyl acetate/2-propanol=20/80% by mass) used in the conductive ink at 20° C. for 24 hours. Then, the drops attached to the surface were wiped off. The amount of the mass increased was measured to determine a rate of mass change according to the method for measuring a rate of mass change. The results are shown in Table 2.

Comparative Example 3

(Printing Evaluation of Conductive Layer)

The photosensitive resin composition obtained in Comparative Synthesis Example 1 was used to prepare a blank printing plate in the same way as in Comparative Example 1. The laser engravability of the blank printing plate is shown in Table 2. The blank printing plate was patterned by laser engraving to prepare a printing plate, which was then used to perform printing, drying, and baking in the same way as in Example 10. The results are shown in Table 2.

(Measurement of Rate of Mass Change)

A test sample prepared from the blank printing plate was dipped in the xylene used in the conductive ink and a mixed solvent (ethyl acetate/2-propanol=20/80% by mass) at 20° C. for 24 hours. Then, the drops attached to the surface were wiped off. The amount of the mass increased was measured to determine a rate of mass change according to the method for measuring a rate of mass change. The results are shown in Table 2.

Comparative Example 4

(Printing Evaluation of Conductive Layer)

The photosensitive resin composition obtained in Comparative Synthesis Example 2 was used to prepare a blank printing plate in the same way as in Comparative Example 2. The laser engravability of the blank printing plate is shown in Table 2. The blank printing plate was patterned by laser engraving to prepare a printing plate, which was then used to perform printing, drying, and baking in the same way as in Example 10. The results are shown in Table 2.

(Measurement of Rate of Mass Change)

A test sample prepared from the blank printing plate was dipped in the xylene used in the conductive ink and a mixed solvent (ethyl acetate/2-propanol=20/80% by mass) at 20° C. for 24 hours. Then, the drops attached to the surface were wiped off. The amount of the mass increased was measured to determine a rate of mass change according to the method for measuring a rate of mass change. The results are shown in Table 2.

blank printing plate is shown in Table 3. The blank printing plate was patterned by laser engraving to prepare a printing plate, which was then used to conduct the printing evaluation of an organic light-emitting layer. In printing, a printability tester for flexo (IGT-F1, manufactured by IGT Testing Systems) was used, and the printing plate was attached onto the printing cylinder by use of a double-sided tape. To prepare a substrate to be printed, an ITO membrane (positive electrode) of 0.1 μm in thickness was formed by a vacuum deposition

TABLE 2

| | Polycarbonate diol | | | Laser engravability | | Rate of mass change (% by mass) | | Thickness of conductive layer |
|---|---|---|---|---|---|---|---|---|
| | Main repeating unit | Mn | Generation of viscous liquid debris | Sharpness of line drawing | Xylene | Ethyl acetate/2-propanol (20/80% by mass) | (m̄) |
| Ex. 10 | 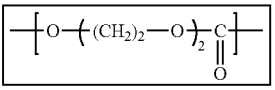 | 1.843 | Low | Good | 0.6 | 2.5 | 1 ± 0.1 |
| Ex. 11 | 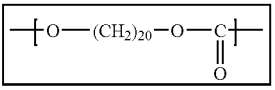 | 2.476 | Low | Good | — | 1.8 | 1 ± 0.1 |
| Ex. 12 | 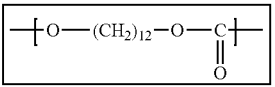 | 2.371 | Low | Good | — | 2.0 | 1 ± 0.1 |
| Com. Ex. 3 | 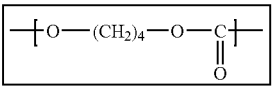 | 2.493 | Low | Good | 39 | 23 | 1 ± 0.5 |
| Com. Ex. 4 | 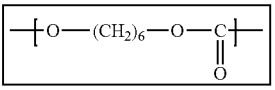 | 2.004 | Low | Good | 58 | 32 | 1 ± 0.8 |

The results of Table 2 demonstrated that Comparative Examples 3 and 4 represented by the formula (1) wherein n of $R_1$ is 1 or the formula (2) wherein $R_2$ has carbon atoms less than 10 exhibit a high rate of mass change caused by the solvents and are inferior in conductive layer precision.

Moreover, the use of the printing plates of Examples can decrease the thickness variation of the printed conductive layer, since the thickness variation of these printing plates due to solvent-induced swelling can be low. The use of the printing plates of Examples can control, with high precision, the thickness of the conductive layer, which is directly associated with conductive circuit performance.

[Regarding Process for Producing Organic Light-emitting Layer]

Example 13

(Printing Evaluation of Organic Light-Emitting Layer)

The photosensitive resin composition obtained in Synthesis Example 2 was used to prepare a blank printing plate in the same way as in Example 2. The laser engravability of the method on the surface of a glass substrate (soda-lime glass) of 0.7 mm in thickness and then subjected to UV-ozone washing to remove adherents such as organic matter. Then, a coating solution containing polyethylene dioxythiophene as a hole transport material (polyethylene dioxythiophene-polystyrene sulfonate (PEDT/PSS), manufactured by Bayer, trade name "Baytron P") was applied by a spin coating method onto the ITO membrane surface of the substrate and dried at 70 to 80° C. to prepare a hole transport layer. Poly(9,9-dialkylfluorene (PDAF)) was used as an organic polymer light-emitting material and dissolved at a solid concentration of 2% by mass in a solvent (xylene) to prepare an ink for formation of a light-emitting layer (organic light-emitting ink), which was in turn printed onto the coated substrate. The results are shown in Table 3.

(Measurement of Rate of Mass Change)

A test sample prepared from the blank printing plate was dipped in the xylene used in the organic light-emitting ink at 20° C. for 24 hours. Then, the drops attached to the surface were wiped off. The amount of the mass increased was measured to determine a rate of mass change according to the method for measuring a rate of mass change. The results are shown in Table 3.

Example 14

(Printing Evaluation of Organic Light-Emitting Layer)

The photosensitive resin composition obtained in Synthesis Example 5 was used to prepare a blank printing plate in the same way as in Example 5. The laser engravability of the blank printing plate is shown in Table 3. The blank printing plate was patterned by laser engraving to prepare a printing plate, which was then used to conduct the printing evaluation of an organic light-emitting layer in the same way as in Example 13 except that methyl ethyl ketone was used instead of xylene. The results are shown in Table 3.

(Measurement of Rate of Mass Change)

A test sample prepared from the blank printing plate was dipped in the methyl ethyl ketone used in the organic light-emitting ink at 20° C. for 24 hours. Then, the drops attached to the surface were wiped off. The amount of the mass increased was measured to determine a rate of mass change according to the method for measuring a rate of mass change. The results are shown in Table 3.

Comparative Example 5

(Printing Evaluation of Organic Light-Emitting Layer)

The photosensitive resin composition obtained in Comparative Synthesis Example 1 was used to prepare a blank printing plate in the same way as in Comparative Example 1. The laser engravability of the blank printing plate is shown in Table 3. The blank printing plate was patterned by laser engraving to prepare a printing plate, which was then used to perform printing, drying, and baking in the same way as in Example 13. The results are shown in Table 3.

(Measurement of Rate of Mass Change)

A test sample prepared from the blank printing plate was dipped in the xylene used in the organic light-emitting ink and methyl ethyl ketone at 20° C. for 24 hours. Then, the drops attached to the surface were wiped off. The amount of the mass increased was measured to determine a rate of mass change according to the method for measuring a rate of mass change. The results are shown in Table 3.

Comparative Example 6

(Printing Evaluation of Organic Light-emitting Layer)

The photosensitive resin composition obtained in Comparative Synthesis Example 2 was used to prepare a blank printing plate in the same way as in Comparative Example 2. The laser engravability of the blank printing plate is shown in Table 3. The blank printing plate was patterned by laser engraving to prepare a printing plate, which was then used to perform printing, drying, and baking in the same way as in Example 13. The results are shown in Table 3.

(Measurement of Rate of Mass Change)

A test sample prepared from the blank printing plate was dipped in the xylene used in the organic light-emitting ink and methyl ethyl ketone at 20° C. for 24 hours. Then, the drops attached to the surface were wiped off. The amount of the mass increased was measured to determine a rate of mass change according to the method for measuring a rate of mass change. The results are shown in Table 3.

TABLE 3

| | Polycarbonate diol | | Laser engravability | | Rate of mass change (% by mass) | | Thickness of organic light-emitting layer (nm) |
|---|---|---|---|---|---|---|---|
| | Main repeating unit | Mn | Generation of viscous liquid debris | Sharpness of line drawing | Xylene | Methyl ethyl ketone | |
| Ex. 13 | $-[O-(CH_2)_2-O]_2-C(=O)-$ | 1.843 | Low | Good | 0.6 | — | 120 ± 3 |
| Ex. 14 | $-[O-(CH_2)_{20}-O-C(=O)]-$ | 2.476 | Low | Good | — | 2.0 | 120 ± 4 |
| Com. Ex. 5 | $-[O-(CH_2)_4-O-C(=O)]-$ | 2.493 | Low | Good | 39 | 78 | 120 ± 24 |
| Com. Ex. 6 | $-[O-(CH_2)_6-O-C(=O)]-$ | 2.004 | Low | Good | 58 | 66 | 120 ± 26 |

The results of Table 3 demonstrated that Comparative Examples 5 and 6 represented by the formula (1) wherein n of $R_1$ is 1 or the formula (2) wherein $R_2$ has carbon atoms less than 10 exhibit a high rate of mass change caused by the solvents and are inferior in organic light-emitting layer precision.

Moreover, the use of the printing plates of Examples can decrease the thickness variation of the printed organic light-emitting layer, since the thickness variation of these printing plates due to solvent-induced swelling can be low. Moreover, the printing plates of Examples can control, with high precision, the thickness of the organic light-emitting layer, which is directly associated with organic EL element performance.

[Regarding Process for Producing Liquid Crystal Orientation Film]

Example 15

(Printing Evaluation of Liquid Crystal Orientation Film)

The photosensitive resin composition obtained in Synthesis Example 5 was used to prepare a blank printing plate in the same way as in Example 5. The laser engravability of the blank printing plate is shown in Table 4. The blank printing plate was 50% dot-patterned (relief depth: 20 μm) by laser engraving to prepare a printing plate, which was then used to conduct the printing evaluation of a liquid crystal orientation film. In printing, a printability tester for flexo (IGT-F1, manufactured by IGT Testing Systems) was used, and the printing plate was attached onto the printing cylinder by use of a double-sided tape. To prepare a substrate to be printed, an ITO membrane (positive electrode) of 0.1 μm in thickness was formed by a vacuum deposition method on the surface of a glass substrate (soda-lime glass) of 1.0 mm in thickness and then subjected to UV-ozone washing to remove adherents such as organic matter. Then, a 3% (by mass) solution of polyamic acid varnish (solvent: N-methyl-2-pyrrolidone/butyl cellosolve=90/10) was applied as a liquid crystal orientation film solution onto the ITO membrane surface of the substrate and baked at 220° C. for 1 hour to prepare a polyimide membrane. The results are shown in Table 4.

(Measurement of Rate of Mass Change)

A test sample prepared from the blank printing plate was dipped in the N-methyl-2-pyrrolidone/butyl cellosolve=90/10 mixed solvent used in the liquid crystal orientation film solution at 20° C. for 24 hours. Then, the drops attached to the surface were wiped off. The amount of the mass increased was measured to determine a rate of mass change according to the method for measuring a rate of mass change. The results are shown in Table 4.

Example 16

(Printing Evaluation of Liquid Crystal Orientation Film)

The photosensitive resin composition obtained in Synthesis Example 6 was used to prepare a blank printing plate in the same way as in Example 6. The laser engravability of the blank printing plate is shown in Table 4. The blank printing plate was 50% dot-patterned (relief depth: 20 μm) by laser engraving to prepare a printing plate, which was then used to conduct the printing evaluation of a liquid crystal orientation film solution in the same way as in Example 15. The results are shown in Table 4.

(Measurement of Rate of Mass Change)

A test sample prepared from the blank printing plate was dipped in the N-methyl-2-pyrrolidone/butyl cellosolve=90/10 mixed solvent used in the liquid crystal orientation film solution at 20° C. for 24 hours. Then, the drops attached to the surface were wiped off. The amount of the mass increased was measured to determine a rate of mass change according to the method for measuring a rate of mass change. The results are shown in Table 4.

Example 17

(Printing Evaluation of Liquid Crystal Orientation Film)

The photosensitive resin composition obtained in Synthesis Example 8 was used to prepare a blank printing plate in the same way as in Example 8. The laser engravability of the blank printing plate is shown in Table 4. The blank printing plate was 50% dot-patterned (relief depth: 20 μm) by laser engraving to prepare a printing plate, which was then used to conduct the printing evaluation of a liquid crystal orientation film solution in the same way as in Example 15. The results are shown in Table 4.

(Measurement of Rate of Mass Change)

A test sample prepared from the blank printing plate was dipped in the N-methyl-2-pyrrolidone/butyl cellosolve=90/10 mixed solvent used in the liquid crystal orientation film solution at 20° C. for 24 hours. Then, the drops attached to the surface were wiped off. The amount of the mass increased was measured to determine a rate of mass change according to the method for measuring a rate of mass change. The results are shown in Table 4.

Conductive Example 7

(Printing Evaluation of Liquid Crystal Orientation Film)

The photosensitive resin composition obtained in Comparative Synthesis Example 1 was used to prepare a blank printing plate in the same way as in comparative Example 1. The laser engravability of the blank printing plate is shown in Table 4. The blank printing plate was 50% dot-patterned (relief depth: 20 μm) by laser engraving to prepare a printing plate, which was then used to perform printing, drying, and baking in the same way as in Example 15. The results are shown in Table 4.

(Measurement of Rate of Mass Change)

A test sample prepared from the blank printing plate was dipped in the N-methyl-2-pyrrolidone/butyl cellosolve=90/10 mixed solvent used in the liquid crystal orientation film solution at 20° C. for 24 hours. Then, the drops attached to the surface were wiped off. The amount of the mass increased was measured to determine a rate of mass change according to the method for measuring a rate of mass change. The results are shown in Table 4.

Conductive Example 8

(Printing Evaluation of Liquid Crystal Orientation Film)

The photosensitive resin composition obtained in Comparative Synthesis Example 2 was used to prepare a blank printing plate in the same way as in Comparative Example 2. The laser engravability of the blank printing plate is shown in Table 4. The blank printing plate was 50% dot-patterned (relief depth: 20 μm) by laser engraving to prepare a printing plate, which was then used to perform printing, drying, and baking in the same way as in Example 15. The results are shown in Table 4.

(Measurement of Rate of Mass Change)

A test sample prepared from the blank printing plate was dipped in the N-methyl-2-pyrrolidone/butyl cellosolve=90/10 mixed solvent used in the liquid crystal orientation film solution at 20° C. for 24 hours. Then, the drops attached to the surface were wiped off. The amount of the mass increased was measured to determine a rate of mass change according to the method for measuring a rate of mass change. The results are shown in Table 4.

(Preparation of Pigment Dispersion)

11.2 g of titanium black particles surface-coated with silicon oxide, 18.7 g of the polyamic acid solution having a

TABLE 4

| | Polycarbonate diol | | Properties of blank printing plate | | | |
|---|---|---|---|---|---|---|
| | | | Laser engravability | | Rate of mass change (% by mass) | Tthickness of |
| | | | Generation of viscous liquid | Sharpness of | N-methyl-2-pyrrolidone/butyl | liquid crystal orientation |
| | Main repeating unit | Mn | debris | line drawing | cellosolve = 90/10 | memebrane (nm) |
| Ex. 15 | —[O—(CH$_2$)$_{20}$—O—C(=O)]— | 2.476 | Low | Good | 3 | 50 ± 2 |
| Ex. 16 | —[O—(CH$_2$)$_{20}$—O—C(=O)]— | 2.476 | Low | Good | 3 | 50 ± 3 |
| Ex. 17 | —[O—(CH$_2$)$_{12}$—O—C(=O)]— —[O—(CH$_2$)$_{20}$—O—C(=O)]— | 2.371 | Low | Good | 3 | 50 ± 3 |
| Com. Ex. 7 | —[O—(CH$_2$)$_4$—O—C(=O)]— | 2.493 | Low | Good | 124 | 50 ± 11 |
| Com. Ex. 8 | —[O—(CH$_2$)$_6$—O—C(=O)]— | 2.004 | Low | Good | 108 | 50 ± 14 |

The results of Table 4 demonstrated that Comparative Examples 7 and 8 represented by the formula (1) wherein n of $R_1$ is 1 or the formula (2) wherein $R_2$ has carbon atoms less than 10 exhibit a high rate of mass change caused by the solvents and are inferior in liquid crystal orientation film precision.

Moreover, the use of the printing plates of Examples can decrease the thickness variation of the printed liquid crystal orientation film, since the thickness variation of these printing plates due to solvent-induced swelling can be low. Moreover, the printing plates of Examples can control, with high precision, the thickness of the liquid crystal orientation film, which is directly associated with liquid crystal orientation apparatus performance.

[Regarding Process for Producing Black Matrix]

Example 18

(Preparation of Polyamic Acid Solution)

In a γ-butyrolactone (3825 g) solvent, pyromellitic dianhydride (149.6 g), benzophenonetetracarboxylic dianhydride (225.5 g), 3,3'-diaminodiphenyl ether (210.2 g), and bis-3-(aminopropyl)tetramethylsiloxane (17.4 g) were reacted at 60° C. for 3 hours. Then, maleic anhydride (2.25 g) was added thereto, and the mixture was further reacted at 60° C. for 1 hour to obtain a polyamic acid solution (polymer concentration: 15% by mass) as a precursor.

polymer concentration of 15% by mass, 57.2 g of N-methyl-2-pyrrolidone, 12.9 g of 3-methyl-3-methoxybutyl acetate, and 100 g of glass beads were treated using a homogenizer at 7000 rpm for 30 minutes. Then, the glass beads were removed by filtration to obtain a pigment dispersion having a pigment concentration of 14% by mass. This solution had a titanium black/polyimide resin mass ratio of 80/20.

In this context, a method for forming an insulating coating on the titanium black-resin surface is as follows: first, titanium black was dispersed in water and then fully disintegrated using a Dyno-mill disintegrator. To the dispersion, an ethyl alcohol solution of silicon tetraethoxide was added dropwise to form a silicon oxide coating as an insulating coating on the titanium black surface. Then, the product was filtered, dried, and then pulverized to obtain titanium black on which the insulating coating was formed.

To 27.5 g of the pigment dispersion, 3.7 g of the polyamic acid solution having a polymer concentration of 15% by mass, 1 g of γ-butyrolactone, 6 g of N-methyl-2-pyrrolidone, and 1.8 g of 3-methyl-3-methoxybutyl acetate were added and mixed to prepare a black paste.

(Printing Evaluation of Black Matrix)

The photosensitive resin composition obtained in Synthesis Example 5 was used to prepare a blank printing plate in the same way as in Example 5. The laser engravability of the blank printing plate is shown in Table 5. The blank printing plate was patterned by laser engraving to prepare a printing plate, which was then used to conduct the printing evaluation of the black paste. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The black paste was printed at a black matrix film thickness of 1 µm (after baking) onto the substrate and then prebaked at 145° C. to form a polyimide precursor thin film. Subsequently, the polyimide precursor thin film was heated to 290° C. for thermal curing such that it was converted to a polyimide film, which was in turn used as a black matrix. The results are shown in Table 5.

(Measurement of Rate of Mass Change)

A test sample prepared from the blank printing plate was dipped in the N-methyl-2-pyrrolidone/γ-butyrolactone/3-methyl-3-methoxybutyl acetate=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 5.

Example 19

(Printing Evaluation of Black Matrix)

The photosensitive resin composition obtained in Synthesis Example 6 was used to prepare a blank printing plate in the same way as in Example 6. The laser engravability of the blank printing plate is shown in Table 5. The blank printing plate was patterned by laser engraving to prepare a printing plate, which was then used to conduct printing evaluation in the same way as in Example 18. The results are shown in Table 5.

(Measurement of Rate of Mass Change)

A test sample prepared from the blank printing plate was dipped in the N-methyl-2-pyrrolidone/γ-butyrolactone/3-methyl-3-methoxybutyl acetate=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 5.

Example 20

(Printing Evaluation of Black Matrix)

The photosensitive resin composition obtained in Synthesis Example 8 was used to prepare a blank printing plate in the same way as in Example 8. The laser engravability of the blank printing plate is shown in Table 5. The blank printing plate was patterned by laser engraving to prepare a printing plate, which was then used to perform printing, drying, and baking in the same way as in Example 18. The results are shown in Table 5.

(Measurement of Rate of Mass Change)

A test sample prepared from the blank printing plate was dipped in the N-methyl-2-pyrrolidone/γ-butyrolactone/3-methyl-3-methoxybutyl acetate=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 5.

Example 21

(Printing Evaluation of Black Matrix)

The photosensitive resin composition obtained in Synthesis Example 10 was used to prepare a blank printing plate in the same way as in Example 18. The laser engravability of the blank printing plate is shown in Table 5. The blank printing plate was patterned by laser engraving to prepare a printing plate, which was then used to perform printing, drying, and baking in the same way as in Example 18. The results are shown in Table 5.

(Measurement of Rate of Mass Change)

A test sample prepared from the blank printing plate was dipped in the N-methyl-2-pyrrolidone/γ-butyrolactone/3-methyl-3-methoxybutyl acetate=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 5.

Comparative Example 9

(Printing Evaluation of Black Matrix)

The photosensitive resin composition obtained in Comparative Synthesis Example 1 was used to prepare a blank printing plate in the same way as in Comparative Example 1. The laser engravability of the blank printing plate is shown in Table 5. The blank printing plate was patterned by laser engraving to prepare a printing plate, which was then used to perform printing, drying, and baking in the same way as in Example 18. The results are shown in Table 5.

(Measurement of Rate of Mass Change)

A test sample prepared from the blank printing plate was dipped in the N-methyl-2-pyrrolidone/γ-butyrolactone/3-methyl-3-methoxybutyl acetate=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 5.

Comparative Example 10

(Printing Evaluation of Black Matrix)

The photosensitive resin composition obtained in Comparative Synthesis Example 2 was used to prepare a blank printing plate in the same way as in Comparative Example 2. The laser engravability of the blank printing plate is shown in Table 5. The blank printing plate was patterned by laser engraving to prepare a printing plate, which was then used to perform printing, drying, and baking in the same way as in Example 18. The results are shown in Table 5.

(Measurement of Rate of Mass Change)

A test sample prepared from the blank printing plate was dipped in the N-methyl-2-pyrrolidone/γ-butyrolactone/3-methyl-3-methoxybutyl acetate=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 5.

The following printing evaluations were conducted using the printing plates of Examples 18 to 21 and Comparative Examples 9 and 10. The results are shown in Table 5.

(Volume Electrical Resistivity (ρ) of Black Matrix Coating)

The volume electrical resistivity (ρ) of the black matrix coating was determined according to the following calculation formula (Iv) using the Ohm's law from electric current (I) obtained by applying voltage to the black matrix coating (an electrode cross-section was defined as (S) and an electrode distance was defined as (d)):

$$\rho = (V/I) \cdot (d/S) \quad \text{(iv)}$$

(Measurement of Optical Density (OD) Value of Black Matrix)

The optical density of the black matrix was determined according to the following calculation formula (v) using a microspectroscope (MCPD2000, manufactured by OTSUKA ELECTRONICS CO., LTD.):

$$OD\ value = \log_{10}(I_0/I) \quad \text{(v)}$$

wherein $I_0$ represents incident light intensity; and I represents transmitted light intensity.

[Regarding Process for Producing Colored Layer for Color Filter]

Example 22

(Preparation of Ink for Colored Layer)

In a γ-butyrolactone/N-methyl-2-pyrrolidone mixed solvent, pyromellitic dianhydride (0.49 mol equivalent), 4,4'-diaminodiphenyl ether (0.95 mol equivalent), and bis-3-(aminopropyl)tetramethylsiloxane (0.05 mol equivalent) were reacted to obtain a polyamic acid solution (polymer concentration: 20% by mass). To a 200 g aliquot of this polyamic acid solution, 186 g of γ-butyrolactone and 64 g of butyl cellosolve were added to obtain polyamic acid for pixels having a polymer concentration of 10% by mass.

4 g of Pigment Red 177 (anthraquinone red), 40 g of γ-butyrolactone, 6 g of butyl cellosolve, and 100 g of glass beads were treated for dispersion using a homogenizer at

TABLE 5

| | Polycarbonate diol | | Properties of blank printing plate | | Rate of mass change (% by mass) | Properties of black matrix | | |
|---|---|---|---|---|---|---|---|---|
| | | | Laser engravability | | | | | |
| | | | Generation of viscous liquid | Sharpness of | Solvent for formation of | Thickness | Electrical resistivity | |
| | Main repeating unit | Mn | debris | line drawing | black matrix*1 | (Ξm) | (Ξ · cm) | OD value |
| Ex 18 | —[O—(CH$_2$)$_{20}$—O—C(=O)]— | 2.476 | Low | Good | 3 | 1 ± 0.03 | 4.8 × 10$^{11}$ | 3.2 |
| Ex 19 | —[O—(CH$_2$)$_{20}$—O—C(=O)]— | 2.476 | Low | Good | 3 | 1 ± 0.03 | 4.8 × 10$^{11}$ | 3.2 |
| Ex 20 | —[O—(CH$_2$)$_{12}$—O—C(=O)]— —[O—(CH$_2$)$_{20}$—O—C(=O)]— | 2.371 | Low | Good | 4 | 1 ± 0.04 | 4.8 × 10$^{11}$ | 3.2 |
| Ex 21 | —[O—((CH$_2$)$_9$—O)$_2$—C(=O)]— | 2.196 | Low | Good | 5 | 1 ± 0.04 | 4.8 × 10$^{11}$ | 3.2 |
| Com. Ex 9 | —[O—(CH$_2$)$_4$—O—C(=O)]— | 2.493 | Low | Good | 100 | 1 ± 0.21 | RGB pixels unprintable due to nonuniform openings | |
| Com. Ex 10 | —[O—(CH$_2$)$_6$—O—C(=O)]— | 2.004 | Low | Good | 90 | 1 ± 0.33 | RGB pixels unprintable due to nonuniform openings | |

*1 N-methyl-2-pyrrolidone/Ξbutyrolactone/3-methyl-3-methoxybutyl acetate = 1/1/1 (mass ratio)

The results of Table 5 demonstrated that Comparative Examples 9 and 10 represented by the formula (1) wherein n of $R_1$ is 1 or the formula (2) wherein $R_2$ has carbon atoms less than 10 exhibit a high rate of mass change caused by the solvents and are inferior in black matrix precision.

Moreover, the use of the printing plates of Examples can decrease the thickness variation of the printed black matrix, since the thickness variation of these printing plates due to solvent-induced swelling can be low. The use of the printing plates of Examples can control, with high precision, the thickness of the black matrix, which is directly associated with color filter performance for liquid crystal display.

7000 rpm for 30 minutes. Then, the glass beads were removed by filtration to obtain a dispersion having a pigment concentration of 8% by mass. To 30 g of the pigment dispersion, 30 g of the polyamic acid solution for pixels having a polymer concentration of 10% by mass was added and mixed to obtain a red paste.

(Printing Evaluation of Colored Layer)

The photosensitive resin composition obtained in Synthesis Example 5 was used to prepare a blank printing plate in the same way as in Example 5. The laser engravability of the blank printing plate is shown in Table 6. The blank printing plate was patterned by laser engraving to prepare a printing plate, which was then used to conduct the printing evaluation of the red paste. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The red paste was printed at a colored layer film thickness of 1 µl (after baking) onto the substrate, then prebaked at 145° C., and then heated to 290° C. for thermal curing. The results are shown in Table 6.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 6.

Example 23

(Printing Evaluation of Colored Layer)

The photosensitive resin composition obtained in Synthesis Example 6 was used to prepare a blank printing plate in the same way as in Example 6. The laser engravability of the blank printing plate is shown in Table 6. The blank printing plate was patterned by laser engraving to prepare a printing plate, which was then used to conduct printing evaluation in the same way as in Example 22. Printing, drying, and baking were performed at a colored layer film thickness of 1 µm (after baking). The results are shown in Table 6.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 6.

Example 24

(Printing Evaluation of Colored Layer)

The photosensitive resin composition obtained in Synthesis Example 8 was used to prepare a blank printing plate in the same way as in Example 8. The laser engravability of the blank printing plate is shown in Table 6. The blank printing plate was patterned by laser engraving to prepare a printing plate, which was then used to conduct printing evaluation in the same way as in Example 22. Printing, drying, and baking were performed at a colored layer film thickness of 1 µm (after baking). The results are shown in Table 6.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 6.

Example 25

(Printing Evaluation of Colored Layer)

The photosensitive resin composition obtained in Synthesis Example 10 was used to prepare a blank printing plate in the same way as in Example 22. The laser engravability of the blank printing plate is shown in Table 6. The blank printing plate was patterned by laser engraving to prepare a printing plate, which was then used to conduct printing evaluation in the same way as in Example 22. Printing, drying, and baking were performed at a colored layer film thickness of 1 µm (after baking). The results are shown in Table 6.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 6.

Comparative Example 11

(Printing Evaluation of Colored Layer)

The photosensitive resin composition obtained in Comparative Synthesis Example 1 was used to prepare a blank printing plate in the same way as in Comparative Example 1. The laser engravability of the blank printing plate is shown in Table 6. The blank printing plate was patterned by laser engraving to prepare a printing plate, which was then used to perform printing, drying, and baking in the same way as in Example 22. The results are shown in Table 6.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 6.

Comparative Example 12

(Printing Evaluation of Colored Layer)

The photosensitive resin composition obtained in Comparative Synthesis Example 2 was used to prepare a blank printing plate in the same way as in Comparative Example 2. The laser engravability of the blank printing plate is shown in Table 6. The blank printing plate was patterned by laser engraving to prepare a printing plate, which was then used to perform printing, drying, and baking in the same way as in Example 22. The results are shown in Table 6.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change according to the method for measuring a rate of mass change. The results are shown in Table 6.

TABLE 6

| | Polycarbonate diol | | Properties of blank printing plate | | Rate of mass change (% by mass) | |
|---|---|---|---|---|---|---|
| | | | Laser engravability | | | |
| | | | Generation of viscous liquid | Sharpness of | Solvent for formation | Thickness of colored layer |
| | Main repeating unit | Mn | debris | line drawing | of colored layer*1 | (0 m) |
| Ex. 22 | $-\!\!+\!\!O\!-\!(CH_2)_{20}\!-\!O\!-\!\underset{\underset{O}{\|}}{C}\!\!+\!\!-$ | 2.476 | Low | Good | 3 | 1 ± 0.03 |
| Ex. 23 | $-\!\!+\!\!O\!-\!(CH_2)_{20}\!-\!O\!-\!\underset{\underset{O}{\|}}{C}\!\!+\!\!-$ | 2.476 | Low | Good | 4 | 1 ± 0.04 |
| Ex. 24 | $-\!\!+\!\!O\!-\!(CH_2)_{12}\!-\!O\!-\!\underset{\underset{O}{\|}}{C}\!\!+\!\!-$ $-\!\!+\!\!O\!-\!(CH_2)_{20}\!-\!O\!-\!\underset{\underset{O}{\|}}{C}\!\!+\!\!-$ | 2.371 | Low | Good | 4 | 1 ± 0.04 |
| Ex. 25 | $-\!\!+\!\!O\!-\!\!+\!\!(CH_2)_9\!-\!O\!\!+\!\!_2\!\underset{\underset{O}{\|}}{C}\!\!+\!\!-$ | 2.196 | Low | Good | 8 | 1 ± 0.05 |
| Com. Ex. 11 | $-\!\!+\!\!O\!-\!(CH_2)_4\!-\!O\!-\!\underset{\underset{O}{\|}}{C}\!\!+\!\!-$ | 2.493 | Low | Good | 106 | 1 ± 0.28 |
| Com. Ex. 12 | $-\!\!+\!\!O\!-\!(CH_2)_6\!-\!O\!-\!\underset{\underset{O}{\|}}{C}\!\!+\!\!-$ | 2.004 | Low | Good | 98 | 1 ± 0.30 |

*1 N-methyl-2-pyrrolidone/0-butyrolactone/butyl cellosolve = 1/1/1 (mass ratio)

The results of Table 6 demonstrated that Comparative Examples 11 and 12 represented by the formula (1) wherein n of $R_1$ is 1 or the formula (2) wherein $R_2$ has carbon atoms less than 10 exhibit a high rate of mass change caused by the solvents and are inferior in colored layer precision for a color filter.

Moreover, the use of the printing plates of Examples can decrease the thickness variation of the printed colored layer for a color filter, since the thickness variation of these printing plates due to solvent-induced swelling can be low. The use of the printing plates of Examples can control, with high precision, the thickness of the colored layer, which is directly associated with color filter performance.

[Regarding Process for Producing Photoelectric Conversion Layer for Organic Thin-film Solar Cells]

Example 26

(Printing Evaluation of Photoelectric Conversion Layer for Organic Thin-film Solar Cells)

Stereoregular poly-3-dodecylthiophene (stereoregularity: 90%) having a molecular weight of 57,000 as a material for forming a hole transport layer and a fullerene derivative (PCBM: [6,6]-phenyl-C61-butyric acid methyl ester) as a material for forming an electron transport layer were weighed at a mass ratio of 1:1. Dehydrated xylene was added thereto to prepare 2.5% by mass of an ink for a photoelectric conversion layer for the organic thin-film solar cells.

The photosensitive resin composition obtained in Synthesis Example 2 was used to prepare a blank printing plate in the same way as in Example 2. The laser engravability of the blank printing plate is shown in Table 7. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to form a photoelectric conversion layer for the organic thin-film solar cells. The results are shown in Table 7.

(Measurement of Rate of Mass Change)

A test sample prepared from the blank printing plate was dipped in xylene at 20° C. for 24 hours. Then, the drops attached to the surface were wiped off. The amount of the mass increased from before to after dipping was measured to determine a rate of mass change. The results are shown in Table 7.

Example 27

(Printing Evaluation of Photoelectric Conversion Layer for Organic Thin-film Solar Cells)

Stereoregular poly-3-dodecylthiophene (stereoregularity: 90%) having a molecular weight of 57,000 as a material for forming a hole transport layer and a fullerene derivative (PCBM: [6,6]-phenyl-C61-butyric acid methyl ester) as a material for forming an electron transport layer were weighed at a mass ratio of 1:1. Dehydrated xylene was added thereto to prepare 2.5% by mass of an ink for a photoelectric conversion layer for the organic thin-film solar cells.

The photosensitive resin composition obtained in Synthesis Example 11 was used to prepare a blank printing plate in the same way as in Example 26. The laser engravability of the blank printing plate is shown in Table 7. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to form a photoelectric conversion layer for the organic thin-film solar cells. The results are shown in Table 7.

(Measurement of Rate of Mass Change)

A test sample prepared from the blank printing plate was dipped in xylene at 20° C. for 24 hours. Then, the drops attached to the surface were wiped off. The amount of the mass increased from before to after dipping was measured to determine a rate of mass change. The results are shown in Table 7.

Example 28

(Printing Evaluation of Photoelectric Conversion Layer for Organic Thin-film Solar Cells)

Stereoregular poly-3-dodecylthiophene (stereoregularity: 90%) having a molecular weight of 57,000 as a material for forming a hole transport layer and a fullerene derivative (PCBM: [6,6]-phenyl-C61-butyric acid methyl ester) as a material for forming an electron transport layer were weighed at a mass ratio of 1:1. Dehydrated xylene was added thereto to prepare 2.5% by mass of an ink for a photoelectric conversion layer for the organic thin-film solar cells.

The photosensitive resin composition obtained in Synthesis Example 12 was used to prepare a blank printing plate in the same way as in Example 26. The laser engravability of the blank printing plate is shown in Table 7. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to form a photoelectric conversion layer for the organic thin-film solar cells. The results are shown in Table 7.

(Measurement of Rate of Mass Change)

A test sample prepared from the blank printing plate was dipped in xylene at 20° C. for 24 hours. Then, the drops attached to the surface were wiped off. The amount of the mass increased from before to after dipping was measured to determine a rate of mass change. The results are shown in Table 7.

Example 29

(Printing Evaluation of Photoelectric Conversion Layer for Organic Thin-film Solar Cells)

Stereoregular poly-3-dodecylthiophene (stereoregularity: 90%) having a molecular weight of 57,000 as a material for forming a hole transport layer and a fullerene derivative (PCBM: [6,6]-phenyl-C61-butyric acid methyl ester) as a material for forming an electron transport layer were weighed at a mass ratio of 1:1. Dehydrated methyl ethyl ketone was added thereto to prepare 2.5% by mass of an ink for a photoelectric conversion layer for the organic thin-film solar cells.

The photosensitive resin composition obtained in Synthesis Example 5 was used to prepare a blank printing plate in the same way as in Example 26. The laser engravability of the blank printing plate is shown in Table 7. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to form a photoelectric conversion layer for the organic thin-film solar cells. The results are shown in Table 7.

(Measurement of Rate of Mass Change)

A test sample prepared from the blank printing plate was dipped in methyl ethyl ketone at 20° C. for 24 hours. Then, the drops attached to the surface were wiped off. The amount of the mass increased from before to after dipping was measured to determine a rate of mass change. The results are shown in Table 7.

Comparative Example 13

(Printing Evaluation of Photoelectric Conversion Layer for Organic Thin-film Solar Cells)

The photosensitive resin composition obtained in Comparative Synthesis Example 1 was used to prepare a blank printing plate in the same way as in Comparative Example 1. The laser engravability of the blank printing plate is shown in Table 7. The blank printing plate was patterned by laser engraving to prepare a printing plate, which was then used to perform printing and drying in the same way as in Example 26. The results are shown in Table 7.

(Measurement of Rate of Mass Change)

A test sample prepared from the blank printing plate was dipped in xylene or methyl ethyl ketone at 20° C. for 24 hours. Then, the drops attached to the surface were wiped off. The amount of the mass increased from before to after dipping was measured to determine a rate of mass change. The results are shown in Table 7.

Comparative Example 14

(Printing Evaluation of Photoelectric Conversion Layer for the Organic Thin-film Solar Cells)

The photosensitive resin composition obtained in Comparative Synthesis Example 2 was used to prepare a blank printing plate in the same way as in Comparative Example 2. The laser engravability of the blank printing plate is shown in Table 7. The blank printing plate was patterned by laser engraving to prepare a printing plate, which was then used to perform printing and drying in the same way as in Example 26. The results are shown in Table 7.

(Measurement of Rate of Mass Change)

A test sample prepared from the blank printing plate was dipped in xylene or methyl ethyl ketone at 20° C. for 24 hours. Then, the drops attached to the surface were wiped off. The amount of the mass increased from before to after dipping was measured to determine a rate of mass change. The results are shown in Table 7.

TABLE 7

| | Polycarbonate diol | | Properties of blank printing plate | | | | |
| --- | --- | --- | --- | --- | --- | --- | --- |
| | | | Laser engravability | | Rate of mass change (% by mass) | | Thickness of photoelectric conversion |
| | Main repeating unit | Mn | Generation of viscous liquid debris | Sharpness of line drawing | Xylene | Methyl ethyl ketone | layer (nm) |
| Ex. 26 | $-[O-(CH_2)_2-O]_2-C(=O)-$ | 1.843 | Low | Good | 0.6 | — | 100 ± 3 |
| Ex. 27 | $-[O-(CH_2)_2-O]_2-C(=O)-$ | 1.843 | Low | Good | 0.6 | — | 100 ± 3 |
| Ex. 28 | $-[O-(CH_2)_4-O]_2-C(=O)-$ | 2.011 | Low | Good | 0.8 | — | 100 ± 5 |
| Ex. 29 | $-O-(CH_2)_{20}-O-C(=O)-$ | 2.476 | Low | Good | — | 2.0 | 100 ± 5 |
| Com. Ex. 13 | $-O-(CH_2)_4-O-C(=O)-$ | 2.493 | Low | Good | 39 | 78 | 100 ± 20 |
| Com. Ex. 14 | $-O-(CH_2)_6-O-C(=O)-$ | 2.004 | Low | Good | 58 | 66 | 100 ± 35 |

The results of Table 7 demonstrated that Comparative Examples 13 and 14 represented by the formula (1) wherein n of $R_1$ is 1 or the formula (2) wherein $R_2$ has carbon atoms less than 10 exhibit a high rate of mass change caused by the solvents and are inferior in photoelectric conversion layer precision for an organic thin-film solar cell.

Moreover, the use of the printing plates of Examples can decrease the thickness variation of the printed photoelectric conversion layer, since the thickness variation of these printing plates due to solvent-induced swelling can be low. The use of the printing plates of Examples can control, with high precision, the thickness of the photoelectric conversion layer for an organic thin-film solar cells, which is directly associated with solar cell performance.

[Regarding Process for Producing Patterned Thin-film Semiconductor Layer]

Example 30

(Printing Evaluation of Patterned Thin-film Semiconductor Layer)

Poly(3-hexylthiophene) was dissolved at a concentration of 1.0% by mass in dehydrated xylene to prepare an ink for thin-film semiconductor pattern formation.

The photosensitive resin composition obtained in Synthesis Example 2 was used to prepare a blank printing plate in the same way as in Example 2. The laser engravability of the blank printing plate is shown in Table 8. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 140° C. for 20 minutes to produce a patterned thin-film semiconductor layer. The results are shown in Table 8.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 8.

Example 31

(Printing Evaluation of Patterned Thin-film Semiconductor Layer)

Poly(3-hexylthiophene) was dissolved at a concentration of 1.0% by mass in dehydrated xylene to prepare an ink for thin-film semiconductor pattern formation.

The photosensitive resin composition obtained in Synthesis Example 11 was used to prepare a blank printing plate in the same way as in Example 30. The laser engravability of the blank printing plate is shown in Table 8. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 140° C. for 20 minutes to produce a patterned thin-film semiconductor layer. The results are shown in Table 8.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 8.

Example 32

(Printing Evaluation of Patterned Thin-film semiconductor Layer)

Poly(3-hexylthiophene) was dissolved at a concentration of 1.0% by mass in dehydrated xylene to prepare an ink for thin-film semiconductor pattern formation.

The photosensitive resin composition obtained in Synthesis Example 12 was used to prepare a blank printing plate in the same way as in Example 30. The laser engravability of the blank printing plate is shown in Table 8. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 140° C. for 20 minutes to produce a patterned thin-film semiconductor layer. The results are shown in Table 8.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 8.

Example 33

(Printing Evaluation of Patterned Thin-film Semiconductor Layer)

Poly(3-hexylthiophene) was dissolved at a concentration of 1.0% by mass in dehydrated methyl ethyl ketone to prepare an ink for thin-film semiconductor pattern formation.

The photosensitive resin composition obtained in Synthesis Example 5 was used to prepare a blank printing plate in the same way as in Example 30. The laser engravability of the blank printing plate is shown in Table 7. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 140° C. for 20 minutes to produce a patterned thin-film semiconductor layer. The results are shown in Table 8.

(Measurement of Rate of Mass Change)

A test sample prepared from the blank printing plate was dipped in methyl ethyl ketone at 20° C. for 24 hours. Then, the drops attached to the surface were wiped off. The amount of the mass increased was measured to determine a rate of mass change. The results are shown in Table 8.

Comparative Example 15

(Printing Evaluation of Patterned Thin-film Semiconductor Layer)

The photosensitive resin composition obtained in Comparative Synthesis Example 1 was used to prepare a blank printing plate in the same way as in Comparative Example 1. The laser engravability of the blank printing plate is shown in Table 8. The blank printing plate was patterned by laser engraving to prepare a printing plate, which was then used to perform printing and drying in the same way as in Example 30. The results are shown in Table 8.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 8.

Comparative Example 16

(Printing Evaluation of Patterned Thin-film Semiconductor Layer)

The photosensitive resin composition obtained in Comparative Synthesis Example 2 was used to prepare a blank printing plate in the same way as in Comparative Example 2. The laser engravability of the blank printing plate is shown in Table 8. The blank printing plate was patterned by laser engraving to prepare a printing plate, which was then used to perform printing and drying in the same way as in Example 30. The results are shown in Table 8.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 8.

TABLE 8

|  | Polycarbonate diol | | Properties of blank printing plate | | | | Thickness of patterned thin-film semiconductor layer (nm) |
|  | | | Laser engravability | | Rate of mass change (% by mass) | | |
|  | Main repeating unit | Mn | Generation of viscous liquid debris | Sharpness of line drawing | Xylene | Methyl ethyl ketone | |
| Ex. 30 | 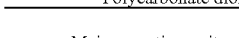 | 1.843 | Low | Good | 0.6 | — | 100 ± 3 |

TABLE 8-continued

| | Polycarbonate diol | | | Properties of blank printing plate | | | |
|---|---|---|---|---|---|---|---|
| | | | Laser engravability | | Rate of mass change (% by mass) | | Thickness of patterned thin-film semiconductor layer (nm) |
| | Main repeating unit | Mn | Generation of viscous liquid debris | Sharpness of line drawing | Xylene | Methyl ethyl ketone | |
| Ex. 31 | $-[O-(CH_2)_2-O]_2-C(=O)-$ | 1.843 | Low | Good | 0.6 | — | 100 ± 3 |
| Ex. 32 | $-[O-(CH_2)_4-O]_2-C(=O)-$ | 2.011 | Low | Good | 0.8 | — | 100 ± 5 |
| Ex. 33 | $-[O-(CH_2)_{20}-O-C(=O)]-$ | 2.476 | Low | Good | — | 2.0 | 100 ± 5 |
| Com. Ex. 15 | $-[O-(CH_2)_4-O-C(=O)]-$ | 2.493 | Low | Good | 39 | 78 | 100 ± 20 |
| Com. Ex. 16 | $-[O-(CH_2)_6-O-C(=O)]-$ | 2.004 | Low | Good | 58 | 66 | 100 ± 35 |

The results of Table 8 demonstrated that Comparative Examples 15 and 16 represented by the formula (1) wherein n of $R_1$ is 1 or the formula (2) wherein $R_2$ has carbon atoms less than 10 exhibit a high rate of mass change caused by the solvents and are inferior in patterned thin-film semiconductor layer precision.

Moreover, the use of the printing plates of Examples can decrease the thickness variation of the printed patterned thin-film semiconductor layer, since the thickness variation of these printing plates due to solvent-induced swelling can be low. The use of the printing plates of Examples can control, with high precision, the thickness of the patterned thin-film semiconductor layer, which is directly associated with transistor performance.

[Regarding Process for Producing Photosensitive Layer of Electrophotographic Photoreceptor]

Example 34

(Printing Evaluation of Photosensitive Layer of Electrophotographic Photoreceptor)

A mixture of poly(2,5-dioctyloxy-p-phenylene vinylene) and fullerene $C_{60}$ was dispersed at a concentration of 0.5% by mass in dehydrated xylene to prepare an ink for formation of a photosensitive layer. Note that the proportion of the fullerene $C_{60}$ mixed to the repeating unit of the substituted poly(p-phenylene vinylene) was set to 5% by mol.

The photosensitive resin composition obtained in Synthesis Example 2 was used to prepare a blank printing plate in the same way as in Example 2. The laser engravability of the blank printing plate is shown in Table 9. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. To prepare a substrate to be printed, an ITO membrane of 0.1 µm in thickness was formed by a vacuum deposition method on the surface of a glass substrate (soda-lime glass) of 0.7 mm in thickness and then subjected to UV-ozone washing to remove adherents such as organic matter. The ink for formation of a photosensitive layer was printed onto the glass substrate having the ITO thin-film electrode and then dried at 120° C. for 10 minutes in a nitrogen atmosphere to produce a photosensitive layer of an electrophotographic photoreceptor. The results are shown in Table 9.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 9.

Example 35

(Printing Evaluation of Photosensitive Layer of Electrophotographic Photoreceptor)

A mixture of poly(2,5-dioctyloxy-p-phenylene vinylene) and fullerene $C_{60}$ was dispersed at a concentration of 0.5% by mass in dehydrated xylene to prepare an ink for formation of a photosensitive layer. Note that the proportion of the fullerene $C_{60}$ mixed to the repeating unit of the substituted poly(p-phenylene vinylene) was set to 5% by mol.

The photosensitive resin composition obtained in Synthesis Example 11 was used to prepare a blank printing plate in the same way as in Example 34. The laser engravability of the blank printing plate is shown in Table 9. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. To prepare a substrate to be printed, an ITO membrane of 0.1 µm in thickness was formed by a vacuum deposition method on the surface of a glass substrate (soda-lime glass) of 0.7 mm in thickness and then subjected to UV-ozone washing to remove adherents such as organic matter. The ink for formation of a photosensitive layer was printed onto the glass substrate having the ITO thin-film electrode and then dried at 120° C. for 10 minutes in a nitrogen atmosphere to produce a photosensitive layer of an electrophotographic photoreceptor. The results are shown in Table 9.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 9.

Example 36

(Printing Evaluation of Photosensitive Layer of Electrophotographic Photoreceptor)

A mixture of poly(2,5-dioctyloxy-p-phenylene vinylene) and fullerene $C_{60}$ was dispersed at a concentration of 0.5% by mass in dehydrated xylene to prepare an ink for formation of a photosensitive layer. Note that the proportion of the fullerene $C_{60}$ mixed to the repeating unit of the substituted poly(p-phenylene vinylene) was set to 5% by mol.

The photosensitive resin composition obtained in Synthesis Example 12 was used to prepare a blank printing plate in the same way as in Example 34. The laser engravability of the blank printing plate is shown in Table 9. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. To prepare a substrate to be printed, an ITO membrane of 0.1 µm in thickness was formed by a vacuum deposition method on the surface of a glass substrate (soda-lime glass) of 0.7 mm in thickness and then subjected to UV-ozone washing to remove adherents such as organic matter. The ink for formation of a photosensitive layer was printed onto the glass substrate having the ITO thin-film electrode and then dried at 120° C. for 10 minutes in a nitrogen atmosphere to produce a photosensitive layer of an electrophotographic photoreceptor. The results are shown in Table 9.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 9.

Example 37

(Printing Evaluation of Photosensitive Layer of Electrophotographic Photoreceptor)

A mixture of poly(2,5-dioctyloxy-p-phenylene vinylene) and fullerene $C_{60}$ was dispersed at a concentration of 0.5% by mass in dehydrated methyl ethyl ketone to prepare an ink for formation of a photosensitive layer. Note that the proportion of the fullerene $C_{60}$ mixed to the repeating unit of the substituted poly(p-phenylene vinylene) was set to 5% by mol.

The photosensitive resin composition obtained in Synthesis Example 5 was used to prepare a blank printing plate in the same way as in Example 34. The laser engravability of the blank printing plate is shown in Table 9. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. To prepare a substrate to be printed, an ITO membrane of 0.1 µm in thickness was formed by a vacuum deposition method on the surface of a glass substrate (soda-lime glass) of 0.7 mm in thickness and then subjected to UV-ozone washing to remove adherents such as organic matter. The ink for formation of a photosensitive layer was printed onto the glass substrate having the ITO thin-film electrode and then dried at 120° C. for 10 minutes in a nitrogen atmosphere to produce a photosensitive layer of an electrophotographic photoreceptor. The results are shown in Table 9.

(Measurement of Rate of Mass Change)

A test sample prepared from the blank printing plate was dipped in methyl ethyl ketone at 20° C. for 24 hours. Then, the drops attached to the surface were wiped off. The amount of the mass increased was measured to determine a rate of mass change. The results are shown in Table 9.

Comparative Example 17

(Printing Evaluation of Photosensitive Layer of Electrophotographic Photoreceptor)

The photosensitive resin composition obtained in Comparative Synthesis Example 1 was used to prepare a blank printing plate in the same way as in Comparative Example 1. The laser engravability of the blank printing plate is shown in Table 9. The blank printing plate was patterned by laser engraving to prepare a printing plate, which was then used to perform printing and drying in the same way as in Example 34. The results are shown in Table 9.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 9.

Comparative Example 18

(Printing Evaluation of Photosensitive Layer of Electrophotographic Photoreceptor)

The photosensitive resin composition obtained in Comparative Synthesis Example 2 was used to prepare a blank printing plate in the same way as in Comparative Example 2. The laser engravability of the blank printing plate is shown in Table 9. The blank printing plate was patterned by laser engraving to prepare a printing plate, which was then used to perform printing and drying in the same way as in Example 34. The results are shown in Table 9.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 9.

TABLE 9

| | Polycarbonate diol | | | Properties of blank printing plate | | | | |
|---|---|---|---|---|---|---|---|---|
| | | | | Laser engravability | | Rate of mass change (% by mass) | | |
| | Main repeating unit | | Mn | Generation of viscous liquid debris | Sharpness of line drawing | Xylene | Methyl ethyl ketone | Thickness of photosensitive layer (nm) |
| Ex. 34 | $-[O-((CH_2)_2-O)_2-\underset{\underset{O}{\|}}{C}]-$ | | 1,843 | Low | Good | 0.6 | — | 50 ± 2 |
| Ex. 35 | $-[O-((CH_2)_2-O)_2-\underset{\underset{O}{\|}}{C}]-$ | | 1.843 | Low | Good | 0.6 | — | 50 ± 2 |
| Ex. 36 | $-[O-((CH_2)_4-O)_2-\underset{\underset{O}{\|}}{C}]-$ | | 2.011 | Low | Good | 0.8 | — | 50 ± 3 |
| Ex. 37 | $-[O-(CH_2)_{20}-O-\underset{\underset{O}{\|}}{C}]-$ | | 2.476 | Low | Good | — | 2.0 | 50 ± 3 |
| Com. Ex. 17 | $-[O-(CH_2)_4-O-\underset{\underset{O}{\|}}{C}]-$ | | 2.493 | Low | Good | 39 | 78 | 50 ± 8 |
| Com. Ex. 18 | $-[O-(CH_2)_6-O-\underset{\underset{O}{\|}}{C}]-$ | | 2.004 | Low | Good | 58 | 66 | 50 ± 10 |

The results of Table 9 demonstrated that Comparative Examples 17 and 18 represented by the formula (1) wherein n of $R_1$ is 1 or the formula (2) wherein $R_2$ has carbon atoms less than 10 exhibit a high rate of mass change caused by the solvents and are inferior in photosensitive layer precision.

Moreover, the use of the printing plates of Examples can decrease the thickness variation of the printed photosensitive layer of an electrophotographic photoreceptor, since the thickness variation of these printing plates due to solvent-induced swelling can be low. The use of the printing plates of Examples can control, with high precision, the thickness of the photosensitive layer of an electrophotographic photoreceptor, which is directly associated with electrophotographic photoreceptor performance.

[Regarding Process for Producing Electron-accepting and/or Electron-donating Organic Layers Constituting Photovoltaic Element for Photosensor]

Example 38

(Printing Evaluation of Electron-Donating Organic Layer)

A polymer having a number-average molecular weight of 17,000, which is represented by the following formula (10) was dissolved at a concentration of 0.5% by mass in dehydrated xylene to prepare an ink for an electron-donating organic layer:

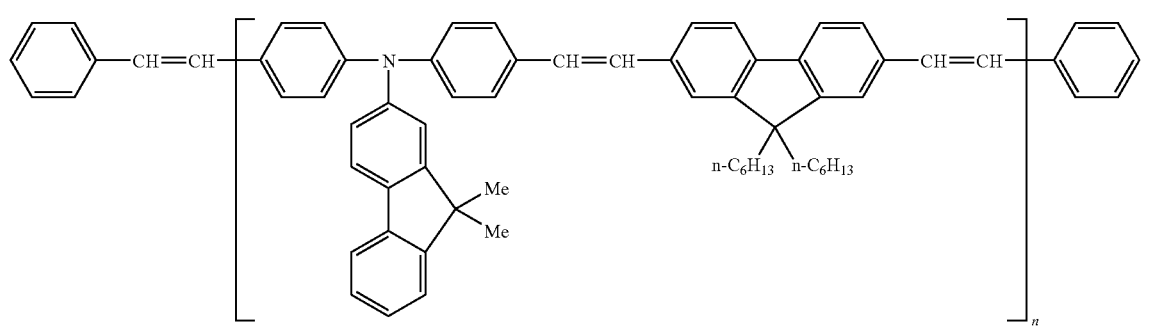

(10)

The photosensitive resin composition obtained in Synthesis Example 2 was used to prepare a blank printing plate in the same way as in Example 2. The laser engravability of the blank printing plate is shown in Table 10. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to produce an electron-donating organic layer. The results are shown in Table 10.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 10.

Example 39

(Printing Evaluation of Electron-donating Organic Layer)

A polymer having a number-average molecular weight of 17,000, which is represented by the formula (10) was dissolved at a concentration of 0.5% by mass in dehydrated xylene to prepare an ink for an electron-donating organic layer.

The photosensitive resin composition obtained in Synthesis Example 11 was used to prepare a blank printing plate in the same way as in Example 38. The laser engravability of the blank printing plate is shown in Table 10. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 μm in thickness was used as a substrate to be printed. The ink was printed onto the substrate and then dried at 120° C. for 10 minutes in a nitrogen atmosphere to produce an electron-donating organic layer. The results are shown in Table 10.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 10.

Example 40

(Printing Evaluation of Electron-donating Organic Layer)

A polymer having a number-average molecular weight of 17,000, which is represented by the formula (10) was dissolved at a concentration of 0.5% by mass in dehydrated xylene to prepare an ink for an electron-donating organic layer.

The photosensitive resin composition obtained in Synthesis Example 12 was used to prepare a blank printing plate in the same way as in Example 38. The laser engravability of the blank printing plate is shown in Table 10. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to produce an electron-donating organic layer. The results are shown in Table 10.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 10.

Example 41

(Printing Evaluation of Electron-donating Organic Layer)

A polymer having a number-average molecular weight of 17,000, which is represented by the formula (10) was dissolved at a concentration of 0.5% by mass in dehydrated methyl ethyl ketone to prepare an ink for an electron-donating organic layer.

The photosensitive resin composition obtained in Synthesis Example 5 was used to prepare a blank printing plate in the same way as in Example 38. The laser engravability of the blank printing plate is shown in Table 10. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. An alkali-free glass substrate of 1.0 mm in thickness was used as a substrate to be printed. The ink was printed onto the substrate and then dried at 120° C. for 10 minutes in a nitrogen atmosphere to produce an electron-donating organic layer. The results are shown in Table 10.

(Measurement of Rate of Mass Change)

A test sample prepared from the blank printing plate was dipped in methyl ethyl ketone at 20° C. for 24 hours. Then, the drops attached to the surface were wiped off. The amount of the mass increased was measured to determine a rate of mass change. The results are shown in Table 10.

Comparative Example 19

(Printing Evaluation of Electron-donating Organic Layer)

The photosensitive resin composition obtained in Comparative Synthesis Example 1 was used to prepare a blank printing plate in the same way as in Comparative Example 1. The laser engravability of the blank printing plate is shown in Table 10. The blank printing plate was patterned by laser engraving to prepare a printing plate, which was then used to perform printing and drying in the same way as in Example 38. The results are shown in Table 10.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 10.

Comparative Example 20

(Printing Evaluation of Electron-donating Organic Layer)

The photosensitive resin composition obtained in Comparative Synthesis Example 2 was used to prepare a blank printing plate in the same way as in Comparative Example 2. The laser engravability of the blank printing plate is shown in Table 10. The blank printing plate was patterned by laser engraving to prepare a printing plate, which was then used to perform printing and drying in the same way as in Example 38. The results are shown in Table 10.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 10.

TABLE 10

| | Polycarbonate diol | | | Properties of blank printing plate | | | |
|---|---|---|---|---|---|---|---|
| | | | Laser engravability | | Rate of mass change (% by mass) | | Thickness of electron-donating organic |
| | Main repeating unit | Mn | Generation of viscous liquid debris | Sharpness of line drawing | Xylene | Methyl ethyl ketone | layer (nm) |
| Ex. 38 | —[O—(CH₂)₂—O]₂—C(=O)— | 1.843 | Low | Good | 0.6 | — | 40 ± 2 |
| Ex. 39 | —[O—(CH₂)₂—O]₂—C(=O)— | 1.843 | Low | Good | 0.6 | — | 40 ± 2 |
| Ex. 40 | —[O—(CH₂)₄—O]₂—C(=O)— | 2.011 | Low | Good | 0.8 | — | 40 ± 3 |
| Ex. 41 | —O—(CH₂)₂₀—O—C(=O)— | 2.476 | Low | Good | — | 2.0 | 40 ± 3 |
| Com. Ex. 19 | —O—(CH₂)₄—O—C(=O)— | 2.493 | Low | Good | 39 | 78 | 40 ± 8 |
| Com. Ex. 20 | —O—(CH₂)₆—O—C(=O)— | 2.004 | Low | Good | 58 | 66 | 40 ± 10 |

The results of Table 10 demonstrated that Comparative Examples 19 and 20 represented by the formula (1) wherein n of $R_1$ is 1 or the formula (2) wherein $R_2$ has carbon atoms less than 10 exhibit a high rate of mass change caused by the solvents and are inferior in electron-donating organic layer precision.

Moreover, the use of the printing plates of Examples can decrease the thickness variation of the printed electron-accepting and/or electron-donating organic layers constituting a photovoltaic element for a photosensor, since the thickness variation of these printing plates due to solvent-induced swelling can be low. The use of the printing plates of Examples can control, with high precision, the thickness of the electron-accepting and/or electron-donating organic layers constituting a photovoltaic element for a photosensor, which is directly associated with photovoltaic element performance.

[Regarding Process for Producing Polysilane Thin Film of Optical Switching Element]

Example 42

(Printing Evaluation of Polysilane Thin Film)

Polymethylphenylsilane (molecular weight: 3,000) was dissolved at a concentration of 20% by mass in dehydrated xylene to prepare a polysilane solution.

The photosensitive resin composition obtained in Synthesis Example 2 was used to prepare a blank printing plate in the same way as in Example 2. The laser engravability of the blank printing plate is shown in Table 11. The blank printing plate was patterned by laser engraving to prepare a printing plate, which was then used to conduct the printing evaluation of the solution. In printing, a printability tester for flexo (IGT-F1, manufactured by IGT Testing Systems) was used, and the printing plate was attached onto the printing cylinder by use of a double-sided tape. A glass substrate (soda-lime glass) of 0.7 mm in thickness was used as a substrate to be printed. The solution was printed onto the substrate and then dried at 120° C. for 10 minutes in a nitrogen atmosphere to produce a polysilane thin film. The results are shown in Table 11.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 11.

Example 43

(Printing Evaluation of Polysilane Thin Film)

Polymethylphenylsilane (molecular weight: 3,000) was dissolved at a concentration of 20% by mass in dehydrated xylene to prepare a polysilane solution.

The photosensitive resin composition obtained in Synthesis Example 11 was used to prepare a blank printing plate in the same way as in Example 42. The laser engravability of the blank printing plate is shown in Table 11. The blank printing plate was patterned by laser engraving to prepare a printing plate, which was then used to conduct the printing evaluation of the solution. In printing, a printability tester for flexo (IGT-F1, manufactured by IGT Testing Systems) was used, and the printing plate was attached onto the printing cylinder by use of a double-sided tape. A glass substrate (soda-lime glass) of 0.7 mm in thickness was used as a substrate to be printed. The solution was printed onto the substrate and then dried at 120° C. for 10 minutes in a nitrogen atmosphere to produce a polysilane thin film. The results are shown in Table 11.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 11.

Example 44

(Printing Evaluation of Polysilane Thin Film)

Polymethylphenylsilane (molecular weight: 3,000) was dissolved at a concentration of 20% by mass in dehydrated xylene to prepare a polysilane solution.

The photosensitive resin composition obtained in Synthesis Example 12 was used to prepare a blank printing plate in the same way as in Example 42. The laser engravability of the blank printing plate is shown in Table 11. The blank printing plate was patterned by laser engraving to prepare a printing plate, which was then used to conduct the printing evaluation of the solution. In printing, a printability tester for flexo (IGT-F1, manufactured by IGT Testing Systems) was used, and the printing plate was attached onto the printing cylinder by use of a double-sided tape. A glass substrate (soda-lime glass) of 0.7 mm in thickness was used as a substrate to be printed. The solution was printed onto the substrate and then dried at 120° C. for 10 minutes in a nitrogen atmosphere to produce a polysilane thin film. The results are shown in Table 11.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The results are shown in Table 11.

Example 45

(Printing Evaluation of Polysilane Thin Film)

Polymethylphenylsilane (molecular weight: 3,000) was dissolved at a concentration of 20% by mass in dehydrated methyl ethyl ketone to prepare a polysilane solution.

The photosensitive resin composition obtained in Synthesis Example 5 was used to prepare a blank printing plate in the same way as in Example 42. The laser engravability of the blank printing plate is shown in Table 11. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. A glass substrate (soda-lime glass) of 0.7 mm in thickness was used as a substrate to be printed. The solution was printed onto the substrate and then dried at 120° C. for 10 minutes in a nitrogen atmosphere to produce a polysilane thin film. The results are shown in Table 11.

(Measurement of Rate of Mass Change)

A test sample prepared from the blank printing plate was dipped in methyl ethyl ketone at 20° C. for 24 hours. Then, the drops attached to the surface were wiped off. The amount of the mass increased was measured to determine a rate of mass change. The results are shown in Table 11.

Comparative Example 21

(Printing Evaluation of Polysilane Thin Film)

The photosensitive resin composition obtained in Comparative Synthesis Example 1 was used to prepare a blank printing plate in the same way as in Comparative Example 1. The laser engravability of the blank printing plate is shown in Table 11. The blank printing plate was patterned by laser engraving to prepare a printing plate, which was then used to perform printing and drying in the same way as in Example 42. The results are shown in Table 11.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 11.

Comparative Example 22

(Printing Evaluation of Polysilane Thin Film)

The photosensitive resin composition obtained in Comparative Synthesis Example 2 was used to prepare a blank printing plate in the same way as in Comparative Example 2. The laser engravability of the blank printing plate is shown in Table 11. The blank printing plate was patterned by laser engraving to prepare a printing plate, which was then used to perform printing and drying in the same way as in Example 42. The results are shown in Table 11.

(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The results are shown in Table 11.

TABLE 11

| | Polycarbonate diol | | | Properties of blank printing plate | | | |
| | | | | Laser engravability | | Rate of mass change (% by mass) | Thickness of polysilane thin film |
| | Main repeating unit | Mn | | Generation of viscous liquid debris | Sharpness of line drawing | Xylene | Methyl ethyl ketone | ($\overline{m}$) |
| Ex. 42 | 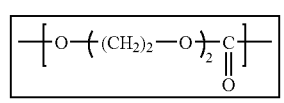 | 1.843 | | Low | Good | 0.6 | — | 1 ± 0.03 |

TABLE 11-continued

| | Polycarbonate diol | | Laser engravability | | Rate of mass change (% by mass) | | Thickness of polysilane thin film ($\overline{m}$) |
|---|---|---|---|---|---|---|---|
| | Main repeating unit | Mn | Generation of viscous liquid debris | Sharpness of line drawing | Xylene | Methyl ethyl ketone | |
| Ex. 43 | $-[O-(CH_2)_2-O]_2-C(=O)-$ | 1.843 | Low | Good | 0.6 | — | 1 ± 0.03 |
| Ex. 44 | $-[O-(CH_2)_4-O]_2-C(=O)-$ | 2.011 | Low | Good | 0.8 | — | 1 ± 0.05 |
| Ex. 45 | $-[O-(CH_2)_{20}-O-C(=O)]-$ | 2.476 | Low | Good | — | 2.0 | 1 ± 0.05 |
| Com. Ex. 21 | $-[O-(CH_2)_4-O-C(=O)]-$ | 2.493 | Low | Good | 39 | 78 | 1 ± 0.20 |
| Com. Ex. 22 | $-[O-(CH_2)_6-O-C(=O)]-$ | 2.004 | Low | Good | 58 | 66 | 1 ± 0.35 |

The results of Table 11 demonstrated that Comparative Examples 21 and 22 represented by the formula (1) wherein n of $R_1$ is 1 or the formula (2) wherein $R_2$ has carbon atoms less than 10 exhibit a high rate of mass change caused by the solvents and are inferior in polysilane thin film precision.

Moreover, the use of the printing plates of Examples can decrease the thickness variation of the printed polysilane thin film, since the thickness variation of these printing plates due to solvent-induced swelling can be low. The use of the printing plates of Examples can control, with high precision, the thickness of the polysilane thin film of an optical switching element, which is directly associated with optical switching element performance.

[Regarding Processes for Producing Bank, Etc.]

Example 46

(Preparation of Polyamic Acid Composition for Bank Formation)

In a γ-butyrolactone/N-methyl-2-pyrrolidone mixed solvent, pyromellitic dianhydride (0.49 mol equivalent), 4,4'-diaminodiphenyl ether (0.95 mol equivalent), and bis-3-(aminopropyl)tetramethylsiloxane (0.05 mol equivalent) were reacted to obtain a polyamic acid solution (polymer concentration: 20% by mass). To a 200 g aliquot of this polyamic acid solution, 186 g of γ-butyrolactone and 64 g of butyl cellosolve were added to obtain a polyamic acid composition for bank formation having a polymer concentration of 10% by mass.

(Printing Evaluation of Bank)

The photosensitive resin composition obtained in Synthesis Example 5 was used to prepare a blank printing plate in the same way as in Example 5. The laser engravability of the blank printing plate is shown in Table 12. The blank printing plate was patterned by laser engraving to prepare a printing plate, which was then used to conduct the printing evaluation of the polyamic acid for bank formation. In printing, a printability tester for flexo (IGT-F1, manufactured by IGT Testing Systems) was used, and the printing plate was attached onto the printing cylinder by use of a double-sided tape. To prepare a substrate to be printed, an ITO membrane (positive electrode) of 0.1 μm in thickness was formed by a vacuum deposition method on the surface of an alkali-free glass substrate of 1.0 mm in thickness and then subjected to UV-ozone washing to remove adherents such as organic matter. The polyamic acid composition for bank formation was printed onto the ITO membrane surface of the substrate, then prebaked at 145° C., and then heated to 290° C. for thermal curing to produce a bank. The results are shown in Table 12.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change. The results are shown in Table 12.

Example 47

(Printing Evaluation of Bank)

The photosensitive resin composition obtained in Synthesis Example 6 was used to prepare a blank printing plate in the same way as in Example 46. The laser engravability of the blank printing plate is shown in Table 12. The blank printing plate was patterned by laser engraving to prepare a printing plate, which was then used to conduct printing evaluation in the same way as in Example 46. The results are shown in Table 12.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change. The results are shown in Table 12.

Example 48

(Printing Evaluation of Bank)

The photosensitive resin composition obtained in Synthesis Example 8 was used to prepare a blank printing plate in the same way as in Example 8. The laser engravability of the blank printing plate is shown in Table 12. The blank printing plate was patterned by laser engraving to prepare a printing plate, which was then used to conduct printing evaluation in the same way as in Example 46. The results are shown in Table 12.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change. The results are shown in Table 12.

Example 49

(Printing Evaluation of Bank)

The photosensitive resin composition obtained in Synthesis Example 10 was used to prepare a blank printing plate in the same way as in Example 46. The laser engravability of the blank printing plate is shown in Table 12. The blank printing plate was patterned by laser engraving to prepare a printing plate, which was then used to conduct printing evaluation in the same way as in Example 46. The results are shown in Table 12.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change. The results are shown in Table 12.

Comparative Example 23

(Printing Evaluation of Bank)

The photosensitive resin composition obtained in Comparative Synthesis Example 1 was used to prepare a blank printing plate in the same way as in Comparative Example 1. The laser engravability of the blank printing plate is shown in Table 12. The blank printing plate was patterned by laser engraving to prepare a printing plate, which was then used to perform printing, drying, and baking in the same way as in Example 46. The results are shown in Table 12.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change. The results are shown in Table 12.

Comparative Example 24

(Printing Evaluation of Bank)

The photosensitive resin composition obtained in Comparative Synthesis Example 2 was used to prepare a blank printing plate in the same way as in Comparative Example 2. The laser engravability of the blank printing plate is shown in Table 12. The blank printing plate was patterned by laser engraving to prepare a printing plate, which was then used to perform printing, drying, and baking in the same way as in Example 46. The results are shown in Table 12.

(Measurement of Rate of Mass Change)

A test sample prepared from the blank printing plate was dipped in the N-methyl-2-pyrrolidone/γ-butyrolactone/butyl cellosolve=1/1/1 (mass ratio) mixed solvent at 20° C. for 24 hours. Then, the drops attached to the surface were wiped off. The amount of the mass increased was measured to determine a rate of mass change. The results are shown in Table 12.

TABLE 12

| | Polycarbonate diol | | Properties of blank printing plate | | Rate of mass change (% by mass) | |
| | | | Laser engravability | | | |
| | Main repeating unit | Mn | Generation of viscous liquid debris | Sharpness of line drawing | Solvent for bank formation*1 | Thickness of bank (□m) |
|---|---|---|---|---|---|---|
| Ex. 46 | $-\!\!\!+\!\!O-(CH_2)_{20}-O-\underset{\underset{O}{\|}}{C}\!\!\!+\!\!-$ | 2.476 | Low | Good | 3 | 1 ± 0.03 |
| Ex. 47 | $-\!\!\!+\!\!O-(CH_2)_{20}-O-\underset{\underset{O}{\|}}{C}\!\!\!+\!\!-$ | 2.476 | Low | Good | 4 | 1 ± 0.04 |
| Ex. 48 | $-\!\!\!+\!\!O-(CH_2)_{12}-O-\underset{\underset{O}{\|}}{C}\!\!\!+\!\!-$ <br> $-\!\!\!+\!\!O-(CH_2)_{20}-O-\underset{\underset{O}{\|}}{C}\!\!\!+\!\!-$ | 2.371 | Low | Good | 4 | 1 ± 0.06 |

TABLE 12-continued

| | Polycarbonate diol | | Properties of blank printing plate | | | |
|---|---|---|---|---|---|---|
| | | | Laser engravability | | Rate of mass change (% by mass) | |
| | | | Generation of viscous liquid debris | Sharpness of line drawing | Solvent for bank formation*1 | Thickness of bank (□m) |
| | Main repeating unit | Mn | | | | |
| Ex. 49 | 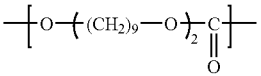 | 2.196 | Low | Good | 8 | 1 ± 0.05 |
| Com. Ex. 23 | 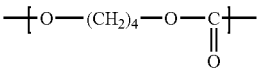 | 2.493 | Low | Good | 106 | 1 ± 0.22 |
| Com. Ex. 24 | 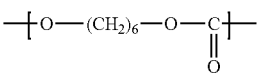 | 2.004 | Low | Good | 98 | 1 ± 0.32 |

*1 N-methyl-2-pyrrolidone/□-butyrolactone/butyl cellosolve = 1/1/1 (mass ratio)

The results of Table 12 demonstrated that Comparative Examples 23 and 24 represented by the formula (1) wherein n of $R_1$ is 1 or the formula (2) wherein $R_2$ has carbon atoms less than 10 exhibit a high rate of mass change caused by the solvents and are inferior in bank precision.

Moreover, the use of the printing plates of Examples can decrease the thickness variation of the printed bank, since the thickness variation of these printing plates due to solvent-induced swelling can be low. The use of the printing plates of Examples can control, with high precision, the thickness of the bank, which is directly associated with RGB pixel performance.

Example 50

(Printing Evaluation of Organic Light-emitting Layer for Illumination)

A phosphorescence-emitting polymer (ternary polymer of aromatic amine (hole transport material), boron-containing molecule (electron transport material), and an iridium complex (phosphorescence-emitting dye): poly[viTPD-viTMB-viIr(ppy)2(acac)]) was added to dehydrated xylene to prepare 3.0% by mass of an organic light-emitting ink for illumination.

The photosensitive resin composition obtained in Synthesis Example 2 was used to prepare a blank printing plate in the same way as in Example 2. The blank printing plate was patterned by laser engraving to prepare a printing plate, which was then used to conduct the printing evaluation of the ink. In printing, a printability tester for flexo (IGT-F1, manufactured by IGT Testing Systems) was used, and the printing plate was attached onto the printing cylinder by use of a double-sided tape. To prepare a substrate to be printed, a substrate with ITO was precoated with "Baytron P" (manufactured by Bayer) serving as an intermediate layer. The ink was printed onto the substrate and then dried at 100° C. for 30 minutes in a nitrogen atmosphere to form an organic light-emitting layer for illumination. The light-emitting layer had flatness as high as a film thickness of 90±3 nm.

(Measurement of Rate of Mass Change)

A test sample prepared from the blank printing plate was dipped in xylene at 20° C. for 24 hours. Then, the drops attached to the surface were wiped off. The amount of the mass increased was measured to determine a rate of mass change. The rate of mass change was 0.6% by mass.

Example 51

(Printing Evaluation of Organic Light-emitting Layer for Illumination)

An organic light-emitting ink for illumination was prepared in the same way as in Example 50.

The photosensitive resin composition obtained in Synthesis Example 2 was used to prepare a blank printing plate in the same way as in Example 2. The blank printing plate was used as a blanket roll (offset roll) to conduct the printing evaluation of the light-emitting ink by use of a gravure offset printing machine (the printing cylinder and anilox roll of IGT-F1, manufactured by IGT Testing Systems, were changed to the blanket roll and a gravure plate, respectively). To prepare a substrate to be printed, a substrate with ITO was precoated with "Baytron P" (manufactured by Bayer) serving as an intermediate layer. The ink was printed onto the substrate and then dried at 100° C. for 30 minutes in a nitrogen atmosphere to form an organic light-emitting layer for illumination. The light-emitting layer had flatness as high as a film thickness of 90±5 nm.

Example 52

(Printing Evaluation of Organic Light-emitting Layer for Illumination)

An organic light-emitting ink for illumination was prepared in the same way as in Example 50.

Printing evaluation was conducted in the same way as in Example 50 except that a printing plate pattern was formed by photolithography instead of by laser engraving. Specifically, the photosensitive resin composition obtained in Synthesis Example 2 was uniformly applied onto a glass plate to form a coating of 3 mm in thickness. A latent image was formed on the coating via a photomask by light exposure using a high-pressure mercury lamp and then developed to prepare a printing plate having a relief pattern. The printing plate was used to conduct the printing evaluation of the ink. In printing, a printability tester for flexo (IGT-F1, manufactured by IGT Testing Systems) was used, and the printing plate was attached onto the printing cylinder by use of a double-sided tape. To prepare a substrate to be printed, a substrate with ITO was precoated with "Baytron P" (manufactured by Bayer) serving as an intermediate layer. The ink was printed onto the substrate and then dried at 100° C. for 30 minutes in a nitrogen atmosphere to form an organic light-emitting layer for illumination. The light-emitting layer had flatness as high as a film thickness of 90±6 nm.

Comparative Example 25

(Printing Evaluation of Organic Light-emitting Layer for Illumination)

The photosensitive resin composition obtained in Comparative Synthesis Example 1 was used to prepare a blank printing plate in the same way as in Comparative Example 1. The blank printing plate was patterned by laser engraving to prepare a printing plate, which was then used to perform printing and drying in the same way as in Example 50. The resultant organic light-emitting layer after drying had an exceedingly nonuniform film thickness of approximately 90±20 nm.
(Measurement of Rate of Mass Change)

A test sample prepared from the blank printing plate was dipped in xylene and methyl ethyl ketone at 20° C. for 24 hours. Then, the drops attached to the surface were wiped off. The amount of the mass increased was measured to determine a rate of mass change. The rate of mass change was 39% by mass and 78% by mass, respectively.

These results demonstrated that Comparative Example 25 represented by the formula (1) wherein n of $R_1$ is 1 or the formula (2) wherein $R_2$ has carbon atoms less than 10 exhibit a high rate of mass change caused by the solvents and are inferior in organic light-emitting layer precision.

Moreover, the use of the printing plates of Examples can decrease the thickness variation of the printed organic light-emitting layer, since the thickness variation of these printing plates due to solvent-induced swelling can be low. The use of the printing plates of Examples can control, with high precision, the thickness of the organic light-emitting layer, which is directly associated with illumination, display, display backlight, interior, exterior, or surface-emitting light source performance.

INDUSTRIAL APPLICABILITY

Polycarbonate diol of the present invention and a polymer produced from this polycarbonate diol are excellent in solvent resistance and can therefore be used in various applications likely to be exposed to solvents, for example, clothing and electronic components. By using the polycarbonate diol and the polymer, a printing plate or blank printing plate can be produced particularly for printing likely to use solvent-containing inks, for example, various printing techniques including: letterpress printing such as flexographic printing and typographic printing; planographic printing such as offset printing; intaglio printing such as gravure printing; and mimeographing such as screen printing.

Particularly, the polycarbonate diol of the present invention, the polymer produced from this polycarbonate diol, and a photosensitive resin composition comprising this polymer are suitable for producing a laser-engravable blank printing plate, from which a printing plate having a pattern formed by laser engraving can be formed.

A process for producing a conductive layer according to the present invention can produce a conductive layer having a pattern with high definition and a uniform film thickness. Moreover, the process can provide a conductive circuit comprising the conductive layer. Particularly, the conductive circuit, which comprises the highly precise conductive layer, can be used preferably in electromagnetic shields or RFID tags or the like.

A process for producing an organic light-emitting layer according to the present invention can produce an organic light-emitting layer having a pattern with high definition and a uniform film thickness. Moreover, the method can provide an organic EL element comprising the organic light-emitting layer as well as organic EL displays, illumination, displays, display backlights, interiors, exteriors, surface-emitting light sources, toys, cosmetics, novelty goods, and so on using the organic EL element.

A process for producing a liquid crystal orientation film according to the present invention can efficiently produce a liquid crystal orientation film with a uniform film thickness. The process can provide a liquid crystal display comprising the liquid crystal orientation film.

A process for producing a black matrix according to the present invention can produce a black matrix with high precision. Moreover, the process can provide a color filter for a liquid crystal display comprising the black matrix.

A process for producing a colored layer for a color filter according to the present invention can produce a colored layer for a color filter with high precision. Moreover, the process can provide a color filter comprising the colored layer.

A process for producing a photoelectric conversion layer for organic thin-film solar cells according to the present invention can produce a photoelectric conversion layer for the organic thin-film solar cells with high precision. Moreover, the process can provide an organic thin-film solar cell comprising the photoelectric conversion layer for the organic thin-film solar cells.

A process for producing a patterned thin-film semiconductor layer according to the present invention can produce a patterned thin-film semiconductor layer with high precision.

A process for producing a photosensitive layer of an electrophotographic photoreceptor according to the present invention can produce a photosensitive layer of an electrophotographic photoreceptor with high precision. Moreover, the process can provide an electrophotographic photoreceptor comprising the photosensitive layer.

A process for producing electron-accepting and/or electron-donating organic layers constituting a photovoltaic element for a photosensor according to the present invention can produce electron-accepting and/or electron-donating organic layers with high precision. Moreover, the process can provide a photovoltaic element for a photosensor and a photosensor comprising the electron-accepting and/or electron-donating organic layers.

A process for producing a polysilane thin film of an optical switching element according to the present invention can produce a polysilane thin film of an optical switching element with high precision. Moreover, the process can provide an optical switching element comprising the polysilane thin film.

A process for producing a bank according to the present invention can provide a process for producing a bank with high precision. Moreover, a process for producing an organic light-emitting layer for illumination, a display, display backlight, interior, exterior, or surface-emitting light source according to the present invention can provide a process for producing an organic light-emitting layer with high precision. Moreover, the process can provide illumination, displays, display backlights, interiors, exteriors, surface-emitting light sources, toys, cosmetics, novelty goods, and so on comprising the organic light-emitting layer.

The invention claimed is:

1. A polymer comprising: a polycarbonate diol comprising a repeating unit represented by the following formulas (1) and/or (2); a polyisocyanate compound having an isocyanate group equivalent less than a terminal hydroxyl group equivalent of the polycarbonate diol; and isocyanatoalkyl acrylate and/or isocyanatoalkyl methacrylate, wherein the polycarbonate diol and the polyisocyanate compound are polymerized through a urethane bond, and a residual terminal hydroxyl group of the polymerized polycarbonate diol is bonded to the isocyanatoalkyl acrylate and/or isocyanatoalkyl methacrylate through a urethane bond:

(1)

wherein $R_1$ represents a linear or branched hydrocarbon group having 2 to 50 carbon atoms; and n represents an integer of 2 to 50,

(2)

wherein $R_2$ represents a linear or branched hydrocarbon group having 10 to 50 carbon atoms.

2. The polymer according to claim 1, wherein the polycarbonate diol has a Mn of from 300 to 50,000.

3. The polymer according to claim 1 or 2, wherein the polyisocyanate compound is a diisocyanate compound.

4. The polymer according to claim 1 or 2, wherein the polyisocyanate compound is an aromatic diisocyanate.

5. The polymer according to claim 1 or 2, wherein the polymer is represented by the following formula (3):

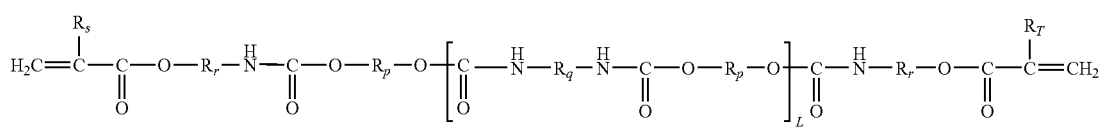

(3)

wherein $R_p$ each independently represents a residue, exclusive of both the terminal hydroxyl groups, of the polycarbonate diol comprising the repeating unit represented by the formulas (1) and/or (2); $R_q$ represents a residue of the diisocyanate compound exclusive of the isocyanate groups; $R_r$ represents an alkyl moiety of the isocyanatoalkyl acrylate and/or isocyanatoalkyl methacrylate; $R_S$ and $R_T$ each independently represent a methyl group or a hydrogen atom; and L represents an integer of 1 or larger.

6. The polymer according to claim 1 or 2, wherein the polycarbonate diol is a polycarbonate diol comprising the repeating unit represented by the formula (1).

7. The polymer according to claim 1 or 2, wherein the polycarbonate diol is a polycarbonate diol comprising a repeating unit represented by the formula (2).

8. A process for producing a polymer according to claim 1 or 2, comprising reacting a polycarbonate diol comprising a repeating unit represented by the formulas (1) and/or (2), a polyisocyanate compound having an isocyanate group equivalent less than a terminal hydroxyl group equivalent of the polycarbonate diol, and an isocyanatoalkyl acrylate and/or isocyanatoalkyl methacrylate.

9. The photosensitive resin composition for production of a printing plate or a blank printing plate, comprising the polymer according to claim 1 or 2 and a photopolymerization initiator (d).

10. The photosensitive resin composition for production of a printing plate or a blank printing plate according to claim 9, wherein the polymer has Mn of from 1,000 to 100,000.

11. The photosensitive resin composition for production of a printing plate or a blank printing plate according to claim 9, wherein the photosensitive resin composition further comprises an organic compound (b) which has a polymerizable unsaturated group and which has Mn smaller than 5,000.

12. The photosensitive resin composition for production of a printing plate or a blank printing plate according to claim 9, wherein the photosensitive resin composition further comprises inorganic a fine particle (c).

13. The photosensitive resin composition for production of a printing plate or a blank printing plate according to claim 9, wherein the photosensitive resin composition is for production of a laser-engravable blank printing plate.

14. A printing plate or a blank printing plate which is produced using the photosensitive resin composition according to claim 9.

15. A printing plate or a blank printing plate which is produced by a process comprising the steps of:
molding the photosensitive resin composition according to claim 9 into a sheet or cylindrical form; and
crosslinking and curing the molded photosensitive resin composition by light or electron beam irradiation.

16. The printing plate or the blank printing plate according to claim 14, wherein the blank printing plate is laser-engravable.

17. The printing plate or the blank printing plate according to claim 14, wherein the printing plate or the blank printing plate is a flexographic printing plate or a flexographic blank printing plate.

18. A process for producing a conductive layer, comprising: transferring a conductive ink on a printing plate onto a substrate to be printed; and removing a solvent in the transferred conductive ink by drying or curing the transferred conductive ink by light irradiation such that the conductive ink is fixed on the substrate to be printed, wherein
the printing plate is a printing plate according to claim 14.

19. A process for producing an organic light-emitting layer, comprising: transferring an organic light-emitting ink on a printing plate onto a substrate to be printed; and removing a solvent in the transferred organic light-emitting ink by drying or curing the transferred organic light-emitting ink by light irradiation such that the organic light-emitting ink is fixed on the substrate to be printed, wherein
the printing plate is a printing plate according to claim 14.

20. A process for producing a liquid crystal orientation film, comprising: transferring a liquid crystal orientation film solution on a printing plate onto a substrate to be printed; and removing a solvent in the transferred liquid crystal orientation film solution by drying such that the liquid crystal orientation film solution is fixed on the substrate to be printed, wherein the printing plate is a printing plate according to claim 14.

21. A process for producing a black matrix, comprising: transferring a coating composition for a black matrix on a printing plate onto a substrate to be printed; and removing a solvent in the transferred coating composition for a black matrix by drying or curing the transferred coating composition for a black matrix by light irradiation such that the coating composition for a black matrix is fixed on the substrate to be printed, wherein the printing plate is a printing plate according to claim 14.

22. A process for producing a colored layer for a color filter, comprising: transferring an ink for a colored layer on a printing plate onto a substrate to be printed; and removing a solvent in the transferred ink for a colored layer by drying or curing the transferred ink for a colored layer by light irradiation such that the ink for a colored layer is fixed on the substrate to be printed, wherein the printing plate is a printing plate according to claim 14.

23. A process for producing a photoelectric conversion layer for an organic thin-film solar cells, comprising: transferring an ink for a photoelectric conversion layer for an organic thin-film solar cells on a printing plate onto a substrate to be printed; and removing a solvent in the transferred ink for a photoelectric conversion layer for an organic thin-film solar cells by drying or curing the transferred ink for a photoelectric conversion layer for an organic thin-film solar cells by light irradiation such that the ink for a photoelectric conversion layer for an organic thin-film solar cells is fixed on the substrate to be printed, wherein the printing plate is a printing plate according to claim 14.

24. A process for producing a patterned thin-film semiconductor layer, comprising: transferring an ink for thin-film semiconductor pattern formation on a printing plate onto a substrate to be printed; and removing a solvent in the transferred ink for thin-film semiconductor pattern formation by drying or curing the transferred ink for thin-film semiconductor pattern formation by light irradiation such that the ink for thin-film semiconductor pattern formation is fixed on the substrate to be printed, wherein the printing plate is a printing plate according to claim 14.

25. A process for producing a photosensitive layer of an electrophotographic photoreceptor, comprising: transferring an ink for formation of a photosensitive layer of an electrophotographic photoreceptor on a printing plate onto a substrate to be printed; and removing a solvent in the transferred ink by drying or curing the transferred ink by light irradiation such that the ink is fixed on the substrate to be printed, wherein the printing plate is a printing plate according to claim 14.

26. A process for producing an electron-accepting and/or electron-donating organic layers constituting a photovoltaic element for a photosensor, comprising: transferring an ink for an electron-accepting organic layer and/or ink for an electron-donating organic layer on a printing plate onto a substrate to be printed; and removing a solvent in the transferred ink for an electron-accepting organic layer and/or ink for an electron-donating organic layer by drying or curing the transferred ink for an electron-accepting organic layer and/or ink for an electron-donating organic layer by light irradiation such that the ink for an electron-accepting organic layer and/or ink for an electron-donating organic layer are fixed on the substrate to be printed, wherein the printing plate is a printing plate according to claim 14.

27. A process for producing a polysilane thin film of an optical switching element, comprising: transferring a polysilane solution for formation of a polysilane thin film of an optical switching element on a printing plate onto a substrate to be printed; and removing a solvent in the transferred polysilane solution by drying such that the polysilane solution is fixed on the substrate to be printed, wherein the printing plate is a printing plate according to claim 14.

28. A process for producing a bank, comprising: transferring a composition for bank formation on a printing plate onto a substrate to be printed; and removing a solvent in the transferred composition for bank formation by drying or curing the transferred composition for bank formation by light irradiation such that the composition for bank formation is fixed on the substrate to be printed, wherein the printing plate is a printing plate according to claim 14.

29. A process for producing an organic light-emitting layer for illumination, a display, display backlight, interior, exterior, or surface-emitting light source, comprising: transferring an organic light-emitting ink on a printing plate onto a substrate to be printed; and removing a solvent in the transferred organic light-emitting ink by drying or curing the transferred organic light-emitting ink by light irradiation such that the organic light-emitting ink is fixed on the substrate to be printed, wherein the printing plate is a printing plate according to claim 14.

* * * * *